(12) United States Patent
Wang et al.

(10) Patent No.: US 9,704,723 B2
(45) Date of Patent: *Jul. 11, 2017

(54) PROCESSING SYSTEMS AND METHODS FOR HALIDE SCAVENGING

(71) Applicant: Applied Materials, Inc., Santa Clara, CA (US)

(72) Inventors: Anchuan Wang, San Jose, CA (US); Xinglong Chen, San Jose, CA (US); Zihui Li, Santa Clara, CA (US); Hiroshi Hamana, Hyogo (JP); Zhijun Chen, San Jose, CA (US); Ching-Mei Hsu, Stanford, CA (US); Jiayin Huang, Fremont, CA (US); Nitin K. Ingle, San Jose, CA (US); Dmitry Lubomirsky, Cupertino, CA (US); Shankar Venkataraman, San Jose, CA (US); Randhir Thakur, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/936,448

(22) Filed: Nov. 9, 2015

(65) Prior Publication Data

US 2016/0064233 A1    Mar. 3, 2016

Related U.S. Application Data

(63) Continuation of application No. 14/246,952, filed on Apr. 7, 2014, now Pat. No. 9,184,055, which is a (Continued)

(51) Int. Cl.
*H01L 21/324* (2006.01)
*H01L 21/02* (2006.01)
(Continued)

(52) U.S. Cl.
CPC ........ *H01L 21/324* (2013.01); *C23C 16/4405* (2013.01); *H01J 37/32357* (2013.01); (Continued)

(58) Field of Classification Search
CPC ......... H01L 21/02041; H01L 21/31144; H01L 21/32137; H01L 21/02057; (Continued)

(56) References Cited

U.S. PATENT DOCUMENTS 2,369,620 A  2/1945  Sullivan et al.
3,451,840 A  6/1969  Hough
(Continued)

FOREIGN PATENT DOCUMENTS

EP   1675160 A1   6/2006
JP   S59-126778 A  7/1984
(Continued)

OTHER PUBLICATIONS

Won et al., Derwent 2006-065772.
(Continued)

*Primary Examiner* — Duy Deo
(74) *Attorney, Agent, or Firm* — Kilpatrick Townsend & Stockton LLP

(57) ABSTRACT

Systems, chambers, and processes are provided for controlling process defects caused by moisture contamination. The systems may provide configurations for chambers to perform multiple operations in a vacuum or controlled environment. The chambers may include configurations to provide additional processing capabilities in combination chamber designs. The methods may provide for the limiting, prevention, and correction of aging defects that may be caused as a result of etching processes performed by system tools.

17 Claims, 25 Drawing Sheets

Related U.S. Application Data continuation of application No. 14/188,344, filed on Feb. 24, 2014.

(60) Provisional application No. 61/789,259, filed on Mar. 15, 2013.

(51) Int. Cl.

| | |
|---|---|
| *H01L 21/67* | (2006.01) |
| *C23C 16/44* | (2006.01) |
| *H01L 21/3105* | (2006.01) |
| *H01L 21/268* | (2006.01) |
| *H01L 21/677* | (2006.01) |
| *H01L 21/263* | (2006.01) |
| *H01L 21/306* | (2006.01) |
| *H01L 21/3065* | (2006.01) |
| *H01L 21/683* | (2006.01) |
| *H01L 21/3213* | (2006.01) |
| *H01L 21/311* | (2006.01) |
| *H01J 37/32* | (2006.01) |

(52) U.S. Cl.
CPC .... *H01L 21/0206* (2013.01); *H01L 21/02041* (2013.01); *H01L 21/263* (2013.01); *H01L 21/2686* (2013.01); *H01L 21/3065* (2013.01); *H01L 21/30604* (2013.01); *H01L 21/3105* (2013.01); *H01L 21/31111* (2013.01); *H01L 21/31116* (2013.01); *H01L 21/32136* (2013.01); *H01L 21/6708* (2013.01); *H01L 21/6719* (2013.01); *H01L 21/67069* (2013.01); *H01L 21/67075* (2013.01); *H01L 21/67109* (2013.01); *H01L 21/67115* (2013.01); *H01L 21/67184* (2013.01); *H01L 21/67196* (2013.01); *H01L 21/67201* (2013.01); *H01L 21/67207* (2013.01); *H01L 21/67248* (2013.01); *H01L 21/67253* (2013.01); *H01L 21/67288* (2013.01); *H01L 21/67703* (2013.01); *H01L 21/67739* (2013.01); *H01L 21/67742* (2013.01); *H01L 21/6831* (2013.01); *H01J 37/32862* (2013.01); *H01L 21/02057* (2013.01); *H01L 21/31144* (2013.01); *H01L 21/32137* (2013.01)

(58) Field of Classification Search
CPC ............. H01L 21/67069; H01L 21/324; H01L 21/0206; H01L 21/263; H01L 21/2686; H01L 21/30604; H01L 21/3065; H01L 21/3105; H01L 21/31111; H01L 21/31116; H01L 21/32136; H01L 21/67075; H01L 21/6708; H01L 21/67109; H01L 21/67115; H01L 21/67184; H01L 21/6719

See application file for complete search history.

(56) References Cited

U.S. PATENT DOCUMENTS

| | | | |
|---|---|---|---|
| 3,537,474 A | 11/1970 | Rohrer | |
| 3,756,511 A | 9/1973 | Shinroku | |
| 3,937,857 A | 2/1976 | Brummett et al. | |
| 3,969,077 A | 7/1976 | Hill | |
| 4,006,047 A | 2/1977 | Brummett et al. | |
| 4,209,357 A | 6/1980 | Gorin et al. | |
| 4,214,946 A | 7/1980 | Forget et al. | |
| 4,232,060 A | 11/1980 | Mallory, Jr. | |
| 4,234,628 A | 11/1980 | DuRose | |
| 4,265,943 A | 5/1981 | Goldstein et al. | |
| 4,340,462 A | 7/1982 | Koch | |
| 4,341,592 A | 7/1982 | Shortes et al. | |
| 4,361,418 A | 11/1982 | Tscheppe | |
| 4,361,441 A | 11/1982 | Tylko | |
| 4,364,803 A | 12/1982 | Nidola et al. | |
| 4,368,223 A | 1/1983 | Kobayashi et al. | |
| 4,374,698 A | 2/1983 | Sanders et al. | |
| 4,397,812 A | 8/1983 | Mallory, Jr. | |
| 4,468,413 A | 8/1984 | Bachmann | |
| 4,565,601 A | 1/1986 | Kakehi et al. | |
| 4,579,618 A | 4/1986 | Celestino et al. | |
| 4,585,920 A | 4/1986 | Hoog et al. | |
| 4,610,775 A | 9/1986 | Phifer | |
| 4,625,678 A | 12/1986 | Shloya et al. | |
| 4,632,857 A | 12/1986 | Mallory, Jr. | |
| 4,656,052 A | 4/1987 | Satou et al. | |
| 4,656,076 A | 4/1987 | Vetanen et al. | |
| 4,690,746 A | 9/1987 | McInerney et al. | |
| 4,715,937 A | 12/1987 | Moslehi et al. | |
| 4,749,440 A | 6/1988 | Blackwood et al. | |
| 4,753,898 A | 6/1988 | Parrillo et al. | |
| 4,786,360 A | 11/1988 | Cote et al. | |
| 4,793,897 A | 12/1988 | Dunfield et al. | |
| 4,807,016 A | 2/1989 | Douglas | |
| 4,810,520 A | 3/1989 | Wu | |
| 4,816,638 A | 3/1989 | Ukai et al. | |
| 4,820,377 A | 4/1989 | Davis et al. | |
| 4,828,649 A | 5/1989 | Davis | |
| 4,857,140 A | 8/1989 | Loewenstein | |
| 4,904,621 A | 2/1990 | Lowenstein et al. | |
| 4,913,929 A | 4/1990 | Moslehi et al. | |
| 4,946,903 A | 8/1990 | Gardella et al. | |
| 4,951,601 A | 8/1990 | Maydan et al. | |
| 4,960,488 A | 10/1990 | Law et al. | |
| 4,980,018 A | 12/1990 | Mu et al. | |
| 4,981,551 A | 1/1991 | Palmour | |
| 4,985,372 A | 1/1991 | Narita et al. | |
| 4,991,542 A | 2/1991 | Kohmura et al. | |
| 4,992,136 A | 2/1991 | Tachi et al. | |
| 4,994,404 A | 2/1991 | Sheng et al. | |
| 5,000,113 A | 3/1991 | Wang et al. | |
| 5,006,192 A | 4/1991 | Deguchi | |
| 5,013,691 A | 5/1991 | Lory et al. | |
| 5,028,565 A | 7/1991 | Chang | |
| 5,030,319 A | 7/1991 | Nishino et al. | |
| 5,038,713 A | 8/1991 | Kawakami et al. | |
| 5,045,244 A | 9/1991 | Marlett | |
| 5,061,838 A | 10/1991 | Lane et al. | |
| 5,083,030 A | 1/1992 | Stavov | |
| 5,089,441 A | 2/1992 | Moslehi | |
| 5,089,442 A | 2/1992 | Olmer | |
| 5,147,692 A | 9/1992 | Bengston | |
| 5,156,881 A | 10/1992 | Okano et al. | |
| 5,180,435 A | 1/1993 | Markunas et al. | |
| 5,186,718 A | 2/1993 | Tepman et al. | |
| 5,188,706 A | 2/1993 | Hori et al. | |
| 5,198,034 A | 3/1993 | deBoer et al. | |
| 5,203,911 A | 4/1993 | Sricharoenchalkit et al. | |
| 5,215,787 A | 6/1993 | Homma | |
| 5,228,501 A | 7/1993 | Tepman et al. | |
| 5,231,690 A | 7/1993 | Soma et al. | |
| 5,235,139 A | 8/1993 | Bengston et al. | |
| 5,238,499 A | 8/1993 | van de Ven et al. | |
| 5,240,497 A | 8/1993 | Shacham et al. | |
| 5,248,371 A | 9/1993 | Maher et al. | |
| 5,248,527 A | 9/1993 | Uchida et al. | |
| 5,252,178 A | 10/1993 | Moslehi | |
| 5,266,157 A | 11/1993 | Kadomura | |
| 5,269,881 A | 12/1993 | Sekiya | |
| 5,270,125 A | 12/1993 | America et al. | |
| 5,271,972 A | 12/1993 | Kwok et al. | |
| 5,275,977 A | 1/1994 | Otsubo et al. | |
| 5,277,750 A | 1/1994 | Frank | |
| 5,279,669 A | 1/1994 | Lee | |
| 5,279,865 A | 1/1994 | Chebi et al. | |
| 5,288,518 A | 2/1994 | Homma | |
| 5,290,382 A | 3/1994 | Zarowin et al. | |
| 5,292,370 A | 3/1994 | Tsai et al. | |
| 5,300,463 A | 4/1994 | Cathey et al. | |
| 5,302,233 A | 4/1994 | Kim et al. | |
| 5,306,530 A | 4/1994 | Strongin et al. | |

(56) References Cited

U.S. PATENT DOCUMENTS

| | | |
|---|---|---|
| 5,314,724 A | 5/1994 | Tsukune et al. |
| 5,319,247 A | 6/1994 | Matsuura |
| 5,326,427 A | 7/1994 | Jerbic |
| 5,328,558 A | 7/1994 | Kawamura et al. |
| 5,328,810 A | 7/1994 | Lowrey et al. |
| 5,330,578 A | 7/1994 | Sakama |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,368,897 A | 11/1994 | Kurihara et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,670 A | 5/1995 | Langan et al. |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |
| 5,464,499 A | 11/1995 | Moslehi |
| 5,468,342 A | 11/1995 | Nulty et al. |
| 5,474,589 A | 12/1995 | Ohga et al. |
| 5,478,403 A | 12/1995 | Shinagawa et al. |
| 5,478,462 A | 12/1995 | Walsh |
| 5,483,920 A | 1/1996 | Pryor |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,518,962 A | 5/1996 | Murao |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,558,717 A | 9/1996 | Zhao et al. |
| 5,560,779 A | 10/1996 | Knowles et al. |
| 5,563,105 A | 10/1996 | Dobuzinsky et al. |
| 5,567,243 A | 10/1996 | Foster et al. |
| 5,571,576 A | 11/1996 | Qian et al. |
| 5,578,130 A | 11/1996 | Hayashi et al. |
| 5,578,161 A | 11/1996 | Auda |
| 5,580,421 A | 12/1996 | Hiatt et al. |
| 5,591,269 A | 1/1997 | Arami et al. |
| 5,592,358 A | 1/1997 | Shamouilian |
| 5,599,740 A | 2/1997 | Jang et al. |
| 5,614,055 A | 3/1997 | Fairbairn et al. |
| 5,616,518 A | 4/1997 | Foo et al. |
| 5,624,582 A | 4/1997 | Cain |
| 5,626,922 A | 5/1997 | Miyanaga et al. |
| 5,628,829 A | 5/1997 | Foster et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,661,093 A | 8/1997 | Ravi et al. |
| 5,670,066 A | 9/1997 | Barnes et al. |
| 5,674,787 A | 10/1997 | Zhao et al. |
| 5,676,758 A | 10/1997 | Hasegawa et al. |
| 5,679,606 A | 10/1997 | Wang et al. |
| 5,685,946 A | 11/1997 | Fathauer et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,753,886 A | 5/1998 | Iwamura et al. |
| 5,755,859 A | 5/1998 | Brusic et al. |
| 5,756,400 A | 5/1998 | Ye et al. |
| 5,756,402 A | 5/1998 | Jimbo et al. |
| 5,772,770 A | 6/1998 | Suda et al. |
| 5,781,693 A | 7/1998 | Ballance et al. |
| 5,786,276 A | 7/1998 | Brooks et al. |
| 5,789,300 A | 8/1998 | Fulford |
| 5,792,376 A | 8/1998 | Kanai et al. |
| 5,800,686 A | 9/1998 | Littau et al. |
| 5,804,259 A | 9/1998 | Robles |
| 5,812,403 A | 9/1998 | Fong et al. |
| 5,814,238 A | 9/1998 | Ashby et al. |
| 5,814,365 A | 9/1998 | Mahawill |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |
| 5,843,538 A | 12/1998 | Ehrsam et al. |
| 5,843,847 A | 12/1998 | Pu et al. |
| 5,844,195 A | 12/1998 | Fairbairn et al. |
| 5,846,332 A | 12/1998 | Zhao et al. |
| 5,846,373 A | 12/1998 | Pirkle et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,855,685 A | 1/1999 | Tobe et al. |
| 5,856,240 A | 1/1999 | Sinha et al. |
| 5,858,876 A | 1/1999 | Chew |
| 5,865,896 A | 2/1999 | Nowak |
| 5,866,483 A | 2/1999 | Shiau et al. |
| 5,872,052 A | 2/1999 | Iyer |
| 5,872,058 A | 2/1999 | Van Cleemput et al. |
| 5,882,424 A | 3/1999 | Taylor et al. |
| 5,882,786 A | 3/1999 | Nassau et al. |
| 5,883,012 A | 3/1999 | Chiou |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,900,163 A | 5/1999 | Yi et al. |
| 5,904,827 A | 5/1999 | Reynolds |
| 5,907,790 A | 5/1999 | Kellam |
| 5,910,340 A | 6/1999 | Uchida et al. |
| 5,913,147 A | 6/1999 | Dubin et al. |
| 5,915,190 A | 6/1999 | Pirkle |
| 5,918,116 A | 6/1999 | Chittipeddi |
| 5,920,792 A | 7/1999 | Lin |
| 5,926,737 A | 7/1999 | Ameen et al. |
| 5,932,077 A | 8/1999 | Reynolds |
| 5,933,757 A | 8/1999 | Yoshikawa et al. |
| 5,935,334 A | 8/1999 | Fong et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,049 A | 8/1999 | Beyer et al. |
| 5,944,902 A | 8/1999 | Redeker et al. |
| 5,948,702 A | 9/1999 | Rotondaro |
| 5,951,601 A | 9/1999 | Lesinski et al. |
| 5,951,776 A | 9/1999 | Selyutin et al. |
| 5,951,896 A | 9/1999 | Mahawill |
| 5,953,591 A | 9/1999 | Ishihara et al. |
| 5,953,635 A | 9/1999 | Andideh |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |
| 5,990,013 A | 11/1999 | Berenguer et al. |
| 5,993,916 A | 11/1999 | Zhao et al. |
| 5,997,962 A | 12/1999 | Ogasawara et al. |
| 6,004,884 A | 12/1999 | Abraham |
| 6,007,635 A | 12/1999 | Mahawill |
| 6,007,785 A | 12/1999 | Liou |

(56) References Cited

U.S. PATENT DOCUMENTS

| | | |
|---|---|---|
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,017,414 A | 1/2000 | Koemtzopoulos et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,037,018 A | 3/2000 | Jang et al. |
| 6,037,266 A | 3/2000 | Tao et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,072,147 A | 6/2000 | Koshiishi |
| 6,072,227 A | 6/2000 | Yau et al. |
| 6,074,512 A | 6/2000 | Collins et al. |
| 6,077,780 A | 6/2000 | Dubin |
| 6,080,529 A | 6/2000 | Ye et al. |
| 6,081,414 A | 6/2000 | Flanigan et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,090,212 A | 7/2000 | Mahawili |
| 6,093,457 A | 7/2000 | Okumura |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,832 A | 8/2000 | Morgan et al. |
| 6,110,836 A | 8/2000 | Cohen et al. |
| 6,110,838 A | 8/2000 | Loewenstein |
| 6,113,771 A | 9/2000 | Landau et al. |
| 6,117,245 A | 9/2000 | Mandrekar et al. |
| 6,120,640 A | 9/2000 | Shih et al. |
| 6,136,163 A | 10/2000 | Cheung et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,149,828 A | 11/2000 | Vaartstra |
| 6,150,628 A | 11/2000 | Smith et al. |
| 6,153,935 A | 11/2000 | Edelstein et al. |
| 6,161,576 A | 12/2000 | Maher et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,171,661 B1 | 1/2001 | Zheng et al. |
| 6,174,450 B1 | 1/2001 | Patrick et al. |
| 6,174,812 B1 | 1/2001 | Hsiung et al. |
| 6,176,198 B1 | 1/2001 | Kao et al. |
| 6,176,667 B1 | 1/2001 | Fairbairn |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,184,121 B1 | 2/2001 | Buchwalter et al. |
| 6,186,091 B1 | 2/2001 | Chu et al. |
| 6,189,483 B1 | 2/2001 | Ishikawa et al. |
| 6,190,233 B1 | 2/2001 | Hong et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,203,863 B1 | 3/2001 | Liu et al. |
| 6,204,200 B1 | 3/2001 | Shieh et al. |
| 6,210,486 B1 | 4/2001 | Mizukami et al. |
| 6,217,658 B1 | 4/2001 | Orczyk et al. |
| 6,220,201 B1 | 4/2001 | Nowak |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,237,527 B1 | 5/2001 | Kellerman et al. |
| 6,238,513 B1 | 5/2001 | Arnold et al. |
| 6,238,582 B1 | 5/2001 | Williams et al. |
| 6,241,845 B1 | 6/2001 | Gadgil et al. |
| 6,242,349 B1 | 6/2001 | Nogami et al. |
| 6,244,211 B1 | 6/2001 | Nishikawa et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,277,733 B1 | 8/2001 | Smith |
| 6,277,752 B1 | 8/2001 | Chen |
| 6,277,763 B1 | 8/2001 | Kugimiya et al. |
| 6,281,072 B1 | 8/2001 | Li et al. |
| 6,281,135 B1 | 8/2001 | Han et al. |
| 6,284,146 B1 | 9/2001 | Kim et al. |
| 6,291,282 B1 | 9/2001 | Wilk et al. |
| 6,291,348 B1 | 9/2001 | Lopatin et al. |
| 6,303,044 B1 | 10/2001 | Koemtzopoulos et al. |
| 6,303,418 B1 | 10/2001 | Cha et al. |
| 6,306,772 B1 | 10/2001 | Lin |
| 6,312,554 B1 | 11/2001 | Ye |
| 6,312,995 B1 | 11/2001 | Yu |
| 6,319,387 B1 | 11/2001 | Krishnamoorthy et al. |
| 6,321,587 B1 | 11/2001 | Laush |
| 6,322,716 B1 | 11/2001 | Qiao et al. |
| 6,323,128 B1 | 11/2001 | Sambucetti et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| RE37,546 E | 2/2002 | Mahawill |
| 6,344,410 B1 | 2/2002 | Lopatin et al. |
| 6,348,407 B1 | 2/2002 | Gupta et al. |
| 6,350,320 B1 | 2/2002 | Sherstinsky et al. |
| 6,350,697 B1 | 2/2002 | Richardson |
| 6,351,013 B1 | 2/2002 | Luning et al. |
| 6,352,081 B1 | 3/2002 | Lu et al. |
| 6,355,573 B1 | 3/2002 | Okumura |
| 6,364,949 B1 | 4/2002 | Or et al. |
| 6,364,954 B2 | 4/2002 | Umotoy et al. |
| 6,364,957 B1 | 4/2002 | Schneider et al. |
| 6,375,748 B1 | 4/2002 | Yudovsky et al. |
| 6,376,386 B1 | 4/2002 | Oshima |
| 6,379,575 B1 | 4/2002 | Yin et al. |
| 6,383,896 B1 | 5/2002 | Kirimura et al. |
| 6,383,951 B1 | 5/2002 | Li |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,415,736 B1 | 7/2002 | Hao et al. |
| 6,416,647 B1 | 7/2002 | Dordi et al. |
| 6,418,874 B1 | 7/2002 | Cox et al. |
| 6,423,284 B1 | 7/2002 | Arno |
| 6,427,623 B2 | 8/2002 | Ko |
| 6,432,819 B1 | 8/2002 | Pavate et al. |
| 6,432,831 B2 | 8/2002 | Dhindsa et al. |
| 6,436,193 B1 | 8/2002 | Kasai et al. |
| 6,436,816 B1 | 8/2002 | Lee et al. |
| 6,440,863 B1 | 8/2002 | Tsai et al. |
| 6,441,492 B1 | 8/2002 | Cunningham |
| 6,446,572 B1 | 9/2002 | Brcka |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,465,051 B1 | 10/2002 | Sahin et al. |
| 6,465,366 B1 | 10/2002 | Nemani et al. |

(56) References Cited

U.S. PATENT DOCUMENTS

| | | |
|---|---|---|
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Carlson et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,509,623 B2 | 1/2003 | Zhao |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,528,751 B1 | 3/2003 | Hoffman et al. |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,558,564 B1 | 5/2003 | Loewenhardt |
| 6,565,729 B2 | 5/2003 | Chen et al. |
| 6,569,773 B1 | 5/2003 | Gellrich et al. |
| 6,573,030 B1 | 6/2003 | Fairbairn et al. |
| 6,573,606 B2 | 6/2003 | Sambucetti et al. |
| 6,585,851 B1 | 7/2003 | Ohmi et al. |
| 6,586,163 B1 * | 7/2003 | Okabe ............... G03F 7/091 216/41 |
| 6,596,599 B1 | 7/2003 | Guo |
| 6,596,654 B1 | 7/2003 | Bayman et al. |
| 6,602,434 B1 | 8/2003 | Hung et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,663,715 B1 | 12/2003 | Yuda et al. |
| 6,677,242 B1 * | 1/2004 | Liu .................. G03F 7/427 134/1.1 |
| 6,679,981 B1 | 1/2004 | Pan et al. |
| 6,688,375 B1 | 2/2004 | Turner |
| 6,713,356 B1 | 3/2004 | Skotnicki et al. |
| 6,713,835 B1 | 3/2004 | Horak et al. |
| 6,717,189 B2 | 4/2004 | Inoue et al. |
| 6,720,213 B1 | 4/2004 | Gambino et al. |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,767,834 B2 | 7/2004 | Chung et al. |
| 6,768,079 B2 | 7/2004 | Kosakai |
| 6,770,166 B1 | 8/2004 | Fischer |
| 6,772,827 B2 | 8/2004 | Keller et al. |
| 6,792,889 B2 | 9/2004 | Nakano et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,336 B1 | 10/2004 | Fornsel et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,748 B2 | 10/2004 | Kapoor et al. |
| 6,821,571 B2 | 11/2004 | Huang |
| 6,823,589 B2 | 11/2004 | White et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,849,854 B2 | 2/2005 | Sainty |
| 6,852,550 B2 | 2/2005 | Tuttle et al. |
| 6,858,153 B2 | 2/2005 | Bjorkman et al. |
| 6,861,097 B1 | 3/2005 | Goosey et al. |
| 6,861,332 B2 | 3/2005 | Park et al. |
| 6,869,880 B2 | 3/2005 | Krishnaraj et al. |
| 6,875,280 B2 | 4/2005 | Ikeda et al. |
| 6,878,206 B2 | 4/2005 | Tzu et al. |
| 6,879,981 B2 | 4/2005 | Rothschild et al. |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,900,596 B2 | 5/2005 | Yang et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,921,556 B2 | 7/2005 | Shimizu et al. |
| 6,924,191 B2 | 8/2005 | Liu et al. |
| 6,930,047 B2 | 8/2005 | Yamazaki |
| 6,935,269 B2 | 8/2005 | Lee et al. |
| 6,942,753 B2 | 9/2005 | Choi et al. |
| 6,946,033 B2 | 9/2005 | Tsuei et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,995,073 B2 | 2/2006 | Liou |
| 7,017,269 B2 | 3/2006 | White et al. |
| 7,018,941 B2 | 3/2006 | Cui et al. |
| 7,030,034 B2 | 4/2006 | Fucsko et al. |
| 7,049,200 B2 | 5/2006 | Arghavani et al. |
| 7,071,532 B2 | 7/2006 | Geffken et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,145,725 B2 | 12/2006 | Hasel et al. |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,226,805 B2 | 6/2007 | Hallin et al. |
| 7,235,137 B2 | 6/2007 | Kitayama et al. |
| 7,244,474 B2 | 7/2007 | Hanawa et al. |
| 7,252,011 B2 | 8/2007 | Traverso |
| 7,252,716 B2 | 8/2007 | Kim et al. |
| 7,253,123 B2 | 8/2007 | Arghavani et al. |
| 7,256,370 B2 | 8/2007 | Guiver |
| 7,288,482 B2 | 10/2007 | Panda et al. |
| 7,291,360 B2 | 11/2007 | Hanawa et al. |
| 7,316,761 B2 | 1/2008 | Doan et al. |
| 7,329,608 B2 | 2/2008 | Babayan et al. |
| 7,341,633 B2 | 3/2008 | Lubomirsky et al. |
| 7,344,912 B1 | 3/2008 | Okoroanyanwu |
| 7,358,192 B2 | 4/2008 | Merry et al. |
| 7,364,956 B2 | 4/2008 | Saito |
| 7,365,016 B2 | 4/2008 | Ouellet et al. |
| 7,396,480 B2 | 7/2008 | Kao et al. |
| 7,416,989 B1 | 8/2008 | Liu et al. |
| 7,465,358 B2 | 12/2008 | Weidman et al. |
| 7,468,319 B2 | 12/2008 | Lee |
| 7,484,473 B2 | 2/2009 | Keller et al. |
| 7,488,688 B2 | 2/2009 | Chung et al. |
| 7,494,545 B2 | 2/2009 | Lam et al. |
| 7,500,445 B2 | 3/2009 | Zhao et al. |
| 7,513,214 B2 | 4/2009 | Okumura et al. |
| 7,520,957 B2 | 4/2009 | Kao et al. |
| 7,553,756 B2 | 6/2009 | Hayashi et al. |
| 7,575,007 B2 | 8/2009 | Tang et al. |
| 7,581,511 B2 | 9/2009 | Mardian et al. |
| 7,604,708 B2 | 10/2009 | Wood et al. |
| 7,611,980 B2 | 11/2009 | Wells |
| 7,628,897 B2 | 12/2009 | Mungekar et al. |
| 7,682,518 B2 | 3/2010 | Chandrachood et al. |
| 7,695,590 B2 | 4/2010 | Hanawa et al. |

(56) References Cited

U.S. PATENT DOCUMENTS

| | | |
|---|---|---|
| 7,708,859 B2 | 5/2010 | Huang et al. |
| 7,722,925 B2 | 5/2010 | White et al. |
| 7,723,221 B2 | 5/2010 | Hayashi |
| 7,749,326 B2 | 7/2010 | Kim et al. |
| 7,785,672 B2 | 8/2010 | Choi et al. |
| 7,790,634 B2 | 9/2010 | Munro et al. |
| 7,806,077 B2 | 10/2010 | Lee et al. |
| 7,806,078 B2 | 10/2010 | Yoshida |
| 7,807,578 B2 | 10/2010 | Bencher et al. |
| 7,825,038 B2 | 11/2010 | Ingle et al. |
| 7,837,828 B2 | 11/2010 | Ikeda et al. |
| 7,845,309 B2 | 12/2010 | Condrashoff et al. |
| 7,915,139 B1 | 3/2011 | Lang et al. |
| 7,932,181 B2 | 4/2011 | Singh et al. |
| 7,939,422 B2 | 5/2011 | Ingle et al. |
| 7,968,441 B2 | 6/2011 | Xu |
| 7,976,631 B2 | 7/2011 | Burrows |
| 7,981,806 B2 | 7/2011 | Jung |
| 7,989,365 B2 | 8/2011 | Park et al. |
| 8,008,166 B2 | 8/2011 | Sanchez et al. |
| 8,048,811 B2 | 11/2011 | Feustel et al. |
| 8,058,179 B1 | 11/2011 | Draeger et al. |
| 8,071,482 B2 | 12/2011 | Kawada |
| 8,074,599 B2 | 12/2011 | Choi et al. |
| 8,076,198 B2 | 12/2011 | Lee et al. |
| 8,083,853 B2 | 12/2011 | Choi et al. |
| 8,114,245 B2 | 2/2012 | Ohmi et al. |
| 8,119,530 B2 | 2/2012 | Hori et al. |
| 8,133,349 B1 | 3/2012 | Panagopoulos |
| 8,183,134 B2 | 5/2012 | Wu |
| 8,187,486 B1 | 5/2012 | Liu et al. |
| 8,211,808 B2 | 7/2012 | Sapre et al. |
| 8,272,346 B2 | 9/2012 | Bettencourt et al. |
| 8,298,627 B2 | 10/2012 | Minami et al. |
| 8,309,440 B2 | 11/2012 | Sanchez et al. |
| 8,312,839 B2 | 11/2012 | Baek |
| 8,313,610 B2 | 11/2012 | Dhindsa |
| 8,328,939 B2 | 12/2012 | Choi et al. |
| 8,357,435 B2 | 1/2013 | Lubomirsky |
| 8,368,308 B2 | 2/2013 | Banna et al. |
| 8,390,980 B2 | 3/2013 | Sansoni et al. |
| 8,427,067 B2 | 4/2013 | Espiau et al. |
| 8,435,902 B2 | 5/2013 | Tang et al. |
| 8,475,674 B2 | 7/2013 | Thadani et al. |
| 8,480,850 B2 | 7/2013 | Tyler et al. |
| 8,491,805 B2 | 7/2013 | Kushibiki et al. |
| 8,501,629 B2 | 8/2013 | Tang et al. |
| 8,506,713 B2 | 8/2013 | Takagi |
| 8,512,509 B2 | 8/2013 | Bera et al. |
| 8,540,844 B2 | 9/2013 | Hudson et al. |
| 8,551,891 B2 | 10/2013 | Liang |
| 8,573,152 B2 | 11/2013 | De La Llera |
| 8,622,021 B2 | 1/2014 | Taylor et al. |
| 8,623,471 B2 | 1/2014 | Tyler et al. |
| 8,652,298 B2 | 2/2014 | Dhindsa et al. |
| 8,679,982 B2 | 3/2014 | Wang et al. |
| 8,679,983 B2 | 3/2014 | Wang et al. |
| 8,702,902 B2 | 4/2014 | Blom et al. |
| 8,741,778 B2 | 6/2014 | Yang et al. |
| 8,747,680 B1 | 6/2014 | Deshpande |
| 8,765,574 B2 | 7/2014 | Zhang et al. |
| 8,771,536 B2 | 7/2014 | Zhang et al. |
| 8,771,539 B2 | 7/2014 | Zhang et al. |
| 8,772,888 B2 | 7/2014 | Jung et al. |
| 8,778,079 B2 | 7/2014 | Begarney et al. |
| 8,801,952 B1 | 8/2014 | Wang et al. |
| 8,808,563 B2 | 8/2014 | Wang et al. |
| 8,846,163 B2 | 9/2014 | Kao et al. |
| 8,869,742 B2 | 10/2014 | Dhindsa |
| 8,871,651 B1 | 10/2014 | Choi et al. |
| 8,895,449 B1 | 11/2014 | Zhu et al. |
| 8,900,364 B2 | 12/2014 | Wright |
| 8,921,234 B2 | 12/2014 | Liu et al. |
| 8,927,390 B2 | 1/2015 | Sapre et al. |
| 8,951,429 B1 | 2/2015 | Liu et al. |
| 8,956,980 B1 | 2/2015 | Chen et al. |
| 8,969,212 B2 | 3/2015 | Ren et al. |
| 8,980,005 B2 | 3/2015 | Carlson et al. |
| 8,980,758 B1 | 3/2015 | Ling et al. |
| 8,980,763 B2 | 3/2015 | Wang et al. |
| 8,992,723 B2 | 3/2015 | Sorensen et al. |
| 8,999,656 B2 | 4/2015 | Jirstrom et al. |
| 8,999,839 B2 | 4/2015 | Su et al. |
| 8,999,856 B2 | 4/2015 | Zhang et al. |
| 9,012,302 B2 | 4/2015 | Sapre et al. |
| 9,017,481 B1 | 4/2015 | Pettinger et al. |
| 9,023,732 B2 * | 5/2015 | Wang .................. H01L 21/6708 438/706 |
| 9,023,734 B2 | 5/2015 | Chen et al. |
| 9,034,770 B2 | 5/2015 | Park et al. |
| 9,040,422 B2 | 5/2015 | Wang et al. |
| 9,064,815 B2 | 6/2015 | Zhang et al. |
| 9,064,816 B2 | 6/2015 | Kim et al. |
| 9,072,158 B2 | 6/2015 | Ikeda et al. |
| 9,093,371 B2 * | 7/2015 | Wang .................. H01L 21/6708 |
| 9,093,390 B2 | 7/2015 | Wang et al. |
| 9,111,877 B2 | 8/2015 | Chen et al. |
| 9,111,907 B2 | 8/2015 | Kamineni |
| 9,114,438 B2 | 8/2015 | Hoinkis et al. |
| 9,117,855 B2 | 8/2015 | Cho et al. |
| 9,132,436 B2 | 9/2015 | Liang et al. |
| 9,136,273 B1 | 9/2015 | Purayath et al. |
| 9,144,147 B2 | 9/2015 | Yang et al. |
| 9,153,442 B2 | 10/2015 | Wang et al. |
| 9,159,606 B1 | 10/2015 | Purayath et al. |
| 9,165,786 B1 | 10/2015 | Purayath et al. |
| 9,184,055 B2 * | 11/2015 | Wang .................. H01L 21/6708 |
| 9,190,293 B2 | 11/2015 | Wang et al. |
| 9,190,302 B2 | 11/2015 | Ni |
| 9,209,012 B2 | 12/2015 | Chen et al. |
| 9,236,265 B2 | 1/2016 | Korolik et al. |
| 9,236,266 B2 | 1/2016 | Zhang et al. |
| 9,245,762 B2 | 1/2016 | Zhang et al. |
| 9,263,278 B2 | 2/2016 | Purayath et al. |
| 9,269,590 B2 | 2/2016 | Luere et al. |
| 9,275,834 B1 | 3/2016 | Park et al. |
| 9,287,095 B2 | 3/2016 | Nguyen et al. |
| 9,287,134 B2 | 3/2016 | Wang et al. |
| 9,293,568 B2 | 3/2016 | Ko |
| 9,299,537 B2 | 3/2016 | Kobayashi et al. |
| 9,299,538 B2 | 3/2016 | Kobayashi et al. |
| 9,299,575 B2 | 3/2016 | Park et al. |
| 9,299,582 B2 | 3/2016 | Ingle et al. |
| 9,299,583 B1 | 3/2016 | Wang et al. |
| 9,309,598 B2 | 4/2016 | Wang et al. |
| 9,324,576 B2 | 4/2016 | Zhang et al. |
| 9,343,272 B1 | 5/2016 | Pandit et al. |
| 9,343,327 B2 | 5/2016 | Zhange et al. |
| 9,349,605 B1 | 5/2016 | Xu et al. |
| 9,355,856 B2 | 5/2016 | Wang et al. |
| 9,355,862 B2 | 5/2016 | Pandit et al. |
| 9,355,863 B2 | 5/2016 | Chen et al. |
| 9,355,922 B2 | 5/2016 | Park et al. |
| 9,362,130 B2 | 6/2016 | Ingle et al. |
| 9,368,364 B2 | 6/2016 | Park et al. |
| 9,373,517 B2 | 6/2016 | Yang et al. |
| 9,373,522 B1 | 6/2016 | Wang et al. |
| 9,378,969 B2 | 6/2016 | Hsu et al. |
| 9,378,978 B2 | 6/2016 | Purayath et al. |
| 9,384,997 B2 | 7/2016 | Ren et al. |
| 9,385,028 B2 | 7/2016 | Nemani et al. |
| 9,390,937 B2 | 7/2016 | Chen et al. |
| 9,396,989 B2 | 7/2016 | Purayath et al. |
| 9,406,523 B2 | 8/2016 | Chen et al. |
| 9,412,608 B2 | 8/2016 | Wang et al. |
| 9,418,858 B2 | 8/2016 | Wang et al. |
| 9,425,058 B2 | 8/2016 | Kim et al. |
| 9,437,451 B2 | 9/2016 | Chen et al. |
| 9,449,845 B2 | 9/2016 | Liu et al. |
| 9,449,846 B2 | 9/2016 | Liu et al. |
| 9,449,850 B2 | 9/2016 | Wang et al. |
| 9,472,412 B2 | 10/2016 | Zhang et al. |
| 9,472,417 B2 | 10/2016 | Ingle et al. |
| 2001/0008803 A1 | 7/2001 | Takamatsu et al. |

(56) References Cited

U.S. PATENT DOCUMENTS

| | | |
|---|---|---|
| 2001/0015261 A1 | 8/2001 | Kobayashi et al. |
| 2001/0028093 A1 | 10/2001 | Yamazaki et al. |
| 2001/0028922 A1 | 10/2001 | Sandhu |
| 2001/0030366 A1 | 10/2001 | Nakano et al. |
| 2001/0034106 A1 | 10/2001 | Moise et al. |
| 2001/0034121 A1 | 10/2001 | Fu et al. |
| 2001/0035124 A1 | 11/2001 | Okayama et al. |
| 2001/0036706 A1 | 11/2001 | Kitamura |
| 2001/0037856 A1 | 11/2001 | Park |
| 2001/0037941 A1 | 11/2001 | Thompson |
| 2001/0041444 A1 | 11/2001 | Shields et al. |
| 2001/0047760 A1 | 12/2001 | Mosiehl |
| 2001/0053585 A1 | 12/2001 | Kikuchi et al. |
| 2001/0053610 A1 | 12/2001 | Athavale |
| 2001/0054381 A1 | 12/2001 | Umotoy et al. |
| 2001/0055842 A1 | 12/2001 | Uh et al. |
| 2002/0000202 A1 | 1/2002 | Yuda et al. |
| 2002/0011210 A1 | 1/2002 | Satoh et al. |
| 2002/0011214 A1 | 1/2002 | Kamarehi et al. |
| 2002/0016080 A1 | 2/2002 | Khan et al. |
| 2002/0016085 A1 | 2/2002 | Huang et al. |
| 2002/0023899 A1 | 2/2002 | Khater et al. |
| 2002/0028582 A1 | 3/2002 | Nallan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0040764 A1 | 4/2002 | Kwan et al. |
| 2002/0040766 A1 | 4/2002 | Takahashi |
| 2002/0043690 A1 | 4/2002 | Doyle et al. |
| 2002/0045966 A1 | 4/2002 | Lee et al. |
| 2002/0054962 A1 | 5/2002 | Huang |
| 2002/0069820 A1 | 6/2002 | Yudovsky |
| 2002/0070414 A1 | 6/2002 | Drescher et al. |
| 2002/0074573 A1 | 6/2002 | Takeuchi et al. |
| 2002/0090781 A1 | 7/2002 | Skotnicki et al. |
| 2002/0090835 A1 | 7/2002 | Chakravarti et al. |
| 2002/0094378 A1 | 7/2002 | O'Donnell |
| 2002/0094591 A1 | 7/2002 | Sill et al. |
| 2002/0096493 A1 | 7/2002 | Hattori |
| 2002/0098681 A1 | 7/2002 | Hu et al. |
| 2002/0106845 A1 | 8/2002 | Chao et al. |
| 2002/0112819 A1 | 8/2002 | Kamarehi et al. |
| 2002/0124867 A1 | 9/2002 | Kim et al. |
| 2002/0129769 A1 | 9/2002 | Kim et al. |
| 2002/0129902 A1 | 9/2002 | Babayan et al. |
| 2002/0144657 A1 | 10/2002 | Chiang et al. |
| 2002/0153808 A1 | 10/2002 | Skotnicki et al. |
| 2002/0164885 A1 | 11/2002 | Lill et al. |
| 2002/0177322 A1 | 11/2002 | Li et al. |
| 2002/0187280 A1 | 12/2002 | Johnson et al. |
| 2002/0187655 A1 | 12/2002 | Tan et al. |
| 2003/0003757 A1 | 1/2003 | Naltan et al. |
| 2003/0007910 A1 | 1/2003 | Lazarovich et al. |
| 2003/0010645 A1 | 1/2003 | Ting et al. |
| 2003/0019428 A1 | 1/2003 | Ku et al. |
| 2003/0019580 A1 | 1/2003 | Strang |
| 2003/0026060 A1 | 2/2003 | Hiramatsu et al. |
| 2003/0029566 A1 | 2/2003 | Roth |
| 2003/0029567 A1 | 2/2003 | Dhindsa et al. |
| 2003/0029715 A1 | 2/2003 | Yu et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0071035 A1 | 4/2003 | Brailove |
| 2003/0072639 A1 | 4/2003 | White et al. |
| 2003/0075808 A1 | 4/2003 | Inoue et al. |
| 2003/0077909 A1 | 4/2003 | Jiwari |
| 2003/0079686 A1 | 5/2003 | Chen et al. |
| 2003/0087531 A1 | 5/2003 | Kang et al. |
| 2003/0091938 A1 | 5/2003 | Fairbairn et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0121609 A1 | 7/2003 | Ohmi et al. |
| 2003/0124465 A1 | 7/2003 | Lee et al. |
| 2003/0124842 A1 | 7/2003 | Hytros et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0140844 A1 | 7/2003 | Maa et al. |
| 2003/0143328 A1 | 7/2003 | Chen et al. |
| 2003/0148035 A1 | 8/2003 | Lingampalli |
| 2003/0152691 A1 | 8/2003 | Baude |
| 2003/0159307 A1 | 8/2003 | Sago et al. |
| 2003/0168439 A1 | 9/2003 | Kanno et al. |
| 2003/0170945 A1 | 9/2003 | Igeta et al. |
| 2003/0173333 A1 | 9/2003 | Wang et al. |
| 2003/0173347 A1 | 9/2003 | Guiver |
| 2003/0173675 A1 | 9/2003 | Watanabe |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0199170 A1 | 10/2003 | Li |
| 2003/0200929 A1 | 10/2003 | Otsuki |
| 2003/0205329 A1 | 11/2003 | Gujer et al. |
| 2003/0215963 A1 | 11/2003 | AmRhein et al. |
| 2003/0216044 A1 | 11/2003 | Lin et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2004/0005726 A1 | 1/2004 | Huang |
| 2004/0018304 A1 | 1/2004 | Chung et al. |
| 2004/0020801 A1 | 2/2004 | Solling |
| 2004/0026371 A1 | 2/2004 | Nguyen et al. |
| 2004/0033678 A1 | 2/2004 | Arghavani et al. |
| 2004/0033684 A1 | 2/2004 | Li |
| 2004/0050328 A1 | 3/2004 | Kumagai et al. |
| 2004/0058293 A1 | 3/2004 | Nguyen et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0076529 A1 | 4/2004 | Gnauck et al. |
| 2004/0083967 A1 | 5/2004 | Yuda et al. |
| 2004/0087139 A1 | 5/2004 | Yeh et al. |
| 2004/0092063 A1 | 5/2004 | Okumura |
| 2004/0099378 A1 | 5/2004 | Kim et al. |
| 2004/0101667 A1 | 5/2004 | O'Loughlin et al. |
| 2004/0108068 A1 | 6/2004 | Senzaki et al. |
| 2004/0115876 A1 | 6/2004 | Goundar et al. |
| 2004/0129671 A1 | 7/2004 | Ji et al. |
| 2004/0137161 A1 | 7/2004 | Segawa et al. |
| 2004/0144490 A1 | 7/2004 | Zhao et al. |
| 2004/0147126 A1 | 7/2004 | Yamashita et al. |
| 2004/0149394 A1 | 8/2004 | Doan et al. |
| 2004/0152342 A1 | 8/2004 | Li |
| 2004/0154535 A1 | 8/2004 | Chen et al. |
| 2004/0157444 A1 | 8/2004 | Chiu |
| 2004/0161921 A1 | 8/2004 | Ryu |
| 2004/0175913 A1 | 9/2004 | Johnson et al. |
| 2004/0175929 A1 | 9/2004 | Schmitt et al. |
| 2004/0182315 A1 | 9/2004 | Laflamme et al. |
| 2004/0192032 A1 | 9/2004 | Ohmori et al. |
| 2004/0194799 A1 | 10/2004 | Kim et al. |
| 2004/0200499 A1 | 10/2004 | Harvey |
| 2004/0211357 A1 | 10/2004 | Gadgil et al. |
| 2004/0219737 A1 | 11/2004 | Quon |
| 2004/0219789 A1 | 11/2004 | Wood et al. |
| 2004/0263827 A1 | 12/2004 | Xu |
| 2005/0001276 A1 | 1/2005 | Gao et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0051094 A1 | 3/2005 | Schaepkens et al. |
| 2005/0073051 A1 | 4/2005 | Yamamoto et al. |
| 2005/0079706 A1 | 4/2005 | Kumar et al. |
| 2005/0090078 A1 | 4/2005 | Ishihara |

(56) References Cited

U.S. PATENT DOCUMENTS

| | | |
|---|---|---|
| 2005/0090120 A1 | 4/2005 | Hasegawa et al. |
| 2005/0098111 A1 | 5/2005 | Shimizu et al. |
| 2005/0105991 A1 | 5/2005 | Hofmeister et al. |
| 2005/0112876 A1 | 5/2005 | Wu |
| 2005/0112901 A1 | 5/2005 | Ji et al. |
| 2005/0164479 A1 | 7/2005 | Perng et al. |
| 2005/0167394 A1 | 8/2005 | Liu et al. |
| 2005/0181588 A1 | 8/2005 | Kim |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0214477 A1 | 9/2005 | Hanawa et al. |
| 2005/0218507 A1 | 10/2005 | Kao et al. |
| 2005/0219786 A1 | 10/2005 | Brown et al. |
| 2005/0221552 A1 | 10/2005 | Kao et al. |
| 2005/0230350 A1 | 10/2005 | Kao et al. |
| 2005/0236694 A1 | 10/2005 | Wu et al. |
| 2005/0239282 A1 | 10/2005 | Chen et al. |
| 2005/0251990 A1 | 11/2005 | Choi et al. |
| 2005/0266622 A1 | 12/2005 | Arghavani et al. |
| 2005/0266691 A1 | 12/2005 | Gu et al. |
| 2005/0269030 A1 | 12/2005 | Kent et al. |
| 2005/0274324 A1 | 12/2005 | Takahashi et al. |
| 2005/0279454 A1 | 12/2005 | Snijders |
| 2005/0287755 A1 | 12/2005 | Bachmann |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0005856 A1 | 1/2006 | Sun et al. |
| 2006/0005930 A1 | 1/2006 | Ikeda et al. |
| 2006/0006057 A1 | 1/2006 | Laermer |
| 2006/0011298 A1 | 1/2006 | Lim et al. |
| 2006/0011299 A1 | 1/2006 | Condrashoff et al. |
| 2006/0016783 A1 | 1/2006 | Wu et al. |
| 2006/0019456 A1 | 1/2006 | Bu et al. |
| 2006/0019486 A1 | 1/2006 | Yu et al. |
| 2006/0021574 A1 | 2/2006 | Armour et al. |
| 2006/0024954 A1 | 2/2006 | Wu et al. |
| 2006/0024956 A1 | 2/2006 | Zhijian et al. |
| 2006/0033678 A1 | 2/2006 | Lubomirsky et al. |
| 2006/0040055 A1 | 2/2006 | Nguyen et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0046470 A1 | 3/2006 | Becknell |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0060942 A1 | 3/2006 | Minixhofer et al. |
| 2006/0087644 A1 | 4/2006 | McMillin et al. |
| 2006/0093756 A1 | 5/2006 | Rajagopalan et al. |
| 2006/0097397 A1 | 5/2006 | Russell et al. |
| 2006/0102076 A1 | 5/2006 | Smith et al. |
| 2006/0102587 A1 | 5/2006 | Kimura |
| 2006/0118178 A1 | 6/2006 | Desbiolles et al. |
| 2006/0121724 A1 | 6/2006 | Yue et al. |
| 2006/0124242 A1 | 6/2006 | Kanarik et al. |
| 2006/0130971 A1 | 6/2006 | Chang et al. |
| 2006/0157449 A1 | 7/2006 | Takahashi et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0169327 A1 | 8/2006 | Shajii et al. |
| 2006/0178008 A1 | 8/2006 | Yeh et al. |
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0207595 A1 | 9/2006 | Ohmi et al. |
| 2006/0210723 A1 | 9/2006 | Ishizaka |
| 2006/0216878 A1 | 9/2006 | Lee |
| 2006/0222481 A1 | 10/2006 | Foree |
| 2006/0226121 A1 | 10/2006 | Aoi |
| 2006/0228889 A1 | 10/2006 | Edelberg et al. |
| 2006/0240661 A1 | 10/2006 | Annapragada et al. |
| 2006/0244107 A1 | 11/2006 | Sugihara |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0252265 A1 | 11/2006 | Jin et al. |
| 2006/0254716 A1 | 11/2006 | Mosden et al. |
| 2006/0260750 A1 | 11/2006 | Rueger |
| 2006/0261490 A1 | 11/2006 | Su et al. |
| 2006/0264043 A1 | 11/2006 | Stewart et al. |
| 2006/0266288 A1 | 11/2006 | Choi |
| 2006/0292846 A1 | 12/2006 | Pinto et al. |
| 2007/0025907 A1 | 2/2007 | Rezeq |
| 2007/0048977 A1 | 3/2007 | Lee et al. |
| 2007/0056925 A1 | 3/2007 | Liu et al. |
| 2007/0062453 A1 | 3/2007 | Ishikawa |
| 2007/0071888 A1 | 3/2007 | Shanmugasundram et al. |
| 2007/0072408 A1 | 3/2007 | Enomoto et al. |
| 2007/0090325 A1 | 4/2007 | Hwang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0131274 A1 | 6/2007 | Stollwerck et al. |
| 2007/0145023 A1 | 6/2007 | Holber et al. |
| 2007/0154838 A1 | 7/2007 | Lee |
| 2007/0163440 A1 | 7/2007 | Kim et al. |
| 2007/0175861 A1 | 8/2007 | Hwang et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0207275 A1 | 9/2007 | Nowak et al. |
| 2007/0212288 A1 | 9/2007 | Holst |
| 2007/0227554 A1 | 10/2007 | Satoh et al. |
| 2007/0231109 A1 | 10/2007 | Pak et al. |
| 2007/0235134 A1 | 10/2007 | Iimuro |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0243714 A1 | 10/2007 | Shin et al. |
| 2007/0259467 A1 | 11/2007 | Tweet et al. |
| 2007/0264820 A1 | 11/2007 | Liu |
| 2007/0266946 A1 | 11/2007 | Choi |
| 2007/0277734 A1 | 12/2007 | Lubomirsky et al. |
| 2007/0281106 A1 | 12/2007 | Lubomirsky et al. |
| 2007/0287292 A1 | 12/2007 | Li et al. |
| 2007/0296967 A1 | 12/2007 | Gupta et al. |
| 2008/0017104 A1 | 1/2008 | Matyushkin et al. |
| 2008/0020570 A1 | 1/2008 | Naik |
| 2008/0044990 A1 | 2/2008 | Lee |
| 2008/0063810 A1 | 3/2008 | Park et al. |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0099147 A1 | 5/2008 | Myo et al. |
| 2008/0099431 A1 | 5/2008 | Kumar et al. |
| 2008/0099876 A1 | 5/2008 | Seto |
| 2008/0102570 A1 | 5/2008 | Fischer et al. |
| 2008/0102640 A1 | 5/2008 | Hassan et al. |
| 2008/0104782 A1 | 5/2008 | Hughes |
| 2008/0115726 A1 | 5/2008 | Ingle et al. |
| 2008/0121970 A1 | 5/2008 | Aritome |
| 2008/0124937 A1 | 5/2008 | Xu et al. |
| 2008/0142831 A1 | 6/2008 | Su |
| 2008/0153306 A1 | 6/2008 | Cho et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0171407 A1 | 7/2008 | Nakabayashi et al. |
| 2008/0173906 A1 | 7/2008 | Zhu |
| 2008/0182381 A1 | 7/2008 | Kiyotoshi |

(56) References Cited

U.S. PATENT DOCUMENTS

| | | |
|---|---|---|
| 2008/0182383 A1 | 7/2008 | Lee et al. |
| 2008/0202892 A1 | 8/2008 | Smith et al. |
| 2008/0230519 A1 | 9/2008 | Takahashi |
| 2008/0233709 A1 | 9/2008 | Conti et al. |
| 2008/0236751 A1 | 10/2008 | Aramaki et al. |
| 2008/0254635 A1 | 10/2008 | Benzel et al. |
| 2008/0261404 A1 | 10/2008 | Kozuka et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2009/0001480 A1 | 1/2009 | Cheng |
| 2009/0004849 A1 | 1/2009 | Eun |
| 2009/0014127 A1 | 1/2009 | Shah et al. |
| 2009/0017227 A1 | 1/2009 | Fu et al. |
| 2009/0045167 A1 | 2/2009 | Maruyama |
| 2009/0072401 A1 | 3/2009 | Arnold et al. |
| 2009/0081878 A1 | 3/2009 | Dhindsa |
| 2009/0084317 A1 | 4/2009 | Wu et al. |
| 2009/0087960 A1 | 4/2009 | Cho et al. |
| 2009/0087979 A1 | 4/2009 | Raghuram |
| 2009/0095621 A1 | 4/2009 | Kao et al. |
| 2009/0098706 A1 | 4/2009 | Kim et al. |
| 2009/0104738 A1 | 4/2009 | Ring et al. |
| 2009/0104782 A1 | 4/2009 | Lu et al. |
| 2009/0111280 A1 | 4/2009 | Kao et al. |
| 2009/0120464 A1 | 5/2009 | Rasheed et al. |
| 2009/0170221 A1 | 7/2009 | Jacques et al. |
| 2009/0170331 A1 | 7/2009 | Cheng et al. |
| 2009/0179300 A1 | 7/2009 | Arai |
| 2009/0189246 A1 | 7/2009 | Wu et al. |
| 2009/0194810 A1 | 8/2009 | Kiyotoshi et al. |
| 2009/0197418 A1 | 8/2009 | Sago |
| 2009/0202721 A1 | 8/2009 | Nogami et al. |
| 2009/0255902 A1 | 10/2009 | Satoh et al. |
| 2009/0258162 A1 | 10/2009 | Furuta et al. |
| 2009/0269934 A1 | 10/2009 | Kao et al. |
| 2009/0274590 A1 | 11/2009 | Willwerth et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277587 A1 | 11/2009 | Lubomirsky et al. |
| 2009/0277874 A1 | 11/2009 | Rui et al. |
| 2009/0280650 A1 | 11/2009 | Lubomirsky et al. |
| 2009/0286400 A1 | 11/2009 | Heo et al. |
| 2009/0294898 A1 | 12/2009 | Feustel et al. |
| 2009/0317978 A1 | 12/2009 | Higashi |
| 2009/0320756 A1 | 12/2009 | Tanaka |
| 2010/0003824 A1 | 1/2010 | Kadkhodayan et al. |
| 2010/0022030 A1 | 1/2010 | Ditizio |
| 2010/0047080 A1 | 2/2010 | Bruce |
| 2010/0048027 A1 | 2/2010 | Cheng et al. |
| 2010/0055408 A1 | 3/2010 | Lee et al. |
| 2010/0055917 A1 | 3/2010 | Kim |
| 2010/0059889 A1 | 3/2010 | Gosset et al. |
| 2010/0062603 A1 | 3/2010 | Ganguly et al. |
| 2010/0075503 A1 | 3/2010 | Bencher |
| 2010/0093151 A1 | 4/2010 | Arghavani et al. |
| 2010/0093168 A1 | 4/2010 | Naik |
| 2010/0096367 A1 | 4/2010 | Jeon et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0130001 A1 | 5/2010 | Noguchi |
| 2010/0144140 A1 | 6/2010 | Chandrashekar et al. |
| 2010/0147219 A1 | 6/2010 | Hsieh et al. |
| 2010/0164422 A1 | 7/2010 | Shu et al. |
| 2010/0173499 A1 | 7/2010 | Tao et al. |
| 2010/0178748 A1 | 7/2010 | Subramanian |
| 2010/0178755 A1 | 7/2010 | Lee et al. |
| 2010/0180819 A1 | 7/2010 | Hatanaka et al. |
| 2010/0183825 A1 | 7/2010 | Becker et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0197143 A1 | 8/2010 | Nishimura |
| 2010/0203739 A1 | 8/2010 | Becker et al. |
| 2010/0207205 A1* | 8/2010 | Grebs .................. H01L 23/544 257/334 |
| 2010/0240205 A1 | 9/2010 | Son |
| 2010/0294199 A1 | 11/2010 | Tran et al. |
| 2010/0258913 A1 | 12/2010 | Lue |
| 2010/0330814 A1 | 12/2010 | Yokota et al. |
| 2011/0005607 A1 | 1/2011 | Desbiolles et al. |
| 2011/0008950 A1 | 1/2011 | Xu |
| 2011/0011338 A1 | 1/2011 | Chuc et al. |
| 2011/0034035 A1 | 2/2011 | Liang et al. |
| 2011/0039407 A1 | 2/2011 | Nishizuka |
| 2011/0045676 A1 | 2/2011 | Park |
| 2011/0053380 A1 | 3/2011 | Sapre et al. |
| 2011/0058303 A1 | 3/2011 | Migita |
| 2011/0061810 A1 | 3/2011 | Ganguly et al. |
| 2011/0061812 A1 | 3/2011 | Ganguly et al. |
| 2011/0065276 A1 | 3/2011 | Ganguly et al. |
| 2011/0081782 A1 | 4/2011 | Liang et al. |
| 2011/0100489 A1 | 5/2011 | Orito |
| 2011/0111596 A1 | 5/2011 | Kanakasabapathy |
| 2011/0114601 A1 | 5/2011 | Lubomirsky et al. |
| 2011/0115378 A1 | 5/2011 | Lubomirsky et al. |
| 2011/0124144 A1 | 5/2011 | Schlemm et al. |
| 2011/0127156 A1 | 6/2011 | Foad et al. |
| 2011/0143542 A1 | 6/2011 | Feurprier et al. |
| 2011/0151674 A1 | 6/2011 | Tang et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165057 A1 | 7/2011 | Honda et al. |
| 2011/0165771 A1 | 7/2011 | Ring et al. |
| 2011/0180847 A1 | 7/2011 | Ikeda et al. |
| 2011/0195575 A1 | 8/2011 | Wang |
| 2011/0217851 A1 | 9/2011 | Liang et al. |
| 2011/0226734 A1 | 9/2011 | Sumiya et al. |
| 2011/0227028 A1 | 9/2011 | Sekar et al. |
| 2011/0230052 A1 | 9/2011 | Tang et al. |
| 2011/0232737 A1 | 9/2011 | Ruletzki et al. |
| 2011/0266252 A1 | 11/2011 | Thadani et al. |
| 2011/0266682 A1 | 11/2011 | Edelstein et al. |
| 2011/0294300 A1 | 12/2011 | Zhang et al. |
| 2011/0298061 A1 | 12/2011 | Siddiqui et al. |
| 2012/0003782 A1 | 1/2012 | Byun et al. |
| 2012/0009796 A1 | 1/2012 | Cui et al. |
| 2012/0025289 A1 | 2/2012 | Liang et al. |
| 2012/0031559 A1 | 2/2012 | Dhindsa et al. |
| 2012/0034786 A1 | 2/2012 | Dhindsa et al. |
| 2012/0035766 A1 | 2/2012 | Shajii et al. |
| 2012/0052683 A1 | 3/2012 | Kim et al. |
| 2012/0068242 A1 | 3/2012 | Shin et al. |
| 2012/0103518 A1 | 5/2012 | Kakimoto |
| 2012/0104564 A1 | 5/2012 | Won et al. |
| 2012/0129354 A1 | 5/2012 | Luong |
| 2012/0135576 A1 | 5/2012 | Lee et al. |
| 2012/0148369 A1 | 6/2012 | Michalski et al. |
| 2012/0149200 A1 | 6/2012 | Culp et al. |
| 2012/0161405 A1 | 6/2012 | Mohn et al. |
| 2012/0164839 A1 | 6/2012 | Nishimura |
| 2012/0180954 A1 | 7/2012 | Yang et al. |
| 2012/0181599 A1 | 7/2012 | Lung |
| 2012/0182808 A1 | 7/2012 | Lue et al. |
| 2012/0196447 A1 | 8/2012 | Yang et al. |
| 2012/0202408 A1 | 8/2012 | Shajii et al. |
| 2012/0208361 A1 | 8/2012 | Ha |
| 2012/0211462 A1 | 8/2012 | Zhang et al. |
| 2012/0223048 A1 | 9/2012 | Paranjpe et al. |
| 2012/0223418 A1 | 9/2012 | Stowers et al. |
| 2012/0225557 A1 | 9/2012 | Serry et al. |
| 2012/0228642 A1 | 9/2012 | Aube et al. |
| 2012/0238102 A1 | 9/2012 | Zhang et al. |
| 2012/0238103 A1 | 9/2012 | Zhang et al. |
| 2012/0241411 A1 | 9/2012 | Darling et al. |
| 2012/0247390 A1 | 10/2012 | Sawada et al. |
| 2012/0247670 A1 | 10/2012 | Dobashi et al. |
| 2012/0247671 A1 | 10/2012 | Sugawara |

(56) References Cited

U.S. PATENT DOCUMENTS

| | | |
|---|---|---|
| 2012/0258600 A1 | 10/2012 | Godet et al. |
| 2012/0267346 A1 | 10/2012 | Kao et al. |
| 2012/0282779 A1 | 11/2012 | Arnold et al. |
| 2012/0285619 A1 | 11/2012 | Matyushkin et al. |
| 2012/0285621 A1 | 11/2012 | Tan |
| 2012/0292664 A1 | 11/2012 | Kanike |
| 2012/0309204 A1 | 12/2012 | Kang et al. |
| 2013/0001899 A1 | 1/2013 | Hwang et al. |
| 2013/0005103 A1 | 1/2013 | Liu et al. |
| 2013/0005140 A1 | 1/2013 | Jeng et al. |
| 2013/0012032 A1 | 1/2013 | Liu et al. |
| 2013/0032574 A1 | 2/2013 | Liu et al. |
| 2013/0034666 A1 | 2/2013 | Liang et al. |
| 2013/0034968 A1 | 2/2013 | Zhang et al. |
| 2013/0045605 A1 | 2/2013 | Wang et al. |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0062675 A1 | 3/2013 | Thomas |
| 2013/0065398 A1 | 3/2013 | Ohsawa et al. |
| 2013/0082197 A1 | 4/2013 | Yang et al. |
| 2013/0084654 A1 | 4/2013 | Gaylord et al. |
| 2013/0089988 A1 | 4/2013 | Wang et al. |
| 2013/0098868 A1 | 4/2013 | Nishimura et al. |
| 2013/0105948 A1 | 5/2013 | Kewley |
| 2013/0119016 A1 | 5/2013 | Kagoshima |
| 2013/0119457 A1 | 5/2013 | Lue et al. |
| 2013/0119483 A1 | 5/2013 | Alptekin et al. |
| 2013/0130507 A1 | 5/2013 | Wang et al. |
| 2013/0150303 A1 | 6/2013 | Kungl et al. |
| 2013/0161726 A1 | 6/2013 | Kim et al. |
| 2013/0175654 A1 | 7/2013 | Muckenhirn et al. |
| 2013/0187220 A1 | 7/2013 | Surthi |
| 2013/0193108 A1 | 8/2013 | Zheng |
| 2013/0217243 A1 | 8/2013 | Underwood et al. |
| 2013/0224960 A1 | 8/2013 | Payyapilly et al. |
| 2013/0260533 A1 | 10/2013 | Sapre et al. |
| 2013/0260564 A1 | 10/2013 | Sapre et al. |
| 2013/0279066 A1 | 10/2013 | Lubomirsky et al. |
| 2013/0284369 A1 | 10/2013 | Kobayashi et al. |
| 2013/0284370 A1 | 10/2013 | Collins et al. |
| 2013/0284373 A1 | 10/2013 | Sun et al. |
| 2013/0284374 A1 | 10/2013 | Lubomirsky et al. |
| 2013/0286530 A1 | 10/2013 | Lin et al. |
| 2013/0295297 A1 | 11/2013 | Chou et al. |
| 2013/0298942 A1 | 11/2013 | Ren et al. |
| 2013/0302980 A1 | 11/2013 | Chandrashekar et al. |
| 2013/0337655 A1 | 12/2013 | Lee et al. |
| 2013/0343829 A1 | 12/2013 | Benedetti et al. |
| 2014/0004707 A1 | 1/2014 | Thedjoiswro et al. |
| 2014/0004708 A1 | 1/2014 | Thedjoiswro |
| 2014/0020708 A1 | 1/2014 | Kim et al. |
| 2014/0021673 A1 | 1/2014 | Chen et al. |
| 2014/0057447 A1 | 2/2014 | Yang et al. |
| 2014/0065842 A1 | 3/2014 | Anthis et al. |
| 2014/0080308 A1 | 3/2014 | Chen et al. |
| 2014/0080309 A1 | 3/2014 | Park |
| 2014/0080310 A1 | 3/2014 | Chen et al. |
| 2014/0083362 A1 | 3/2014 | Lubomirsky et al. |
| 2014/0087488 A1 | 3/2014 | Nam et al. |
| 2014/0097270 A1 | 4/2014 | Liang et al. |
| 2014/0099794 A1 | 4/2014 | Ingle et al. |
| 2014/0124364 A1 | 5/2014 | Yoo et al. |
| 2014/0134847 A1 | 5/2014 | Seya |
| 2014/0141621 A1 | 5/2014 | Ren et al. |
| 2014/0147126 A1 | 5/2014 | Linnartz et al. |
| 2014/0152312 A1 | 6/2014 | Snow et al. |
| 2014/0165912 A1 | 6/2014 | Kao et al. |
| 2014/0166617 A1 | 6/2014 | Chen |
| 2014/0166618 A1 | 6/2014 | Tadigadapa et al. |
| 2014/0186772 A1 | 7/2014 | Pohlers et al. |
| 2014/0190410 A1 | 7/2014 | Kim |
| 2014/0199851 A1 | 7/2014 | Nemani et al. |
| 2014/0225504 A1 | 8/2014 | Kaneko et al. |
| 2014/0227881 A1 | 8/2014 | Lubomirsky et al. |
| 2014/0234466 A1 | 8/2014 | Gao et al. |
| 2014/0248773 A1 | 9/2014 | Tsai et al. |
| 2014/0248780 A1 | 9/2014 | Ingle et al. |
| 2014/0256131 A1 | 9/2014 | Wang et al. |
| 2014/0256145 A1 | 9/2014 | Abdallah et al. |
| 2014/0262031 A1 | 9/2014 | Belostotskiy et al. |
| 2014/0262038 A1 | 9/2014 | Wang et al. |
| 2014/0263272 A1 | 9/2014 | Duan et al. |
| 2014/0264533 A1 | 9/2014 | Simsek-Ege et al. |
| 2014/0271097 A1 | 9/2014 | Wang et al. |
| 2014/0273373 A1 | 9/2014 | Makala et al. |
| 2014/0273406 A1 | 9/2014 | Wang et al. |
| 2014/0273451 A1 | 9/2014 | Wang et al. |
| 2014/0273462 A1 | 9/2014 | Simsek-Ege et al. |
| 2014/0273489 A1 | 9/2014 | Wang et al. |
| 2014/0273491 A1 | 9/2014 | Zhang et al. |
| 2014/0273492 A1 | 9/2014 | Anthis et al. |
| 2014/0273496 A1 | 9/2014 | Kao |
| 2014/0288528 A1 | 9/2014 | Py et al. |
| 2014/0302678 A1 | 10/2014 | Paterson et al. |
| 2014/0302680 A1 | 10/2014 | Singh |
| 2014/0308758 A1 | 10/2014 | Nemani et al. |
| 2014/0308816 A1 | 10/2014 | Wang et al. |
| 2014/0311581 A1 | 10/2014 | Belostotskiy et al. |
| 2014/0342532 A1 | 11/2014 | Zhu |
| 2014/0342569 A1 | 11/2014 | Zhu et al. |
| 2014/0349477 A1 | 11/2014 | Chandrashekar et al. |
| 2015/0011096 A1 | 1/2015 | Chandrasekharan et al. |
| 2015/0014152 A1 | 1/2015 | Hoinkis et al. |
| 2015/0031211 A1 | 1/2015 | Sapre et al. |
| 2015/0037980 A1 | 2/2015 | Rha |
| 2015/0060265 A1 | 3/2015 | Cho et al. |
| 2015/0076110 A1 | 3/2015 | Wu et al. |
| 2015/0076586 A1 | 3/2015 | Rabkin et al. |
| 2015/0079797 A1 | 3/2015 | Chen et al. |
| 2015/0118858 A1 | 4/2015 | Takaba |
| 2015/0126035 A1 | 5/2015 | Diao et al. |
| 2015/0126039 A1 | 5/2015 | Korolik et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132953 A1 | 5/2015 | Nowling et al. |
| 2015/0132968 A1 | 5/2015 | Ren et al. |
| 2015/0152072 A1 | 6/2015 | Cantat et al. |
| 2015/0155177 A1 | 6/2015 | Zhang et al. |
| 2015/0170879 A1 | 6/2015 | Nguyen et al. |
| 2015/0170920 A1 | 6/2015 | Purayath et al. |
| 2015/0170924 A1 | 6/2015 | Nguyen et al. |
| 2015/0170926 A1 | 6/2015 | Michalak |
| 2015/0170935 A1 | 6/2015 | Wang et al. |
| 2015/0170943 A1 | 6/2015 | Nguyen et al. |
| 2015/0171008 A1 | 6/2015 | Luo |
| 2015/0179464 A1 | 6/2015 | Wang et al. |
| 2015/0206764 A1 | 7/2015 | Wang et al. |
| 2015/0214066 A1 | 7/2015 | Luere et al. |
| 2015/0214067 A1 | 7/2015 | Zhang et al. |
| 2015/0214092 A1 | 7/2015 | Purayath et al. |
| 2015/0214337 A1 | 7/2015 | Ko et al. |
| 2015/0221541 A1 | 8/2015 | Nemani et al. |
| 2015/0235809 A1 | 8/2015 | Ito et al. |
| 2015/0235863 A1 | 8/2015 | Chen |
| 2015/0235865 A1 | 8/2015 | Wang et al. |
| 2015/0235867 A1 | 8/2015 | Nishizuka |
| 2015/0247231 A1 | 9/2015 | Nguyen et al. |
| 2015/0249018 A1 | 9/2015 | Park et al. |
| 2015/0270140 A1 | 9/2015 | Gupta et al. |
| 2015/0275361 A1 | 10/2015 | Lubomirsky et al. |
| 2015/0275375 A1 | 10/2015 | Kim et al. |
| 2015/0294980 A1 | 10/2015 | Lee et al. |
| 2015/0332930 A1 | 11/2015 | Wang et al. |
| 2015/0340225 A1 | 11/2015 | Kim et al. |
| 2015/0345029 A1 | 12/2015 | Wang et al. |
| 2015/0357201 A1 | 12/2015 | Chen et al. |
| 2015/0357205 A1 | 12/2015 | Wang et al. |
| 2015/0371861 A1 | 12/2015 | Li et al. |
| 2015/0371864 A1 | 12/2015 | Hsu et al. |
| 2015/0371865 A1 | 12/2015 | Chen et al. |
| 2015/0371866 A1 | 12/2015 | Chen et al. |

(56) References Cited

U.S. PATENT DOCUMENTS

| | | |
|---|---|---|
| 2016/0005572 A1 | 1/2016 | Liang et al. |
| 2016/0005833 A1 | 1/2016 | Collins et al. |
| 2016/0027654 A1 | 1/2016 | Kim et al. |
| 2016/0027673 A1 | 1/2016 | Wang et al. |
| 2016/0035586 A1 | 2/2016 | Purayath et al. |
| 2016/0035614 A1 | 2/2016 | Purayath et al. |
| 2016/0042968 A1 | 2/2016 | Purayath et al. |
| 2016/0056167 A1 | 2/2016 | Wang et al. |
| 2016/0064233 A1 | 3/2016 | Wang et al. |
| 2016/0079072 A1 | 3/2016 | Wang et al. |
| 2016/0086807 A1 | 3/2016 | Park et al. |
| 2016/0086808 A1 | 3/2016 | Zhang et al. |
| 2016/0086815 A1 | 3/2016 | Pandit et al. |
| 2016/0086816 A1 | 3/2016 | Wang et al. |
| 2016/0093505 A1 | 3/2016 | Chen et al. |
| 2016/0093506 A1 | 3/2016 | Chen et al. |
| 2016/0104606 A1 | 4/2016 | Park et al. |
| 2016/0118268 A1 | 4/2016 | Ingle et al. |
| 2016/0148821 A1 | 5/2016 | Singh et al. |
| 2016/0163512 A1 | 6/2016 | Lubomirsky |
| 2016/0163513 A1 | 6/2016 | Lubomirsky |
| 2016/0181112 A1 | 6/2016 | Xue et al. |
| 2016/0189933 A1 | 6/2016 | Kobayashi et al. |
| 2016/0204009 A1 | 7/2016 | Nguyen et al. |
| 2016/0222522 A1 | 8/2016 | Wang et al. |
| 2016/0225651 A1 | 8/2016 | Tran et al. |
| 2016/0225652 A1 | 8/2016 | Tran et al. |
| 2016/0237570 A1 | 8/2016 | Tan et al. |
| 2016/0240389 A1 | 8/2016 | Zhang et al. |
| 2016/0240402 A1 | 8/2016 | Park et al. |
| 2016/0260588 A1 | 9/2016 | Park et al. |
| 2016/0260616 A1 | 9/2016 | Li et al. |
| 2016/0260619 A1 | 9/2016 | Zhang et al. |
| 2016/0284556 A1 | 9/2016 | Ingle et al. |

FOREIGN PATENT DOCUMENTS

| | | |
|---|---|---|
| JP | H01-200627 A | 8/1989 |
| JP | H02-114525 A | 4/1990 |
| JP | H07-153739 A | 6/1995 |
| JP | H08-264510 A | 10/1996 |
| JP | 2003-174020 A | 6/2003 |
| JP | 4763293 B2 | 8/2011 |
| JP | 2013-243418 A | 12/2013 |
| KR | 10-2000-008278 A | 2/2000 |
| KR | 10-2005-0042701 A | 5/2005 |
| KR | 10-2008-0063988 A | 7/2008 |
| KR | 10-2009-0128913 A | 12/2009 |
| KR | 10-2011-0086540 A | 7/2011 |
| KR | 10-2011-0126675 A | 11/2011 |
| KR | 10-2012-0082640 A | 7/2012 |
| WO | 2009-084194 A1 | 7/2009 |
| WO | 2010-010706 | 1/2010 |
| WO | 2012-098871 A1 | 7/2012 |

OTHER PUBLICATIONS

International Preliminary Report on Patentability for PCT-US2014-021246 mailed Sep. 24, 2015, all pages.
Manual No. TQMA72E1. "Bayard-Alpert Pirani Gauge FRG-730: Short Operating Instructions" Mar. 2012. Agilent Technologies, Lexington, MA 02421, USA. pp. 1-45.
H. Xiao, Introduction to Semiconductor Manufacturing Technology, published by Prentice Hall, 2001, ISBN 0-13-022404-9, pp. 354-356.

* cited by examiner

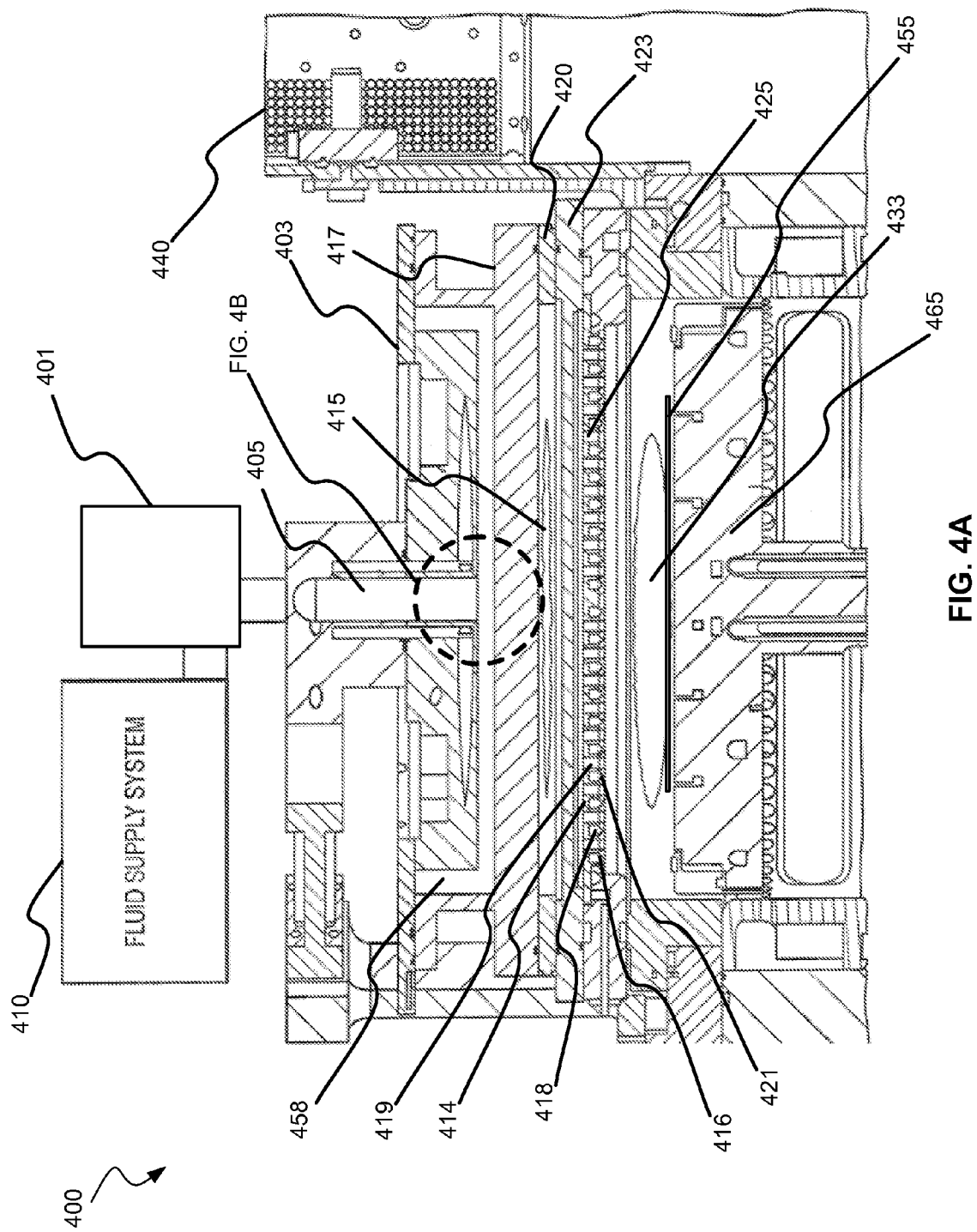

PROCESSING SYSTEMS AND METHODS FOR HALIDE SCAVENGING

CROSS-REFERENCES TO RELATED APPLICATIONS

This application is a continuation of U.S. application Ser. No. 14/246,952, filed Apr. 7, 2014, which is a continuation of U.S. application Ser. No. 14/188,344, filed Feb. 24, 2014, which claims the benefit of priority of U.S. Provisional Application No. 61/789,259 filed Mar. 15, 2013, both of which are herein incorporated by reference in their entirety for all purposes.

TECHNICAL FIELD

The present technology relates to semiconductor systems, processes, and equipment. More specifically, the present technology relates to systems and methods for reducing film contamination and improving device quality.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Systems, chambers, and processes are provided for controlling process defects caused by moisture contamination. The systems may provide configurations for chambers to perform multiple operations in a vacuum or controlled environment. The chambers may include configurations to provide additional processing capabilities in combination chamber designs. The methods may provide for the limiting, prevention, and correction of aging defects that may be caused as a result of etching processes performed by system tools.

Substrate processing systems according to the present technology may include a plurality of holding chambers, a plurality of loading chambers configured to receive substrates into a vacuum environment, and an interface section having at least two interface transfer devices configured to deliver substrates between the plurality of holding chambers coupled with the interface section at a first location of the interface section and the plurality of loading chambers coupled with the interface section at a second location of the interface section opposite the plurality of holding chambers. The systems may also include a treatment chamber positioned in vertical alignment to and coupled with at least one of the plurality of loading chambers. The systems may include a plurality of process chambers, as well as a process transfer device configured to deliver a substrate between any of the plurality of loading chambers and any of the plurality of processing chambers while maintaining the substrate under vacuum conditions. The process transfer device may also be configured to deliver substrates vertically to the treatment chamber.

The processing systems may have the loading chambers and process chambers all on a first elevational plane of the system, and the treatment chamber on a second elevational plane of the substrate processing system above the first elevational plane of the substrate processing system. The transfer device may be configured to maintain vacuum conditions while delivering substrates vertically to the treatment chamber. The systems may include a plurality of treatment chambers, wherein each treatment chamber is in vertical alignment to and coupled with one of the plurality of loading chambers. The systems may also include two loading chambers and two treatment chambers, and the loading chambers may be disposed horizontally from one another.

The systems may further include a treatment plasma generating device separate from and coupled with both of the treatment chambers. The systems may also include two treatment plasma generating devices, where one of the treatment plasma generating devices may be coupled with one of the treatment chambers and a second of the treatment plasma generating devices may be coupled with a second of the treatment chambers. The treatment chamber may include components configured to generate a direct plasma within the treatment chamber, and the direct plasma may include a capacitively-coupled plasma. The treatment chamber may also include components configured to generate an ultraviolet light treatment within the treatment chamber. The holding chambers of the systems may include at least one inlet port and may be configured to receive a fluid through the inlet port and direct the fluid through the holding chamber and into the interface section. The holding chambers may also include at least one internal diffuser configured to direct the received fluid throughout the holding chamber. The system loading chambers may include at least one heating device configured to heat the loading chamber up to about 300° C.

The processing systems may further include a wet etching chamber coupled with the interface section at a third location of the interface section adjacent the first location and second location of the interface section. A storage chamber may also be coupled with the interface section at a fourth location of the interface section opposite the third location.

The processing chambers of the processing systems may be coupled as pairs of tandem processing chambers within the substrate processing system. The processing chamber may include at least two pairs of tandem processing chambers, where a first of the at least two pairs of tandem processing chambers may be configured to perform a silicon oxide etching operation, and the second of the at least two pairs of tandem processing chambers may be configured to perform a silicon etching operation.

Methods of processing a substrate are also described that may include transferring a substrate from a holding chamber to a loading chamber with a first transfer device. The methods may also include evacuating the loading chamber such that the substrate is maintained in a vacuum environment. The methods may include transferring the substrate from the evacuated loading chamber to a process chamber with a second transfer device, and then transferring the substrate from the process chamber to the loading chamber with the second transfer device. Once back in the loading chamber, the methods may include removing the vacuum conditions from the loading chamber, and may finally include transferring the substrate from the loading chamber to a storage chamber with the first transfer device.

The methods may also include transferring the substrate to a wet etching station using the first transfer device prior to transferring the substrate to the holding chamber. The methods may further include transferring the substrate from the process chamber to a treatment chamber in vertical alignment to and coupled with the loading chamber with the second transfer device prior to transferring the substrate to the loading chamber. The treatment chamber of the methods may be configured to perform a scavenging operation to remove halide species from a silicon oxide material. The scavenging operation may include a plasma process, and may also include a UV treatment or an e-beam treatment in disclosed embodiments.

The storage chamber may be continuously purged with an inert fluid such that the storage chamber comprises an inert environment, and in disclosed embodiments the storage chamber may be the holding chamber, although the storage chamber may also be a separate chamber from the holding chamber. The methods may also include heating the substrate to a first temperature for a first period of time subsequently to transferring the substrate to the loading chamber. The process chamber may include a first process chamber, and the first process chamber may be configured to perform an oxide etching process. The methods may also include transferring the substrate from the first process chamber to a second process chamber prior to transferring the substrate to the loading chamber, and the second process chamber may be configured to perform a silicon etching process.

A computing system electronically coupled with and configured to provide operating instructions to a substrate processing system is also described. The computing system may include one or more processors and a memory device communicatively coupled with the one or more processors and having sets of instructions for performing operations. When the sets of instructions are executed by the one or more processors, they may cause the substrate processing system and/or a gas delivery system and the individual chambers may be instructed to transfer a substrate from a holding chamber to a loading chamber with a first transfer device. The instructions may further cause the loading chamber to be evacuated such that the substrate may be maintained in a vacuum environment. The instructions may also cause the transfer of the substrate from the evacuated loading chamber to a process chamber with a second transfer device, as well as the transfer of the substrate from the process chamber to a treatment chamber in vertical alignment to and coupled with the loading chamber with the second transfer device. The executed instructions may further cause the transfer of the substrate from the treatment chamber to the loading chamber with the second transfer device, followed by the removal of the vacuum conditions from the loading chamber. The executed instructions may additionally cause the transfer of the substrate from the loading chamber to the holding chamber with the first transfer device. The computer system, which may be a controller, may also be electronically coupled with and configured to provide instructions to a gas delivery system, and may cause the gas delivery system to provide at least one precursor to the process chamber. When the substrate has been transferred back to the loading chamber, the instructions may cause the processing system to heat the loading chamber from a first temperature up to a second temperature of greater than or about 200° C.

A combination processing chamber is also described that may include a lower chamber housing and an upper chamber housing. The lower chamber housing may define or include a first access on a first side of the lower chamber housing, and a second access on a second side of the lower chamber housing opposite the first side of the lower chamber housing. The upper chamber housing may be coupled with the lower chamber housing, and may include a third access on a first side of the upper chamber housing coinciding with the first side of the lower chamber housing, and an upper processing region at least partially defined from above by a faceplate disposed within the upper chamber housing.

The lower chamber housing may define a lower substrate region, and the lower substrate region may also include or be at least partially defined from below by a heater configured to heat the lower substrate region up to about 300° C. The lower substrate region may also be configured to be evacuated from atmospheric pressure to a second pressure below atmospheric pressure, and the lower chamber housing may be configured to structurally support pressure cycling from atmospheric pressure to less than or about 5 mTorr and back every 10 minutes.

The upper processing chamber may also include a temperature control device configured to maintain the temperature of a substrate disposed thereon between about 0° C. and about 600° C. The temperature control device may include a heater plate disposed within the upper chamber housing to at least partially define the upper processing region from below. The upper processing region may also include a substrate support device configured to support a substrate along an edge region and suspend the substrate within the upper processing region. The chamber may have a remote plasma unit coupled with an upper portion of the upper chamber housing. An upper distribution region at least partially defined between the upper portion of the upper chamber housing and the faceplate may also be included. The upper distribution region may include a central distribution region and an edge distribution region partitioned from and radially distal to the central distribution region.

The combination chamber may further include a gas inlet assembly positioned within the upper portion of the upper chamber housing and configured to deliver precursors into the upper distribution region. The gas inlet assembly may be at least partially characterized by a cylindrical shape, and a lower portion of the gas inlet assembly may define a plurality of gas delivery apertures radially distributed about the lower portion of the gas inlet assembly. The gas inlet assembly may also include a bypass fluid channel configured to deliver at least one precursor around the cylindrically shaped portion of the gas inlet assembly. The bypass fluid channel may include a first bypass section configured to direct the at least one precursor to the central distribution region, and the bypass fluid channel may include a second bypass section configured to direct the at least one precursor to the edge distribution region.

The faceplate of the combination chamber may be coupled with a multi-position switch operable to connect the faceplate to an electrical power source and a ground source in alternate switch positions. The lower portion of the upper chamber housing may be grounded such that when the faceplate is connected to the electrical power source a plasma is produced in the upper processing region. The lower portion of the upper chamber housing may also be electrically isolated from the rest of the upper chamber housing.

The disclosed technology may also include a treatment chamber. The treatment chamber may include a chamber housing having a bottom portion coupled with a substrate load lock chamber. The treatment chamber may also include an inlet assembly configured to receive fluids into an internal region defined within the chamber, and a faceplate disposed within the internal region and defining a distribution region from below and a processing region from above within the chamber.

The faceplate may include a dielectric material such as quartz, and may also include a conductive material such that the faceplate may operate as an electrode. In such a configuration the chamber may be configured to produce a plasma in the processing region. Components of the chamber may be lined or otherwise treated, and the inlet assembly may include a quartz liner, for example. The treatment chamber may also have an energy production unit coupled with the inlet assembly. The inlet assembly may also include a window, and the energy production unit may include a light source configured to provide ultraviolet light into the chamber.

The disclosed technology may also include methods of preventing surface reactions on a treated substrate. The methods may include etching the substrate in a first etching process, and the first etching process may be selective to silicon oxide over silicon. The methods may also include etching the substrate in a second etching process, and the second etching process may be selective to silicon over silicon oxide. The methods may include heating the substrate to a first treatment temperature, and then transferring the substrate to a moisture-free environment.

The substrate may be transferred to a chamber after heating the substrate, and a fluid may be continuously flowed through the chamber to maintain the moisture-free environment. For the etching processes, the second etching process may include a fluorine-containing precursor and an oxygen-containing precursor. The first etching process may utilizes a fluorine-containing precursor and a hydrogen-containing precursor. In the etching processes, a region of silicon oxide may be exposed to the second etching process, and the second etching process may produce radical fluorine species. These residual fluorine species may be incorporated with the silicon oxide or with other exposed materials such as silicon nitride. The first temperature for the heating operation may be greater than or about 150° C. The operations may similarly include heating the substrate to a second temperature above or below the first temperature. The substrate may be maintained at the first temperature for a first period of time, and wherein the first period of time is greater than or about 2 minutes. If a second heating operation is performed, the substrate may be maintained at the second temperature for a second period of time that may be greater than or less than the first period of time.

Methods of etching a substrate are also included that may include providing a substrate including silicon and having a silicon oxide layer overlying the silicon. The methods may include etching the substrate in a first etching process, where the first etching process may be selective to silicon oxide over silicon. The substrate may be etched in a second etching process, where the second etching process may be selective to silicon over silicon oxide. The methods may also include etching the substrate in a third etching process where the third etching process may be selective to silicon oxide over silicon. In disclosed embodiments the first and third etching processes are similar etching processes. The first and third etching processes may be performed in a first process chamber, and the second etching process may be performed in a second process chamber. The third etching process may etch the silicon oxide layer to remove a depth of at least about 5 Å of material that may include the residual halide species. The first and third etching processes may include exposing the substrate to a nitrogen-containing precursor and a fluorine-containing precursor, where the fluorine-containing precursor has been flowed through a plasma to produce plasma effluents. The second etching process comprises exposing the substrate to a fluorine-containing precursor and an oxygen-containing precursor, where the fluorine-containing precursor has been flowed through a plasma to produce plasma effluents. The silicon oxide layer may be exposed to the second etching process, and residual fluorine species may be incorporated with the silicon oxide layer.

Additional methods of etching a substrate are included that may also include providing a substrate including silicon and having a silicon oxide layer overlying the silicon. The process may include etching the substrate in a first etching process, and the first etching process may be selective to silicon oxide over silicon. The methods may include etching the substrate in a second etching process, where the second etching process may be selective to silicon over silicon oxide. The methods may also include treating the substrate with a third process. The silicon oxide layer may be exposed to the second etching process during the processing. The second etching process may produce radical fluorine species, and residual fluorine species may be incorporated with the silicon oxide layer in certain processes.

The third process of the described methods may include directing plasma effluents at the surface of the substrate. The plasma effluents may be produced from an inert precursor, and may remove a top surface from the silicon oxide layer. In disclosed embodiments the third process may include a wet etching process. In certain configurations, each of the first, second, and third processes may be performed in different process chambers. The wet etch may include hydrofluoric acid, such as DHF in certain embodiments that may be 200:1, 150:1, 100:1, 50:1, etc. or other ratios within, above, or below those listed. The wet etch may remove up to about 12 Å of the silicon oxide layer. In disclosed embodiments the third process may include exposing the silicon oxide layer to deionized water. The deionized water may remove at least a portion of the residual fluorine species from the silicon oxide layer without etching the silicon oxide layer.

The present technology also includes methods of removing contaminants from a processed substrate having exposed silicon and silicon oxide surfaces. The methods may include etching the substrate in an etching process, and the etching process may be selective to silicon over silicon oxide. The etching process may produce radical species, and residual species from the radical species may be incorporated with the silicon oxide layer. The methods may also include treating the substrate to remove at least a portion of the residual species from the silicon oxide surface. The etching process performed may include exposing the substrate to a fluorine-containing precursor and an oxygen-containing precursor. The fluorine-containing precursor may have been flowed through a plasma to produce at least a portion of the radical species, which may include radical fluorine species.

The etching process may not etch or substantially may not etch the silicon oxide layer. For example, only slight removal of the silicon oxide material may occur. The radical fluorine species may be incorporated with the silicon oxide layer in a profile such that the extent of incorporation diminishes at increasing depths of the silicon oxide film. The treatment that may be performed may be selected from the group consisting of thermal treatment, UV treatment, e-beam treatment, microwave treatment, a curing treatment, and plasma treatment. The temperature at which the treatment may be performed may be a temperature between about 0° C. and about 800° C. Additionally, the pressure at which the treatment may be performed may be a pressure between about 1 mTorr and about 700 Torr. Treating the substrate may include reducing the amount of residual species in the silicon oxide layer to below or about 20%. Treating the substrate may also include reducing the amount of residual species in the silicon oxide layer to below or about 10%, or to below or about 5%. In disclosed embodiments the treatment may substantially or essentially remove the residual halide at an upper surface of the silicon oxide material. In such cases residual halide species may still be present at lower depths of the silicon oxide surface.

The methods may also include transferring the substrate to a treatment chamber for the treatment process. The substrate may be maintained under vacuum during the transfer to the treatment chamber, and treating the substrate may include exposing treatment species to an energy source to produce energized treatment species configured to interact with the radical species. The treatment species may be selected from the group consisting of hydrogen-containing precursors, oxygen-containing precursors, nitrogen-containing precursors, and inert precursors in disclosed embodiments, and in one example, the energy source used to energize the treatment species may include a plasma that may be formed within or external to the treatment chamber for delivering energized species to the substrate. The plasma utilized either internally or externally may include a plasma selected from the group consisting of capacitively-coupled plasma, inductively coupled plasma, microwave plasma, and toroidal plasma. The treatment species utilized may include one or more precursors including a hydrogen-containing precursor that bonds with the residual species. The methods may also include transferring the substrate to a passivation chamber for a passivation process. During the transfer to the chamber in which passivation occurs, the substrate may be maintained under vacuum or within an inert environment. The passivation performed may include heating the substrate to a temperature greater than or about 150° C. for a period of time greater than or about two minutes.

The disclosed technology may also include methods of removing contaminants on a substrate having an exposed silicon oxide region and an exposed non-oxide region. The methods may include flowing a fluorine-containing precursor into a remote plasma region of a substrate processing chamber fluidly coupled with a substrate processing region of the substrate processing chamber while forming a plasma in the remote plasma region to produce fluorine-containing plasma effluents. The methods may include etching the exposed non-oxide region utilizing the plasma effluents, and fluorine species comprising a portion of the fluorine-containing plasma effluents may be incorporated with the silicon oxide region that may be exposed during the etching process. The methods may include flowing a first treatment precursor into the remote plasma region of a substrate processing chamber to produce treatment plasma effluents, and flowing at least one additional treatment precursor into the substrate processing region that may interact with the treatment plasma effluents. The methods may further include exposing the silicon oxide region to the treatment precursors including treatment plasma effluents to remove residual plasma effluents from the silicon oxide region.

The exposed non-oxide region of the substrate may include silicon, silicon nitride, or a metal in disclosed embodiments. The treatment plasma effluents that may be used may at least partially dissociate the at least one additional treatment precursor in the substrate processing region. By at least partially dissociating the precursor, completely dissociated species among combinations of partially dissociated species may be formed. The at least partially dissociated at least one additional treatment precursor may interact physically or chemically, and may bond with the fluorine species incorporated with the silicon oxide region. The treatment precursor may include an inert or noble species, and may include a precursor selected from the group consisting of nitrogen, helium, argon, and xenon.

The at least one additional treatment precursor utilized may include a hydrogen-containing precursor, among other precursors. The exposure that is performed to the silicon oxide material may cause a portion of the silicon oxide material to be removed. The exposure may also remove at least a portion of the fluorine species while maintaining or essentially maintaining the silicon oxide material. Accordingly, slight inadvertent removal of the silicon oxide species may still be encompassed by the methods. The methods may be performed in a single chamber environment, which may allow the methods to occur in a substantially evacuated environment, as well as in a stable or constant environment within the chamber. The exposure may be performed at a temperature between about 0° C. and about 800° C., among a host of temperatures within that range, and the exposure may also be performed at a pressure between about 1 mTorr and about 700 Torr, among a variety of included pressures.

The present technology may still further include methods of removing contaminants on a substrate having an exposed silicon oxide region and an exposed non-oxide region. The methods may include flowing a fluorine-containing precursor into a remote plasma region of a substrate processing chamber fluidly coupled with a substrate processing region of the substrate processing chamber while forming a plasma in the remote plasma region to produce fluorine-containing plasma effluents. The methods may further include etching the exposed non-oxide region utilizing the plasma effluents, where residual fluorine species may be incorporated within the silicon oxide region. The methods may further include flowing at least one treatment precursor into the substrate processing region, as well as exposing the silicon oxide region to the at least one treatment precursor to remove at least a portion of the residual fluorine species.

The at least one treatment precursor may not be passed through a plasma prior to being flowed into the substrate processing region, and in disclosed embodiments the processing region may be maintained plasma free during the exposure. Accordingly, the treatment operation may be performed entirely or substantially plasma free in disclosed embodiments. The flowing operation may include multiple processes that may include condensing water vapor on the surface of the silicon oxide region, as well as flowing a nitrogen-containing precursor into the substrate processing region. These steps may be performed sequentially, and may be performed in direct sequence, or after the manipulation of particular system operations including temperature and pressure between the steps. The nitrogen-containing precursor used in the treatment process may include ammonia.

During the treatment, the water vapor may interact with the residual fluorine species. This may disrupt bonding or incorporation of the residual species within the surface, and may for direct bonding with components of the condensed water. The ammonia may subsequently interact with either material or the combined materials to produce byproducts along the silicon oxide region. The methods may further include raising the temperature in the chamber above a threshold temperature that may cause the byproducts to evaporate. In disclosed embodiments, the threshold temperature may be above about 100° C., for example. Although in disclosed embodiments the process may minimally reduce the silicon oxide layer, the process may also substantially or essentially maintain the silicon oxide material such that the thickness of the material is not reduced, or is reduced below a certain level such as less than or about 50%, 40%, 30%, 25%, 20%, 15%, 10%, 5%, 1%, etc., or not removed at all. Other methods and techniques as described throughout the present disclosure may similarly reduce the overall thickness of the material be any of the levels defined here. The process may also reduce the concentration of fluorine within a surface layer of the silicon oxide below about 10%, which may include removing an amount of the silicon oxide material including the residual fluorine species, or be removing the fluorine species from the silicon oxide material.

Such technology may provide numerous benefits over conventional techniques. For example, the systems and processes may provide additional functionality with new chambers allowing treatment processes to be performed while maintaining a moisture-free environment. The processes and systems may also provide improved processes that limit aging defects on substrates, and/or remove the underlying causes. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 4A shows another cross-sectional schematic of an exemplary processing chamber according to the disclosed technology.

Figure 1A:
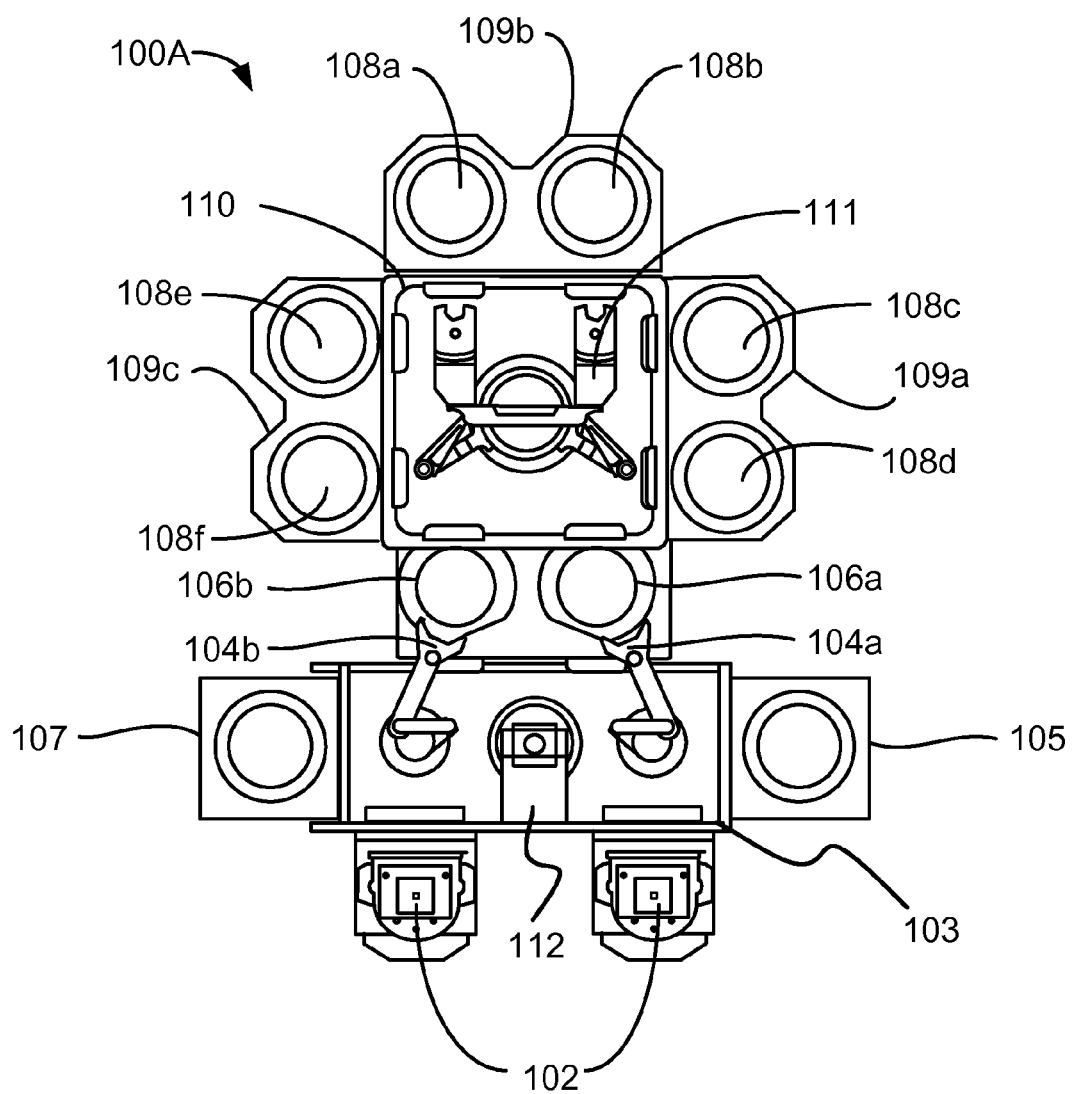
FIG. 1A shows a top plan view of an exemplary processing system according to the disclosed technology.

In the appended figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

The present technology includes improved systems and methods for reducing halide contamination of semiconductor substrate films. The systems and methods also provide improved process structures to limit moisture interaction with processed substrates. Various dry etching processes utilize halide-containing precursors in the processes. When selective etch processes are performed, the non-selective material, or the material that is etched slower, or less, or not at all, may still be exposed to the precursors and chemicals used in the etch process. For example, certain etch processes that utilize radicalized fluorine-containing precursors are selective to silicon, silicon nitride, and various metals as compared to oxide materials. When the etch process is performed, the oxide material may still be exposed to the chemical etchants despite that the material is not removed. In certain scenarios, radical fluorine or other radical halides produced in the process may interact with and/or combine with the oxide material, such as a silicon oxide material. When the process is completed, the fluorine may still be incorporated within or bonded to the silicon oxide. The process may have been performed under vacuum or in an inert environment, however after the process is completed the substrate may be removed from a vacuum environment and exposed to atmospheric conditions. This may occur both with transfer of the substrate within the processing system as well as transfer of the substrate to alternate processing systems for additional operations.

When exposed to atmospheric conditions, aging defects may form that affect the quality and strength of the dielectric. Without intending to be bound by any particular theory, the inventors believe that moisture in the air may interact with the fluorine or other halides remaining within the oxide surface. For example, fluorine present within or attached to the oxide matrix may produce or resemble a fluorinated silicon oxide, such as of a formula $SiOF_x$. When exposed to moisture, the water may interact with the oxide potentially according to the following formula:

$$SiOF_x + H_2O \rightarrow H_xSiO_4 + HF$$

This may produce silicic acid along the surface of the oxide material producing material defects or aging defects. Although the water may be removed from the silicic acid to reform silicon oxide, the quality of the film may be affected, which may have an impact throughout subsequent wafer processes. In one example, such aging issues have been recognized with native oxide films, which are often one of the first layers overlying the substrate. As such, when these films are impacted by aging defects, the quality of the entire substrate may be affected or compromised.

Accordingly, the systems and methods described herein provide flexibility in wafer processing to allow reduction in aging defects by material removal, contaminant scavenging, and/or other operations. These and other benefits will be described in detail below.

I. System and Components

In order to better understand and appreciate the technology, reference is now made to FIG. 1A, which shows a top plan view of an exemplary substrate processing system 100A configured to perform etching operations while limiting aging defects. In the figure, a pair of front opening unified pods ("FOUPs") 102 supply substrates of a variety of sizes that are received by robotic arms 104 and placed into low pressure loading chambers 106 before being placed into one of the substrate processing chambers 108a-f, positioned in tandem sections 109a-c. In alternative arrangements, the system 100A may have additional FOUPs, and may for example have 3, 4, 5, 6, etc. or more FOUPs. The process chambers may include any of the chambers as described elsewhere in this disclosure. In disclosed embodiments the processing system includes a plurality of FOUPs or holding chambers. A second robotic arm or set of robotic arms 111 may be used to transport the substrate wafers from the loading chambers 106 to the substrate processing chambers 108a-f and back through a transfer section 110. Two loading chambers 106 are illustrated, but the system may include a plurality of loading chambers that are each configured to receive substrates into a vacuum environment for processing. Each substrate processing chamber 108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes. In a disclosed embodiment, for example, the system may include at least two pairs of tandem processing chambers. A first of the at least two pairs of tandem processing chambers may be configured to perform a silicon oxide etching operation, and the second of the at least two pairs of tandem processing chambers may be configured to perform a silicon or silicon nitride etching operation.

The substrate processing chambers 108a-f may include one or more system components for depositing, annealing, curing and/or etching a dielectric film on the substrate wafer. In one configuration, two pairs of the processing chamber, e.g., 108c-d and 108e-f, may be used to perform a first etching operation on the substrate, and the third pair of processing chambers, e.g., 108a-b, may be used to perform a second etching operation on the substrate. In another configuration, all three pairs of chambers, e.g., 108a-f, may be configured to etch a dielectric film on the substrate. In still another configuration, a first pair of the processing chambers, e.g., 108a-b, may perform a deposition operation, such as depositing a flowable film, a native oxide, or additional materials. A second pair of the processing chambers, e.g., 108c-d, may perform a first etching operation, and the third pair of the processing chambers, e.g., 108e-f, may perform a second etching operation. Any one or more of the processes described may be alternatively carried out in chambers separated from the fabrication system shown in different embodiments. In disclosed embodiments detailed further below, the loading area 106 may be configured to perform additional etching, curing, or treatment processes. It will be appreciated that additional configurations of deposition, etching, annealing, and curing chambers for dielectric films are contemplated by system 100A.

The processing chambers mounted in one of the positions 108 may perform any number of processes, such as a PVD, a CVD (e.g., dielectric CVD, MCVD, MOCVD, EPI), an ALD, a decoupled plasma nitridation (DPN), a rapid thermal processing (RTP), or a dry-etch process to form various device features on a surface of a substrate. The various device features may include, but are not limited to the formation and/or etching of interlayer dielectric layers, gate dielectric layers, polysilicon gates, forming vias and trenches, planarization steps, and depositing contact or via level interconnects. In one embodiment, certain positions may be occupied by service chambers that are adapted for degassing, orientation, cool down, analysis and the like. For example, one chamber may include a metrology chamber that is adapted to perform a preparation/analysis step and/or a post-processing/analysis step to analyze a property of the substrate before or after performing a processing step in a processing sequence. In general, the properties of the substrate that can be measured in the metrology chamber may include, but are not limited to, the measurement of the intrinsic or extrinsic stress in one or more layers deposited on a surface of the substrate, film composition of one or more deposited layers, the number of particles on the surface of the substrate, and the thickness of one or more layers found on the surface of the substrate. The data collected from the metrology chamber may then be used by the system controller to adjust one or more process variables in one or more of the processing steps to produce favorable process results on subsequently processed substrates.

System 100A may include additional chambers 105, 107 on opposite sides of the interface 103. The interface section 103 may include at least two interface transfer devices, such as robot arms 104, that are configured to deliver substrates between the plurality of holding chambers or FOUPs 102 and the plurality of loading chambers 104. The holding chambers 102 may be coupled with the interface section 103 at a first location of the interface section, and the loading chambers may be coupled with the interface section 103 at a second location of the interface section 103 that is opposite the plurality of holding chambers 102. The additional chambers may be accessed by interface robot arms 104, and may be configured for transferring substrates through the interface 103. For example, chamber 105 may provide, for example, wet etching capabilities and may be accessed by interface robot arm 104a through the side of the factory interface 103. The wet station may be coupled with the interface section 103 at a third location of the interface section 103 between the first location and second location of the interface section. In disclosed embodiments the third location may be adjacent to either of the first and second locations of the interface section 103. Additionally, chamber 107 may provide, for example, additional storage and may be accessed by interface robot arm 104b through the opposite side of the factory interface 103 from chamber 105. The storage chamber 107 may be coupled with the interface 103 at a fourth location of the interface section opposite the third location. The interface 103 may include additional structures for allowing the transfer of substrates between the robot arms 104, including transfer section 112 positioned between the robot arms 104. Transfer section 112 may be configured to hold one or more substrates, and may be configured to hold 2, 5, 10, 15, 20, 25, 50, 100 etc. or more substrates at any given time for delivery for processing.

Transfer section 112 may include additional capabilities including cooling of the substrates below atmospheric conditions as well as atmospheric cleaning of the wafers, for example. In one example, a substrate may be retrieved from loading chamber 106a or side station 105 by interface robot arm 104a. If the substrate is to be loaded into chamber 107, for example, robot arm 104a may be instructed to transport and deposit the substrate to transfer section 112. Robot arm 104b may then retrieve the substrate for delivery to chamber 107. Alternatively, a substrate retrieved either from FOUPs 102 or loading chambers 106 may be placed or delivered to interface transfer section 112 for cooling, cleaning, etc. as may be performed at the interface transfer section 112. The holding chambers or FOUPs 102 may include at least one inlet port configured to receive a fluid through the inlet port. The FOUPs may be further configured to direct the fluid through the holding chamber and into the interface section 103. The holding chambers 103 may additionally include at least one internal diffuser configured to direct the received fluid throughout the holding chamber. For example, a nitrogen or other inert fluid may be flowed into the FOUPs through the inlet ports. As any individual FOUP may house 10, 25, 50, etc. or more substrates, internal diffusers may direct the nitrogen or other fluid through the FOUP to ensure that the entire internal environment of the FOUP is purged of air. The diffusers may direct or be configured to direct the fluid in between and around each and every substrate housed in the FOUP.

The system 100A may be adapted to transport substrates between and through atmospheric and vacuum environments. For example, interface 103 may provide access from FOUPs 102 at atmospheric pressures and loading chambers 106, which may be configured to be evacuated. Accordingly, all systems including chambers 108 and transfer station 110 may be configured to operate at vacuum conditions, and loading chambers 106 may provide access between the atmospheric and vacuum environments. Loading chambers 106 may include areas of transfer, such as slit valves on both the interface 103 side as well as the transfer chamber 110 side. Both valves may be closed to maintain the alternate environments. The slit valve on the interface 103 side may open to allow delivery of a substrate by arms 104. The valve may then close and the loading chamber may be evacuated to the vacuum environment at which the other chambers may be maintained. The slit valve on the transfer station side of the loading chamber 106 may then be opened to provide access to the vacuum environment. Alternatively, the process chambers 108 and transfer chamber 110 may be maintained in an inert environment, such as with nitrogen purging, which may be continuously flowed through each of the chambers to maintain the inert atmosphere. The loading chamber 106 may similarly be configured to be purged with nitrogen after receiving a substrate in order to provide the substrate to the process sections in a similar environment. The system 100A may additionally include gas delivery systems and system controllers (not shown) for providing precursors and instructions for performing a variety of processing operations.

Figure 1B:
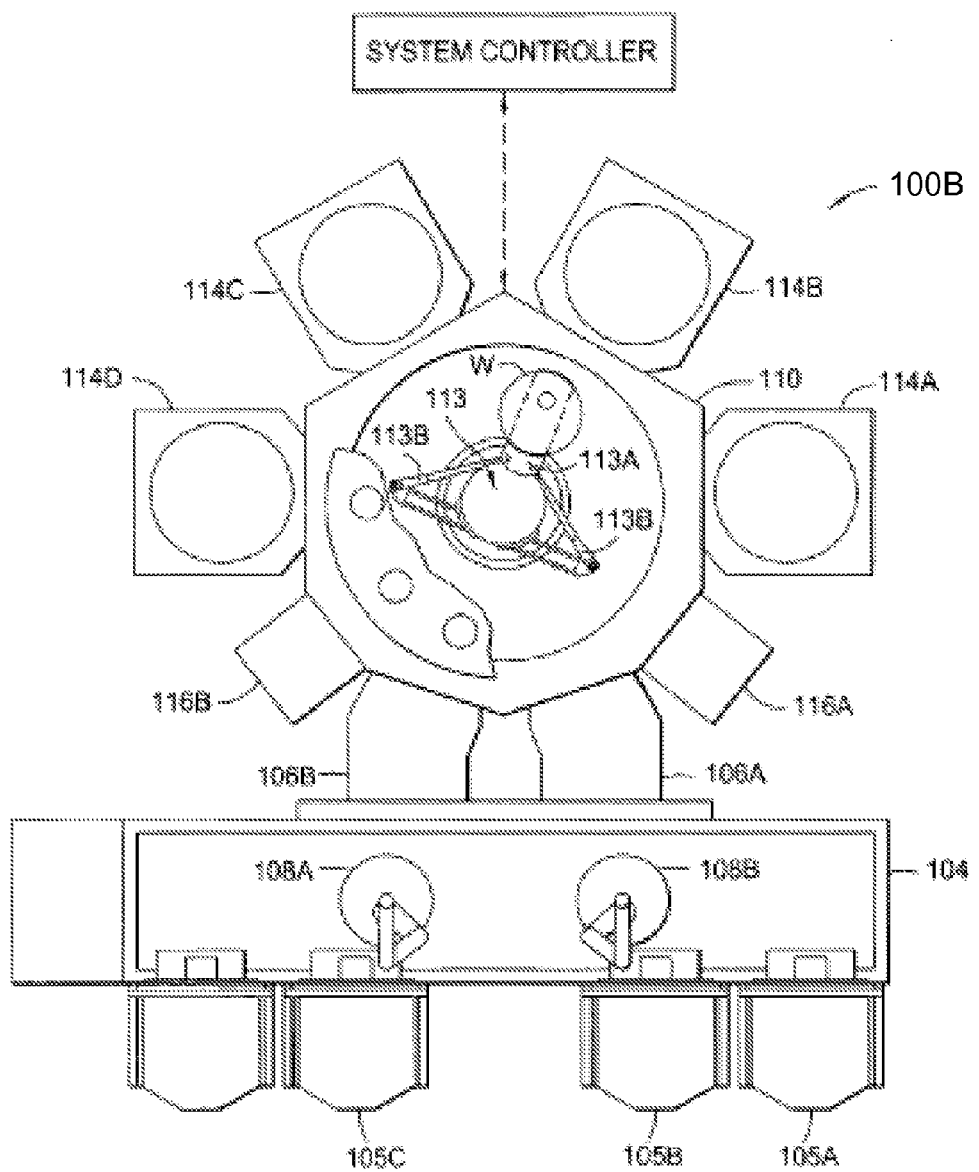
FIG. 1B shows a top plan view of another exemplary processing system according to the disclosed technology.

FIG. 1B illustrates another exemplary processing system to which a variety of the chambers and features may be coupled in various embodiments. The processing tool 100B depicted in FIG. 1B may contain a plurality of process chambers, 114A-D, a transfer chamber 110, service chambers 116A-B, and a pair of load lock chambers 106A-B. The process chambers may include any of the chambers as described elsewhere in this disclosure including the chambers discussed in relation to system 100A above and the specific chambers below. Additionally, the system 100B may include single chambers as opposed to tandem chambers, and any of the chambers disclosed elsewhere may be adapted as a single chamber or tandem chamber. To transport substrates among the chambers, the transfer chamber 110 may contain a robotic transport mechanism 113. The transport mechanism 113 may have a pair of substrate transport blades 113A attached to the distal ends of extendible arms 113B, respectively. The blades 113A may be used for carrying individual substrates to and from the process chambers. In operation, one of the substrate transport blades such as blade 113A of the transport mechanism 113 may retrieve a substrate W from one of the load lock chambers such as chambers 106A-B and carry substrate W to a first stage of processing, for example, an etching process as described below in chambers 114A-D. If the chamber is occupied, the robot may wait until the processing is complete and then remove the processed substrate from the chamber with one blade 113A and may insert a new substrate with a second blade (not shown). Once the substrate is processed, it may then be moved to a second stage of processing. For each move, the transport mechanism 113 generally may have one blade carrying a substrate and one blade empty to execute a substrate exchange. The transport mechanism 113 may wait at each chamber until an exchange can be accomplished.

Once processing is complete within the process chambers, the transport mechanism 113 may move the substrate W from the last process chamber and transport the substrate W to a cassette within the load lock chambers 106A-B. From the load lock chambers 106A-B, the substrate may move into a factory interface 104. The factory interface 104 generally may operate to transfer substrates between pod loaders 105A-D in an atmospheric pressure clean environment and the load lock chambers 106A-B. The clean environment in factory interface 104 may be generally provided through air filtration processes, such as HEPA filtration, for example. Factory interface 104 may also include a substrate orienter/aligner (not shown) that may be used to properly align the substrates prior to processing. At least one substrate robot, such as robots 108A-B, may be positioned in factory interface 104 to transport substrates between various positions/locations within factory interface 104 and to other location in communication therewith. Robots 108A-B may be configured to travel along a track system within enclosure 104 from a first end to a second end of the factory interface 104.

Figure 2:
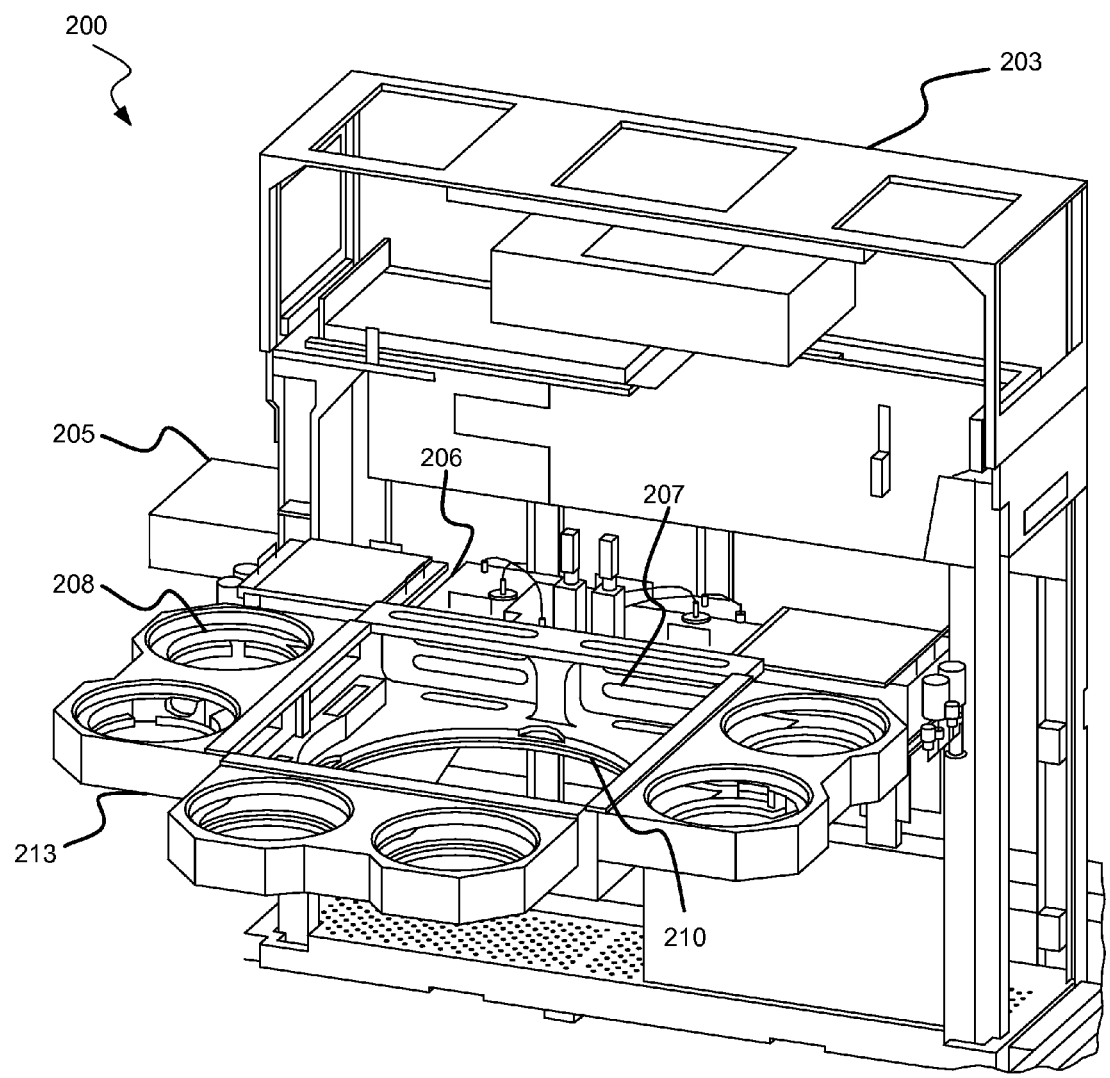
FIG. 2 shows a rear perspective view of an exemplary processing system according to the disclosed technology.

Turning to FIG. 2 is shown a rear perspective view of an exemplary processing system 200 according to the disclosed technology. System 200 may include an alternate view of the system of FIG. 1A, from the clean room or vacuum side of the interface. As shown in the illustration, interface 203 may be accessed by loading chambers 206 that may be configured to provide access to an evacuated environment for processing through sealable openings 207, which may be slit valves. The loading chambers 206 may include additional components configured to act upon the substrates. The loading chambers 206 may include a heating device configured to heat the loading chamber or a substrate contained within from temperatures below or about 0° C. up to temperatures above or about 800° C. For example, the loading chamber heating device may be configured to heat the substrate up to or above 300° C. in disclosed embodiments. Additionally, a side chamber 205 may be located on the side of interface 203. Although not shown, an additional side chamber may be positioned on the side of the interface opposite chamber 205 as illustrated in FIG. 1A with chamber 107. Both side chambers may be accessed through the factory interface 203 as previously described. System body 213 may define the positions at which the processing chambers 208, loading chambers 206, and transfer station 210 are located. A variety of processing chambers 208 may be incorporated into system 200, and may include a combination of the processing stations as illustrated in FIGS. 3-6 below. Although a single chamber is illustrated in each of the following figures, the figures may show one half of a tandem processing chamber adapted to run two wafers at a time with a single delivery system shared between the chambers. In disclosed embodiments the plurality of processing chambers are coupled as pairs of tandem processing chambers within the substrate processing system.

Figure 3:
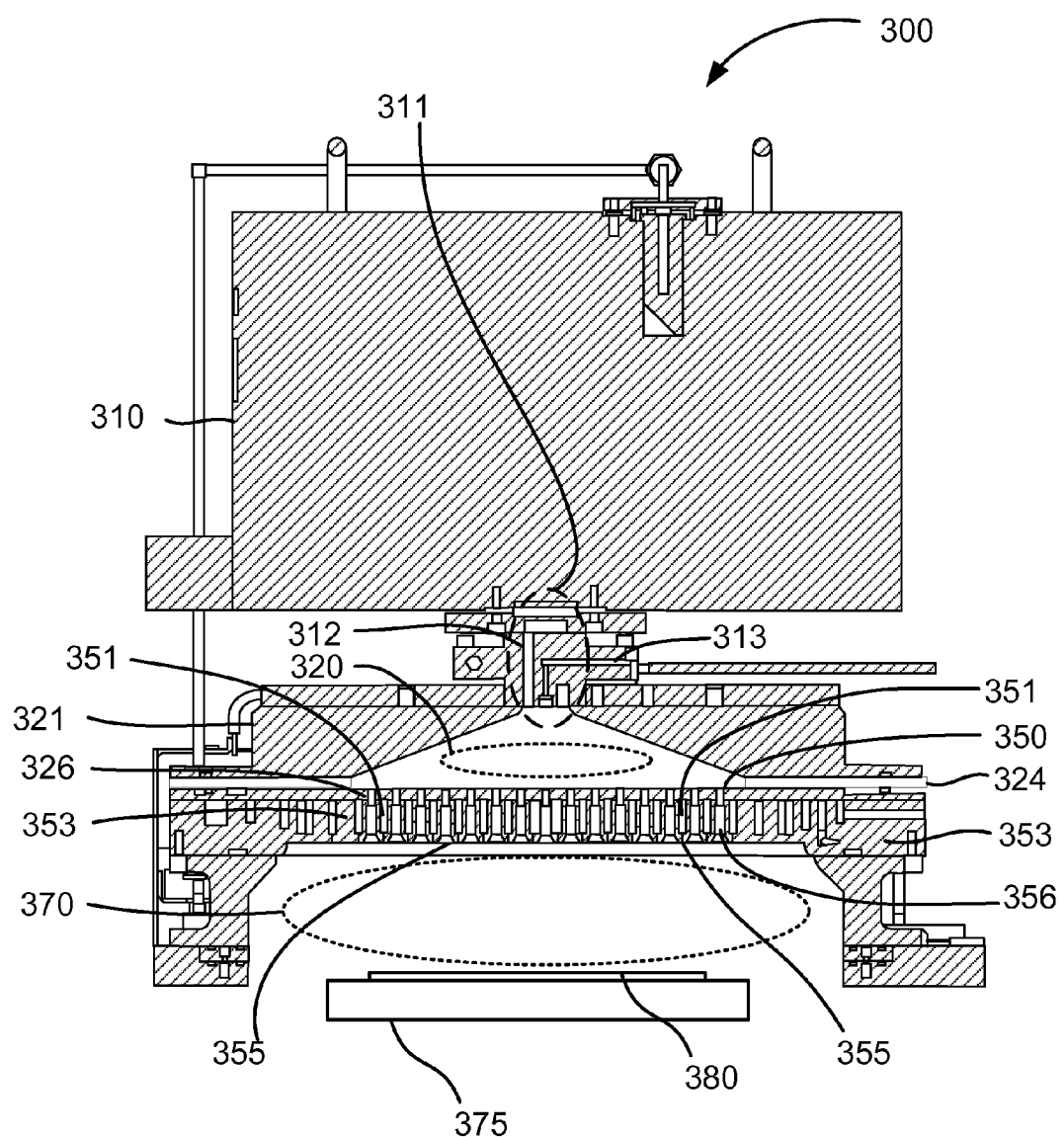
FIG. 3 shows a cross-sectional schematic of an exemplary processing chamber for use in a system according to the disclosed technology.

Turning to FIG. 3 is shown a cross-sectional schematic of an exemplary processing chamber 300 according to the disclosed technology. Chamber 300 may be used, for example, in one or more of the processing chamber sections 208 of the system 200 previously discussed. A remote plasma system ("RPS") 310 may process a gas which then travels through a gas inlet assembly 311. Two distinct gas supply channels may be present within the gas inlet assembly 311. A first channel 312 may carry a gas that passes through the RPS 310, while a second channel 313 may bypass the RPS 310. The first channel 312 may be used for the process gas and the second channel 313 may be used for a treatment gas in disclosed embodiments. The lid or conductive top portion 321 and a perforated partition, such as showerhead 353, are shown with an insulating ring 324 disposed between, which may allow an AC potential to be applied to the lid 321 relative to showerhead 353. The process gas may travel through first channel 312 into chamber plasma region 320 and may be excited by a plasma in chamber plasma region 320 alone or in combination with RPS 310. The combination of chamber plasma region 320 and/or RPS 310 may be referred to as a remote plasma system herein. The perforated partition or showerhead 353 may separate chamber plasma region 320 from a substrate processing region 370 beneath showerhead 353. Showerhead 353 may allow a plasma present in chamber plasma region 320 to avoid directly exciting gases in substrate processing region 370, while still allowing excited species to travel from chamber plasma region 320 into substrate processing region 370.

Showerhead 353 may be positioned between chamber plasma region 320 and substrate processing region 370 and allow plasma effluents or excited derivatives of precursors or other gases created within chamber plasma region 320 to pass through a plurality of through-holes 356 that traverse the thickness of the plate or plates included in the showerhead. The precursors and/or plasma derivatives may combine in processing region 370 in order to produce films that may be deposited on substrate 380 positioned on a substrate support 375. The showerhead 353 may also have one or more hollow volumes 351 that can be filled with a precursor in the form of a vapor or gas, such as a silicon-containing precursor, and pass through small holes 355 into substrate processing region 370, but not directly into chamber plasma region 320. Showerhead 353 may be thicker than the length of the smallest diameter 350 of the through-holes 356 in disclosed embodiments. In order to maintain a significant concentration of excited species penetrating from chamber plasma region 320 to substrate processing region 370, the length 326 of the smallest diameter 350 of the through-holes may be restricted by forming larger diameter portions of through-holes 356 part way through the showerhead 353. The length of the smallest diameter 350 of the through-holes 356 may be the same order of magnitude as the smallest diameter of the through-holes 356 or less in disclosed embodiments.

In the embodiment shown, showerhead 353 may distribute, via through-holes 356, process gases which contain a plasma vapor/gas such as argon, for example. Additionally, the showerhead 353 may distribute, via smaller holes 355, a silicon-containing precursor that is maintained separately from the plasma region 320. The process gas or gases and the silicon-containing precursor may be maintained fluidly separate via the showerhead 353 until the precursors separately enter the processing region 370. The precursors may contact one another once they enter the processing region and react to form a flowable dielectric material on substrate 380, for example.

Chamber 300 may be used to deposit an oxide layer on a silicon substrate or a silicon nitride layer, or on a previously patterned substrate that may include regions of silicon or nitride, for example. An additional example of a deposition chamber and process that may be used in conjunction with the disclosed technology is described in co-assigned application Ser. No. 13/153,016 titled "Oxide Rich Liner Layer for Flowable CVD Gapfill," filed on Jun. 3, 2011, the entire contents of which are hereby incorporated by reference for all purposes not inconsistent with the present disclosure.

FIG. 4A shows another cross-sectional schematic of an exemplary processing chamber 400 with partitioned plasma generation regions within the processing chamber. Chamber 400 may be used, for example, in one or more of the processing chamber sections 208 of the system 200 previously discussed. During film etching, e.g., titanium nitride, tantalum nitride, tungsten, silicon, polysilicon, silicon oxide, silicon nitride, silicon oxynitride, silicon oxycarbide, etc., a process gas may be flowed from gas delivery system 410 into the first plasma region 415 through a gas inlet assembly 405. The plasma region 415 within the chamber may be similar to the second remote plasma region discussed previously, and may be remote from processing region 433 as discussed below. A remote plasma system ("RPS") 401 may be included in the system, and may process a first gas which then travels through gas inlet assembly 405. RPS unit 401 may be similar to the first remote plasma region as previously discussed. The inlet assembly 405 may include two or more distinct gas supply channels where the second channel may bypass the RPS 401. Accordingly, in disclosed embodiments at least one of the precursor gases may be delivered to the processing chamber in an unexcited state, such as a fluorine-containing precursor. In another example, the first channel provided through the RPS may be used for an oxygen-containing precursor and the second channel bypassing the RPS may be used for the fluorine-containing precursor in disclosed embodiments. The oxygen-containing precursor may be excited within the RPS 401 prior to entering the first plasma region 415. Accordingly, the fluorine-containing precursor and/or the oxygen-containing precursor as discussed above, for example, may pass through RPS 401 or bypass the RPS unit in disclosed embodiments. Various other examples encompassed by this arrangement will be similarly understood.

A cooling plate 403, faceplate 417, ion suppressor 423, showerhead 425, and a substrate support 465, having a substrate 455 disposed thereon, are shown and may each be included according to disclosed embodiments. The pedestal 465 may have a heat exchange channel through which a heat exchange fluid flows to control the temperature of the substrate. This configuration may allow the substrate 455 temperature to be cooled or heated to maintain relatively low temperatures, such as between about −20° C. to about 200° C., or therebetween. The heat exchange fluid may comprise ethylene glycol and/or water. The wafer support platter of the pedestal 465, which may comprise aluminum, ceramic, or a combination thereof, may also be resistively heated in order to achieve relatively high temperatures, such as from up to or about 100° C. to above or about 1100° C., using an embedded resistive heater element. The heating element may be formed within the pedestal as one or more loops, and an outer portion of the heater element may run adjacent to a perimeter of the support platter, while an inner portion runs on the path of a concentric circle having a smaller radius. The wiring to the heater element may pass through the stem of the pedestal 465, which may be further configured to rotate.

The faceplate 417 may be pyramidal, conical, or of another similar structure with a narrow top portion expanding to a wide bottom portion. The faceplate 417 may additionally be flat as shown and include a plurality of through-channels used to distribute process gases. Plasma generating gases and/or plasma excited species, depending on use of the RPS 401, may pass through a plurality of holes, shown in FIG. 4B, in faceplate 417 for a more uniform delivery into the first plasma region 415.

Exemplary configurations may include having the gas inlet assembly 405 open into a gas supply region 458 partitioned from the first plasma region 415 by faceplate 417 so that the gases/species flow through the holes in the faceplate 417 into the first plasma region 415. The faceplate 417, or a conductive top portion of the chamber, and showerhead 425 are shown with an insulating ring 420 located between the features, which allows an AC potential to be applied to the faceplate 417 relative to showerhead 425 and/or ion suppressor 423, which may be electrically coupled with the showerhead 425, or similarly insulated. The insulating ring 420 may be positioned between the faceplate 417 and the showerhead 425 and/or ion suppressor 423 enabling a capacitively-coupled plasma ("CCP") to be formed in the first plasma region. A baffle (not shown) may additionally be located in the first plasma region 415, or otherwise coupled with gas inlet assembly 405, to affect the flow of fluid into the region through gas inlet assembly 405.

The ion suppressor 423 may comprise a plate or other geometry that defines a plurality of apertures throughout the structure that are configured to suppress the migration of ionically-charged species out of the plasma excitation region 415 while allowing uncharged neutral or radical species to pass through the ion suppressor 423 into an activated gas delivery region between the suppressor and the showerhead. In disclosed embodiments, the ion suppressor 423 may comprise a perforated plate with a variety of aperture configurations. Showerhead 425 in combination with ion suppressor 423 may allow a plasma present in chamber plasma region 415 to avoid directly exciting gases in substrate processing region 433, while still allowing excited species to travel from chamber plasma region 415 into substrate processing region 433. In this way, the chamber may be configured to prevent the plasma from contacting a substrate 455 being etched.

The processing system may further include a power supply 440 electrically coupled with the processing chamber to provide electric power to the faceplate 417, ion suppressor 423, showerhead 425, and/or pedestal 465 to generate a plasma in the first plasma region 415 or processing region 433. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 415. This in turn may allow development of particular plasma characteristics such that precursors may be dissociated in specific ways to enhance the etching profiles produced by these precursors. For example, this may provide the partial dissociation of nitrogen trifluoride as explained previously.

A plasma may be ignited either in chamber plasma region 415 above showerhead 425 or substrate processing region 433 below showerhead 425. A plasma may be present in chamber plasma region 415 to produce the radical-fluorine precursors from an inflow of the fluorine-containing precursor. An AC voltage typically in the radio frequency ("RF") range may be applied between the conductive top portion of the processing chamber, such as faceplate 417, and showerhead 425 and/or ion suppressor 423 to ignite a plasma in chamber plasma region 415 during deposition. An RF power supply may generate a high RF frequency of 13.56 MHz but may also generate other frequencies alone or in combination with the 13.56 MHz frequency.

Plasma power can be of a variety of frequencies or a combination of multiple frequencies either in an internal plasma region, or in an RPS unit. In the exemplary processing system the plasma may be provided by RF power delivered to faceplate 417 relative to ion suppressor 423 and/or showerhead 425. The RF power may be between about 10 Watts and about 2000 Watts, between about 100 Watts and about 2000 Watts, between about 200 Watts and about 1500 Watts, between about 0 and about 500 Watts, or between about 200 Watts and about 1000 Watts in different embodiments. The RF frequency applied in the exemplary processing system may be low RF frequencies less than about 200 kHz, high RF frequencies between about 10 MHz and about 15 MHz, or microwave frequencies greater than or about 1 GHz in different embodiments. The plasma power may be capacitively-coupled or inductively-coupled into the remote plasma region. In alternative configurations, the chamber may be configured to utilize UV or e-beam sources to excite or activate the reactive species. These capabilities may be utilized in conjunction with or in lieu of the plasma.

The showerhead 425 may comprise an upper plate 414 and a lower plate 416. The plates may be coupled with one another to define a volume 418 between the plates. The coupling of the plates may be so as to provide first fluid channels 419 through the upper and lower plates, and second fluid channels 421 through the lower plate 416. The formed channels may be configured to provide fluid access from the volume 418 through the lower plate 416 via second fluid channels 421 alone, and the first fluid channels 419 may be fluidly isolated from the volume 418 between the plates and the second fluid channels 421. The volume 418 may be fluidly accessible through a side of the gas distribution assembly 425. For example, an additional precursor that may not interact with the activated precursors previously described may be delivered to the processing region via second fluid channels 421 so that the activated precursors and the additional precursors interact only when they separately enter the processing region 433. Although the exemplary system of FIG. 4A includes a dual-channel showerhead, it is understood that alternative distribution assemblies may be utilized that maintain first and second precursors fluidly isolated prior to the processing region 433. For example, a perforated plate and tubes underneath the plate may be utilized, although other configurations may operate with reduced efficiency or not provide as uniform processing as the dual-channel showerhead as described. Alternatively, when the only precursors utilized will be delivered via inlet assembly 405, and all precursors will flow from plasma region 415, a dual-channel may not be necessary, and a single plate manifold or perforated plate may be utilized that further mixes the precursors while delivering them directly to the processing region 433.

Figure 4B:
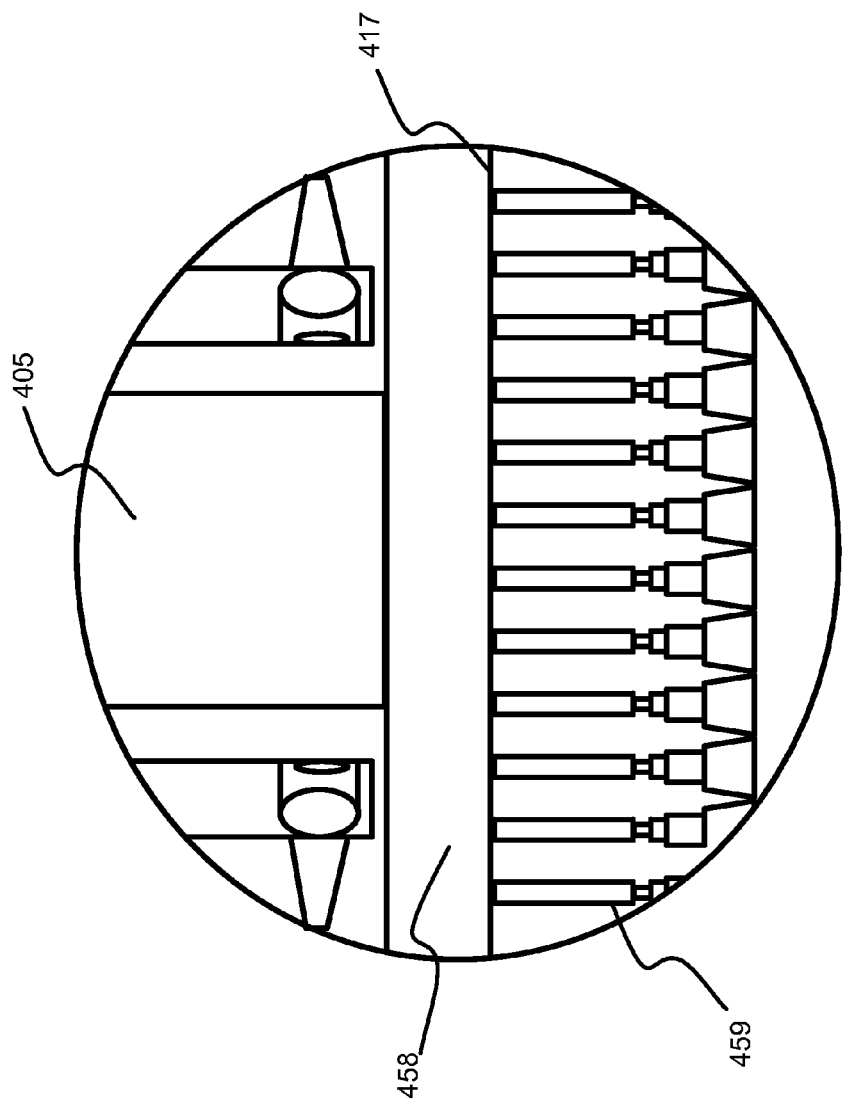
FIG. 4B shows a detailed partial view of components of the processing chamber shown in FIG. 4A.

FIG. 4B shows a detailed partial view of components of the processing chamber shown in FIG. 4A. As shown in FIGS. 4A and 4B, faceplate 417, cooling plate 403, and gas inlet assembly 405 intersect to define a gas supply region 458 into which process gases may be delivered from gas inlet 405. The gases may fill the gas supply region 458 and flow to first plasma region 415 through apertures 459 in faceplate 417. The apertures 459 may be configured to direct flow in a substantially unidirectional manner such that process gases may flow into processing region 433, but may be partially or fully prevented from backflow into the gas supply region 458 after traversing the faceplate 417.

Chamber 400 may be used for etching a silicon or silicon nitride film while not etching, or minimally etching an exposed silicon oxide film, for example. Additional examples of etching processes and chambers that may be used in conjunction with the disclosed technology and chamber 400 are described in co-assigned application No. 61/771,264 titled "Enhanced Etching Processes Using Remote Plasma Sources," and filed Mar. 1, 2013, the entire contents of which are hereby incorporated by reference for all purposes not inconsistent with the present disclosure. Additional examples of processes and chambers including multiple RPS units that may be used in conjunction with the disclosed technology and chamber 400 are described in co-assigned application Ser. No. 13/791,074 titled "Semiconductor Processing Systems Having Multiple Plasma Configurations," and filed Mar. 8, 2013, the entire contents of which are hereby incorporated by reference for all purposes not inconsistent with the present disclosure.

Figure 5:
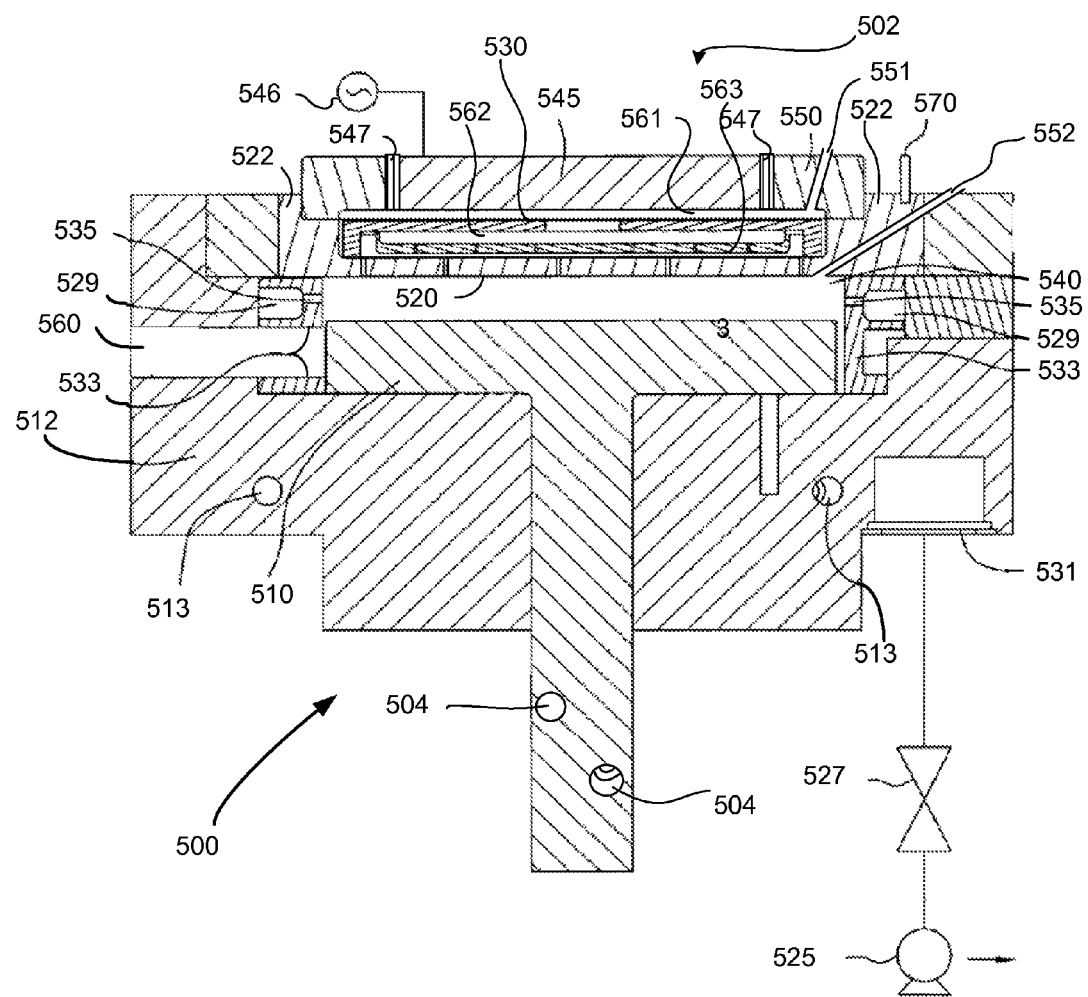
FIG. 5 shows another cross-sectional schematic of an exemplary processing chamber according to the disclosed technology.

FIG. 5 shows another cross-sectional schematic of an exemplary processing chamber 500 according to the disclosed technology. Chamber 500 may be used, for example, in one or more of the processing chamber sections 208 of the system 200 previously discussed. Processing chamber 500 may include a chamber body 512, a lid assembly 502, and a support assembly 510. The lid assembly 502 is disposed at an upper end of the chamber body 512, and the support assembly 510 is at least partially disposed within the chamber body 512. The processing chamber 500 and the associated hardware are preferably formed from one or more process-compatible materials, e.g., aluminum, stainless steel, etc.

The chamber body 512 includes a slit valve opening 560 formed in a sidewall thereof to provide access to the interior of the processing chamber 500. The slit valve opening 560 is selectively opened and closed to allow access to the interior of the chamber body 512 by a wafer handling robot (not shown). In one embodiment, a wafer can be transported in and out of the processing chamber 500 through the slit valve opening 560 to an adjacent transfer chamber and/or load-lock chamber, or another chamber within a system such as system 100A or 100B previously described.

In one or more embodiments, chamber body 512 includes a chamber body channel 513 for flowing a heat transfer fluid through chamber body 512. The heat transfer fluid can be a heating fluid or a coolant and is used to control the temperature of chamber body 512 during processing and substrate transfer. Heating the chamber body 512 may help to prevent unwanted condensation of the gas or byproducts on the chamber walls. Exemplary heat transfer fluids include water, ethylene glycol, or a mixture thereof. An exemplary heat transfer fluid may also include nitrogen gas. Support assembly 510 may have a support assembly channel 504 for flowing a heat transfer fluid through support assembly 510 thereby affecting the substrate temperature.

The chamber body 512 can further include a liner 533 that surrounds the support assembly 510. The liner 533 is preferably removable for servicing and cleaning. The liner 533 can be made of a metal such as aluminum, or a ceramic material. However, the liner 533 can be any process compatible material. The liner 533 can be bead blasted to increase the adhesion of any material deposited thereon, thereby preventing flaking of material which results in contamination of the processing chamber 500. In one or more embodiments, the liner 533 includes one or more apertures 535 and a pumping channel 529 formed therein that is in fluid communication with a vacuum system. The apertures 535 provide a flow path for gases into the pumping channel 529, which provides an egress for the gases within the processing chamber 500.

The vacuum system can include a vacuum pump 525 and a throttle valve 527 to regulate flow of gases through the processing chamber 500. The vacuum pump 525 is coupled to a vacuum port 531 disposed on the chamber body 512 and therefore, in fluid communication with the pumping channel 529 formed within the liner 533.

Apertures 535 allow the pumping channel 529 to be in fluid communication with a substrate processing region 540 within the chamber body 512. The substrate processing region 540 is defined by a lower surface of the lid assembly 502 and an upper surface of the support assembly 510, and is surrounded by the liner 533. The apertures 535 may be uniformly sized and evenly spaced about the liner 533. However, any number, position, size or shape of apertures may be used, and each of those design parameters can vary depending on the desired flow pattern of gas across the substrate receiving surface as is discussed in more detail below. In addition, the size, number and position of the apertures 535 are configured to achieve uniform flow of gases exiting the processing chamber 500. Further, the aperture size and location may be configured to provide rapid or high capacity pumping to facilitate a rapid exhaust of gas from the chamber 500. For example, the number and size of apertures 535 in close proximity to the vacuum port 531 may be smaller than the size of apertures 535 positioned farther away from the vacuum port 531.

A gas supply panel (not shown) is typically used to provide process gas(es) to the processing chamber 500 through one or more apertures 551. The particular gas or gases that are used depend upon the process or processes to be performed within the chamber 500. Illustrative gases can include, but are not limited to one or more precursors, reductants, catalysts, carriers, purge, cleaning, or any mixture or combination thereof. Typically, the one or more gases introduced to the processing chamber 500 flow into plasma volume 561 through aperture(s) 551 in top plate 550. Alternatively or in combination, processing gases may be introduced more directly through aperture(s) 552 into substrate processing region 540. Aperture(s) 552 bypass the remote plasma excitation and are useful for processes involving gases that do not require plasma excitation or processes which do not benefit from additional excitation of the gases. Electronically operated valves and/or flow control mechanisms (not shown) may be used to control the flow of gas from the gas supply into the processing chamber 500. Depending on the process, any number of gases can be delivered to the processing chamber 500, and can be mixed either in the processing chamber 500 or before the gases are delivered to the processing chamber 500.

The lid assembly 502 can further include an electrode 545 to generate a plasma of reactive species within the lid assembly 502. In one embodiment, the electrode 545 is supported by top plate 550 and is electrically isolated therefrom by inserting electrically isolating ring(s) 547 made from aluminum oxide or any other insulating and process compatible material. In one or more embodiments, the electrode 545 is coupled to a power source 546 while the rest of lid assembly 502 is connected to ground. Accordingly, a plasma of one or more process gases can be generated in remote plasma region composed of volumes 561, 562 and/or 563 between electrode 545 and annular mounting flange 522. In embodiments, annular mounting flange 522 comprises or supports gas delivery plate 520. For example, the plasma may be initiated and maintained between electrode 545 and one or both blocker plates of blocker assembly 530. Alternatively, the plasma can be struck and contained between the electrode 545 and gas delivery plate 520, in the absence of blocker assembly 530. In either scenario, the plasma is well confined or contained within the lid assembly 502. An RPS unit such as that previously described may also be utilized to generate a plasma of reactive species which are then delivered into the chamber 500.

The temperatures of the process chamber body 512 and the substrate may each be controlled by flowing a heat transfer medium through chamber body channel 513 and support assembly channel 504, respectively. Support assembly channel 504 may be formed within support assembly 510 to facilitate the transfer of thermal energy. Chamber body 512 and support assembly 510 may be cooled or heated independently. For example, a heating fluid may be flown through one while a cooling fluid is flown through the other.

Other methods may be used to control the substrate temperature. The substrate may be heated by heating the support assembly 510 or a portion thereof, such as a pedestal, with a resistive heater or by some other means. In another configuration, gas delivery plate 520 may be maintained at a temperature higher than the substrate and the substrate can be elevated in order to raise the substrate temperature. In this case the substrate is heated radiatively or by using a gas to conduct heat from gas delivery plate 520 to the substrate. The substrate may be elevated by raising support assembly 510 or by employing lift pins.

Chamber 500 may be used for etching a silicon oxide film while not etching, or minimally etching an exposed silicon surface or silicon nitride surface, for example. Additional examples of etching processes and chambers that may be used in conjunction with the disclosed technology and chamber 500 are described in co-assigned application No. 61/702,493 titled "Radical-Component Oxide Etch," and filed Sep. 18, 2012, the entire contents of which are hereby incorporated by reference for all purposes not inconsistent with the present disclosure.

Figure 6:
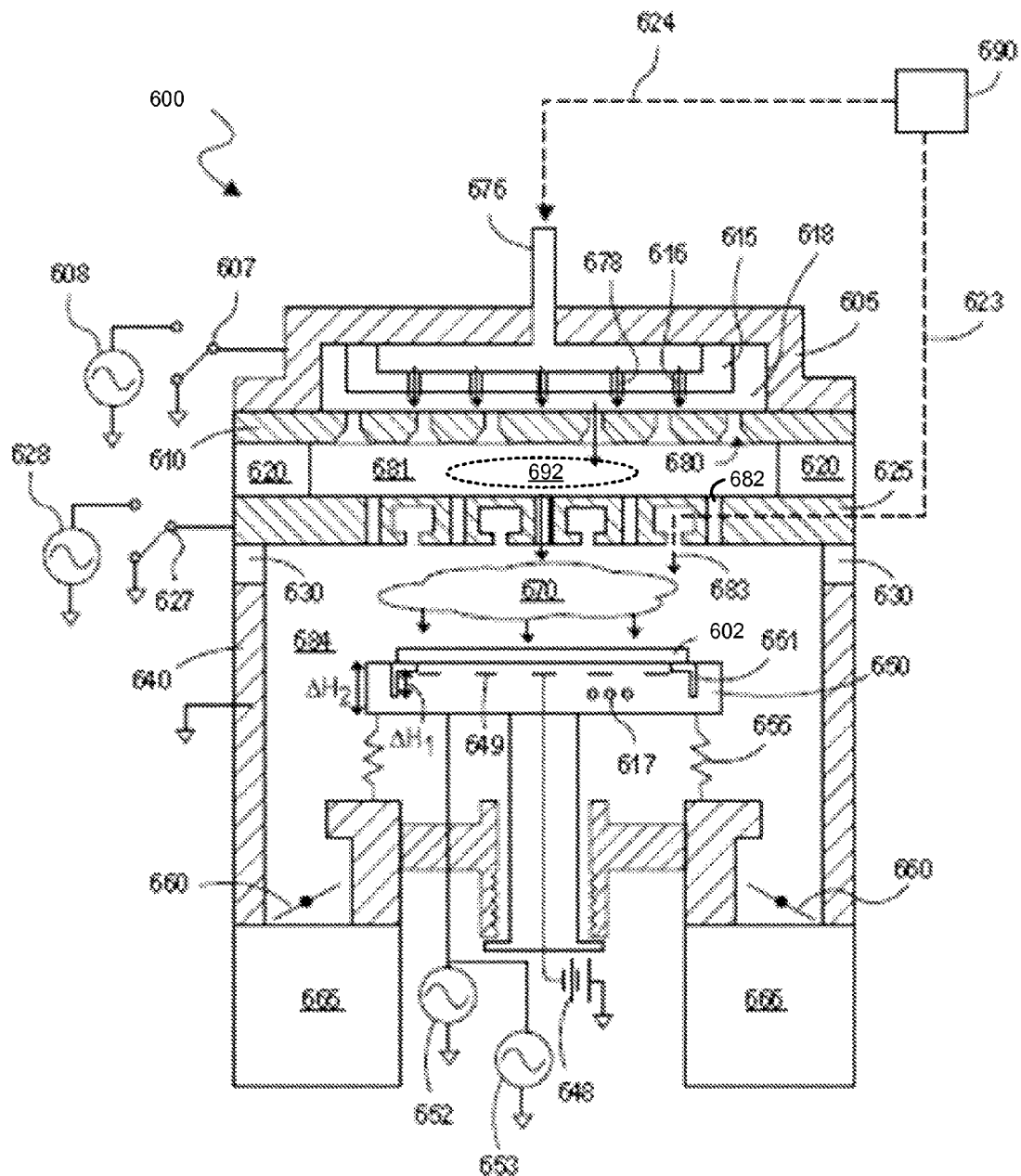
FIG. 6 shows another cross-sectional schematic of an exemplary processing chamber according to the disclosed technology.

FIG. 6 shows another cross-sectional schematic of an exemplary processing chamber 600 according to the disclosed technology. Chamber 600 may be used, for example, in one or more of the processing chamber sections 208 of the system 200 previously discussed Generally, the etch chamber 600 may include a first capacitively-coupled plasma source to implement an ion milling operation and a second capacitively-coupled plasma source to implement an etching operation and to implement an optional deposition operation. The chamber 600 may include grounded chamber walls 640 surrounding a chuck 650. In embodiments, the chuck 650 may be an electrostatic chuck which clamps the substrate 602 to a top surface of the chuck 650 during processing, though other clamping mechanisms as would be known may also be utilized. The chuck 650 may include an embedded heat exchanger coil 617. In the exemplary embodiment, the heat exchanger coil 617 includes one or more heat transfer fluid channels through which heat transfer fluid, such as an ethylene glycol/water mix, may be passed to control the temperature of the chuck 650 and ultimately the temperature of the substrate 602.

The chuck 650 may include a mesh 649 coupled to a high voltage DC supply 648 so that the mesh 649 may carry a DC bias potential to implement the electrostatic clamping of the substrate 602. The chuck 650 may be coupled to a first RF power source and in one such embodiment, the mesh 649 is coupled to the first RF power source so that both the DC voltage offset and the RF voltage potentials are coupled across a thin dielectric layer on the top surface of the chuck 650. In the illustrative embodiment, the first RF power source may include a first and second RF generator 652, 653. The RF generators 652, 653 may operate at any industrial frequency known in the art, however in the exemplary embodiment the RF generator 652 may operate at 60 MHz to provide advantageous directionality. Where a second RF generator 653 is also provided, the exemplary frequency may be 2 MHz.

With the chuck 650 to be RF powered, an RF return path may provided by a first showerhead 625. The first showerhead 625 may be disposed above the chuck to distribute a first feed gas into a first chamber region 684 defined by the first showerhead 625 and the chamber wall 640. As such, the chuck 650 and the first showerhead 625 form a first RF coupled electrode pair to capacitively energize a first plasma 670 of a first feed gas within a first chamber region 684. A DC plasma bias, or RF bias, resulting from capacitive coupling of the RF powered chuck may generate an ion flux from the first plasma 670 to the substrate 602, e.g., Ar ions where the first feed gas is Ar, to provide an ion milling plasma. The first showerhead 625 may be grounded or alternately coupled to an RF source 628 having one or more generators operable at a frequency other than that of the chuck 650, e.g., 13.56 MHz or 60 MH. In the illustrated embodiment the first showerhead 625 may be selectably coupled to ground or the RF source 628 through the relay 627 which may be automatically controlled during the etch process, for example by a controller (not shown).

As further illustrated in the figure, the etch chamber 600 may include a pump stack capable of high throughput at low process pressures. In embodiments, at least one turbo molecular pump 665, 666 may be coupled with the first chamber region 684 through a gate valve 660 and disposed below the chuck 650, opposite the first showerhead 625. The turbo molecular pumps 665, 666 may be any commercially available pumps having suitable throughput and more particularly may be sized appropriately to maintain process pressures below or about 10 mTorr or below or about 5 mTorr at the desired flow rate of the first feed gas, e.g., 50 to 500 sccm of Ar where argon is the first feedgas. In the embodiment illustrated, the chuck 650 may form part of a pedestal which is centered between the two turbo pumps 665 and 666, however in alternate configurations chuck 650 may be on a pedestal cantilevered from the chamber wall 640 with a single turbo molecular pump having a center aligned with a center of the chuck 650.

Disposed above the first showerhead 625 may be a second showerhead 610. In one embodiment, during processing, the first feed gas source, for example, Argon delivered from gas distribution system 690 may coupled to a gas inlet 676, and the first feed gas flowed through a plurality of apertures 680 extending through second showerhead 610, into the second chamber region 681, and through a plurality of apertures 682 extending through the first showerhead 625 into the first chamber region 684. An additional flow distributor 615 having apertures 678 may further distribute a first feed gas flow 616 across the diameter of the etch chamber 600 through a distribution region 618. In an alternate embodiment, the first feed gas may be flowed directly into the first chamber region 684 via apertures 683 which are isolated from the second chamber region 681 as denoted by dashed line 623. For example, where the first showerhead is a dual-channel showerhead as previously described, the apertures 683 correspond to apertures 775 in FIG. 7.

Chamber 600 may additionally be reconfigured from the state illustrated to perform an etching operation. A secondary electrode 605 may be disposed above the first showerhead 625 with a second chamber region 681 there between. The secondary electrode 605 may further form a lid of the etch chamber 600. The secondary electrode 605 and the first showerhead 625 may be electrically isolated by a dielectric ring 620 and form a second RF coupled electrode pair to capacitively discharge a second plasma 692 of a second feed gas within the second chamber region 681. Advantageously, the second plasma 692 may not provide a significant RF bias potential on the chuck 650. At least one electrode of the second RF coupled electrode pair is coupled to an RF source for energizing an etching plasma. The secondary electrode 605 may be electrically coupled with the second showerhead 610. In an exemplary embodiment, the first showerhead 625 may be coupled with a ground plane or floating and may be coupled to ground through a relay 627 allowing the first showerhead 625 to also be powered by the RF power source 628 during the ion milling mode of operation. Where the first showerhead 625 is grounded, an RF power source 608, having one or more RF generators operating at 13.56 MHz or 60 MHz for example may be coupled with the secondary electrode 605 through a relay 607 which will allow the secondary electrode 605 to also be grounded during other operational modes, such as during an ion milling operation, although the secondary electrode 605 may also be left floating if the first showerhead 625 is powered.

A second feed gas source, such as nitrogen trifluoride, and a hydrogen source, such as ammonia, may be delivered from gas distribution system 690, and coupled to the gas inlet 676 such as via dashed line 624. In this mode, the second feed gas may flow through the second showerhead 610 and may be energized in the second chamber region 681. Reactive species may then pass into the first chamber region 684 to react with the substrate 602. As further illustrated, for embodiments where the first showerhead 625 is a dual-channel showerhead, one or more feed gases may be provided to react with the reactive species generated by the second plasma 692. In one such embodiment, a water source may be coupled to the plurality of apertures 683.

In an embodiment, the chuck 650 may be movable along the distance H2 in a direction normal to the first showerhead 625. The chuck 650 may be on an actuated mechanism surrounded by a bellows 655, or the like, to allow the chuck 650 to move closer to or farther away from the first showerhead 625 as a means of controlling heat transfer between the chuck 650 and the first showerhead 625, which may be at an elevated temperature of 80° C.-150° C., or more. As such, an etch process may be implemented by moving the chuck 650 between first and second predetermined positions relative to the first showerhead 625. Alternatively, the chuck 650 may include a lifter 651 to elevate the substrate 602 off a top surface of the chuck 650 by distance H1 to control heating by the first showerhead 625 during the etch process. In other embodiments, where the etch process is performed at a fixed temperature such as about 90-110° C. for example, chuck displacement mechanisms may be avoided. A system controller, such as discussed below with respect to FIG. 21, may alternately energize the first and second plasmas 670 and 692 during the etching process by alternately powering the first and second RF coupled electrode pairs automatically.

The chamber 600 may also be reconfigured to perform a deposition operation. A plasma 692 may be generated in the second chamber region 681 by an RF discharge which may be implemented in any of the manners described for the second plasma 692. Where the first showerhead 625 is powered to generate the plasma 692 during a deposition, the first showerhead 625 may be isolated from a grounded chamber wall 640 by a dielectric spacer 630 so as to be electrically floating relative to the chamber wall. In the exemplary embodiment, an oxidizer feed gas source, such as molecular oxygen, may be delivered from gas distribution system 690, and coupled to the gas inlet 676. In embodiments where the first showerhead 625 is a dual-channel showerhead, any silicon-containing precursor, such as OMCTS may be delivered from gas distribution system 690, and coupled into the first chamber region 684 to react with reactive species passing through the first showerhead 625 from the plasma 692. Alternatively the silicon-containing precursor may also be flowed through the gas inlet 676 along with the oxidizer.

Chamber 600 may be used for a number of etching and deposition processes, for example. Additional examples of etching and deposition processes and chambers that may be used in conjunction with the disclosed technology and chamber 600 are described in co-assigned application Ser. No. 13/651,074 titled "Process chamber for Etching Low K and Other Dielectric Films," and filed Oct. 12, 2012, the entire contents of which are hereby incorporated by reference for all purposes not inconsistent with the present disclosure.

Figure 7:
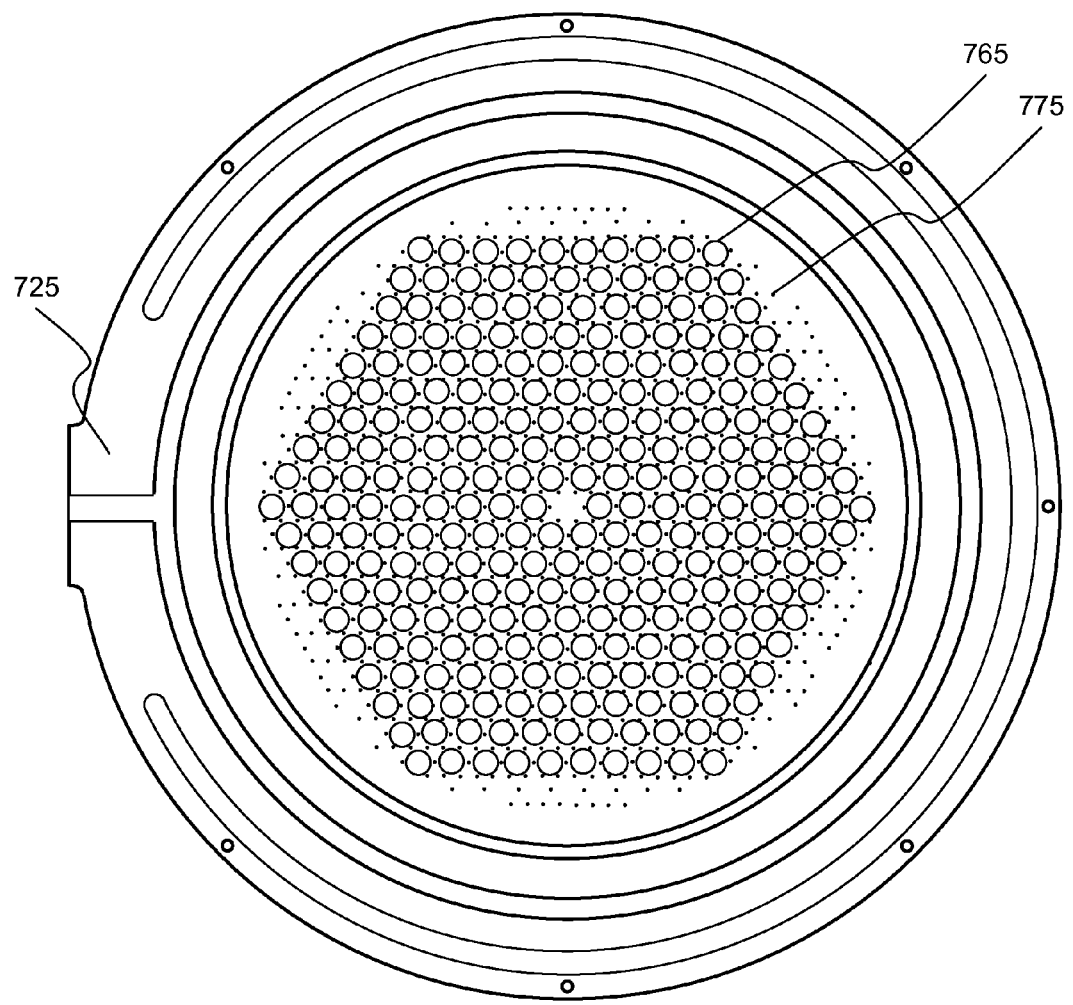
FIG. 7 shows a bottom plan view of a showerhead according to the disclosed technology.

FIG. 7 shows a bottom plan view of a showerhead according to the disclosed technology. Showerhead 725 may correspond with the showerhead 353 shown in FIG. 3, showerhead 425 shown in FIG. 4A, or showerhead 625 shown in FIG. 6. Through-holes 765, which show a view of first fluid channels 419 for example, may have a plurality of shapes and configurations in order to control and affect the flow of precursors through the showerhead 725. For example, the apertures may make any geometrical pattern in their arrangement as may affect fluid distribution, and may be distributed as rings of apertures located concentrically outward from each other and based on a centrally located position on the plate. As one example, and without limiting the scope of the technology, FIG. 7 shows a pattern formed by the apertures that includes concentric hexagonal rings extending outwardly from the center. Each outwardly located ring may have the same number, more, or less apertures than the preceding ring located inwardly. In one example, each concentric ring may have an additional number of apertures based on the geometric shape of each ring. In the example of a six-sided polygon, each ring moving outwardly may have six apertures more than the ring located directly inward, with the first internal ring having six apertures. With a first ring of apertures located nearest to the center of the upper and bottom plates, the upper and bottom plates may have more than two rings, and depending on the geometric pattern of apertures used, may have between about one and about fifty rings of apertures. In one example, as shown, there may be nine hexagonal rings on the exemplary upper plate.

The concentric rings of apertures may also not have one of the concentric rings of apertures, or may have one of the rings of apertures extending outward removed from between other rings. For example with reference to FIG. 7, where an exemplary nine hexagonal rings are on the plate, the plate may instead have eight rings, but it may be ring four that is removed. In such an example, channels may not be formed where the fourth ring would otherwise be located which may redistribute the gas flow of a fluid being passed through the apertures. The rings may still also have certain apertures removed from the geometric pattern. For example again with reference to FIG. 7, a tenth hexagonal ring of apertures may be formed on the plate shown as the outermost ring. However, the ring may not include apertures that would form the vertices of the hexagonal pattern, or other apertures within the ring. Small holes 775, which show a view of second fluid channels 421 for example, may be distributed substantially evenly over the surface of the showerhead, even amongst the through-holes 765, which may help to provide more even mixing of the precursors as they exit the showerhead than other configurations.

Figure 8:
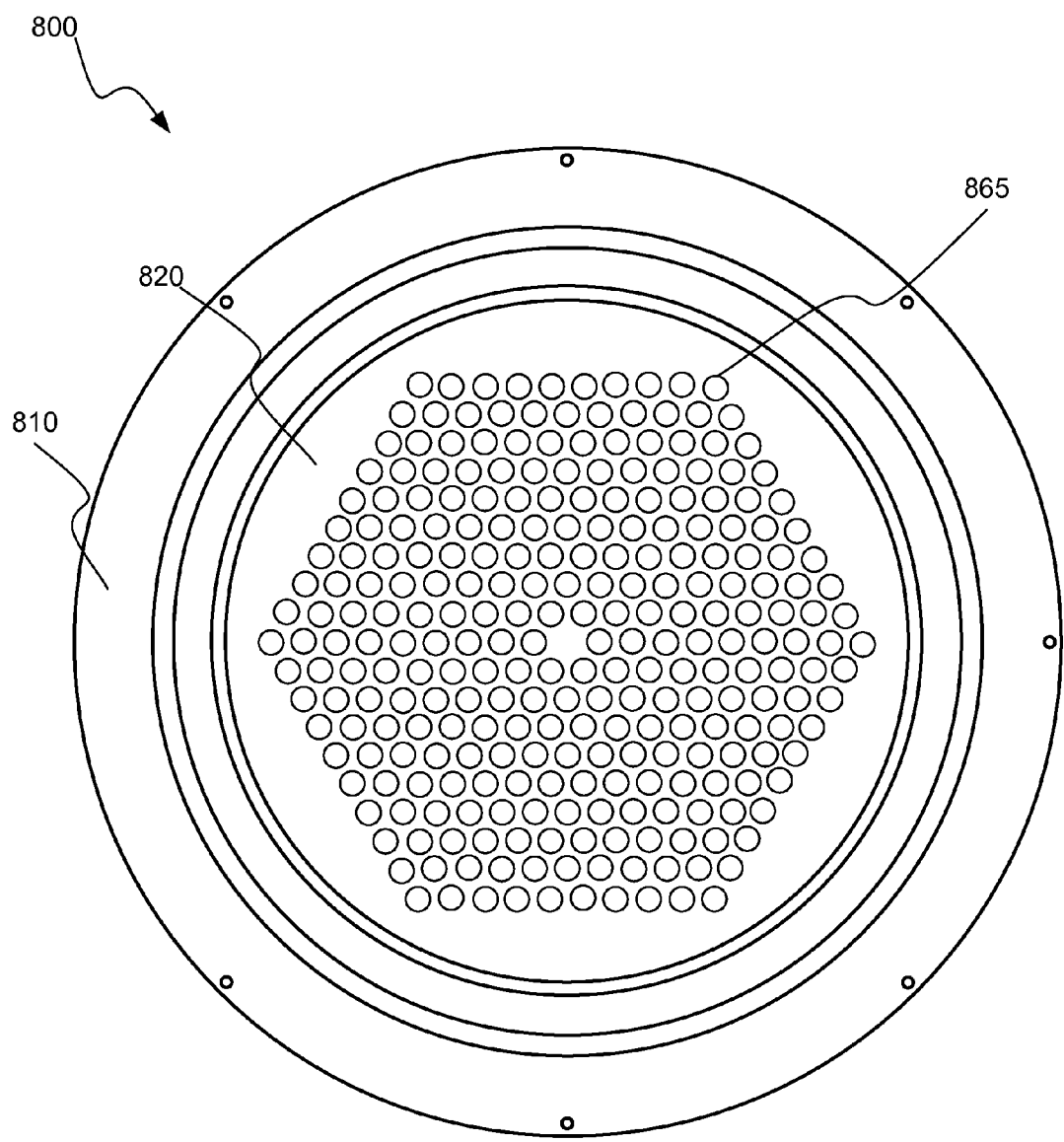
FIG. 8 shows a bottom plan view of another showerhead according to the disclosed technology.

An alternative arrangement for a showerhead or faceplate according to disclosed embodiments is illustrated in FIG. 8, which shows a bottom plan view of another showerhead according to the disclosed technology. As shown, the showerhead 800 may comprise a perforated plate or manifold. The assembly of the showerhead may be similar to the showerhead as shown in FIG. 7, or may include a design configured specifically for distribution patterns of precursor gases. Showerhead 800 may include an annular frame 810 positioned in various arrangements within an exemplary processing chamber, such as one or more arrangements as shown in FIGS. 3, 4, 5, 6, 7, 12, and/or 13. On or within the frame may be coupled a plate 820, which may be similar in disclosed embodiments to plate 720 as previously described. The plate may have a disc shape and be seated on or within the frame 810. The plate may be of a variety of thicknesses, and may include a plurality of apertures 865 defined within the plate. An exemplary arrangement as shown in FIG. 8 may include a pattern as previously described with reference to the arrangement in FIG. 7, and may include a series of rings of apertures in a geometric pattern, such as a hexagon as shown. As would be understood, the pattern illustrated is exemplary and it is to be understood that a variety of patterns, hole arrangements, and hole spacing are encompassed in the design. Alternatively, showerhead 800 may be a single plate design and compose a single-piece construction.

Figure 9:
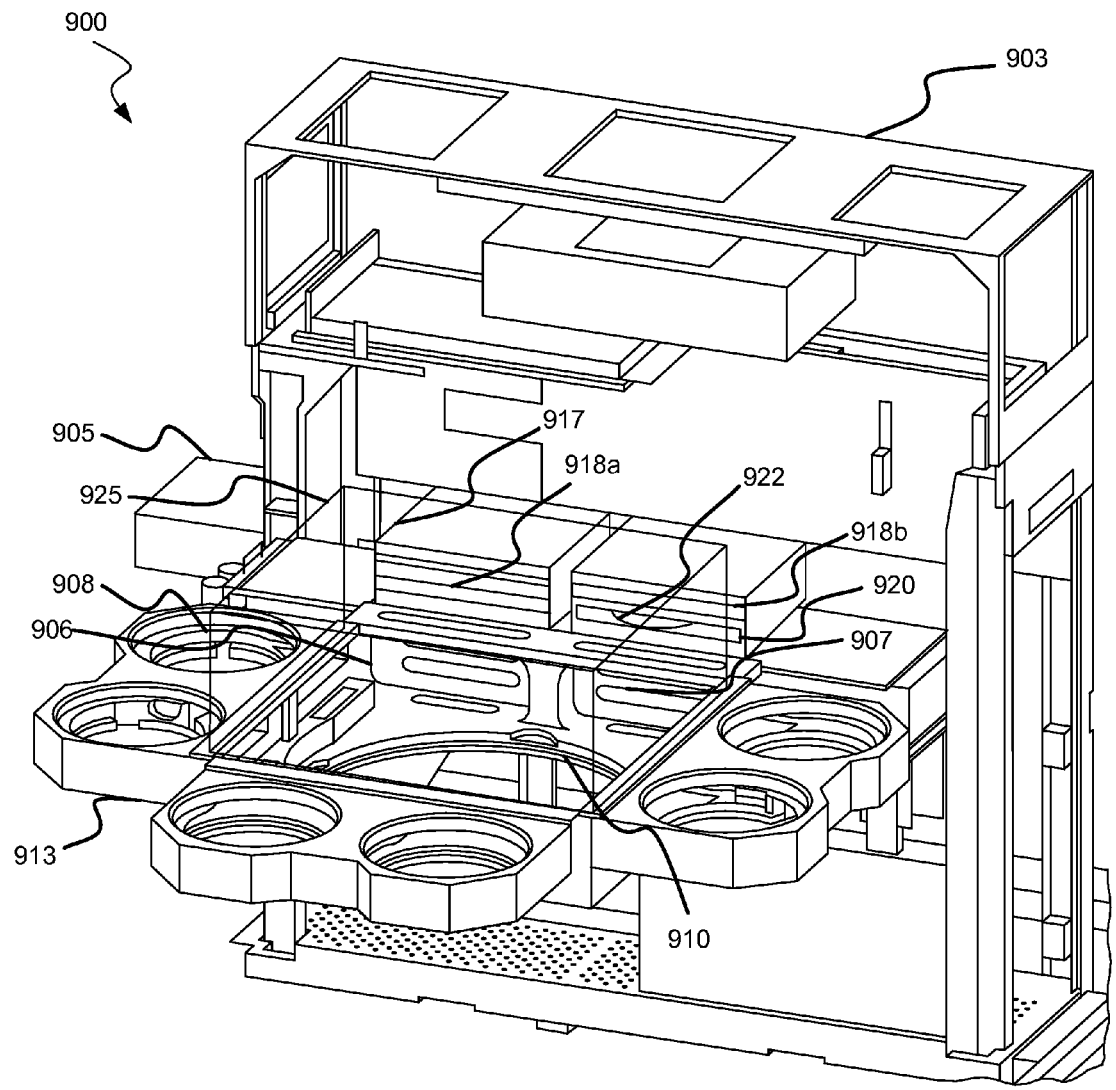
FIG. 9 shows a rear perspective view of an exemplary processing system according to the disclosed technology.

FIG. 9 shows a rear perspective view of an exemplary processing system 900 according to the disclosed technology. System 900 may include an alternate view of the system 100A of FIG. 1A, from the clean room or vacuum side of the interface. As shown in the illustration, interface 903 may be accessed by loading chambers 906 that may be configured to provide access to an evacuated environment for processing through sealable opening 907, which may be a slit valve. Additionally, a side chamber 905 may be located on the side of interface 903. Although not shown, an additional side chamber may be positioned on the side of the interface opposite chamber 905. Both side chambers may be accessed through the factory interface 903 as previously described. System body 913 may define the positions at which the processing chambers 908, loading chambers 906, and transfer station 910 are located. A variety of processing chambers 908 may be incorporated into system 900, and may include a combination of the processing stations as previously described with respect to FIGS. 3-6. In disclosed embodiments, the system may include a plurality of processing chambers.

FIG. 9 additionally shows treatment processing stations 917 coupled with and disposed vertically with respect to loading chamber 906. As will be described in more detail below with respect to FIG. 13, the system 900 may include a plurality of treatment processing stations 917 that may be coupled with and positioned in vertical alignment to respective loading stations 906 via system body 913 and be in vertical alignment with the loading chambers 906. As illustrated, the system may include two loading chambers disposed horizontally from one another and two treatment chambers coupled with and above each respective loading chamber 906. The system body 913 may provide the structural support for chambers 908 and maintain them under stable conditions to be utilized in the vacuum or clean environment. Accordingly, treatment processing stations 917 may occupy a different surface plane from the processing chamber 908. Processing chambers 917 may include sealable openings that may be accessible from the transfer station 910. The openings may be sealed by slit valves 918 or other covering mechanisms, for example, that when opened as shown by cover 918b provide access to a treatment volume 920 of the chamber and a pedestal 922 or platform on which a wafer may be disposed. In order to maintain a substrate in a clean or vacuum environment, the transfer station may be configured to provide access to the treatment processing stations 917 without breaking vacuum environment.

For example, a robot arm (not shown) such as arm 111 as shown in FIG. 1A may be operable to move vertically with respect to the transfer station body so as to allow wafer transfer between or among both lower loading stations 906 and upper treatment processing chambers 917. The robot arm or process transfer device may be configured to deliver a substrate between any of the plurality of loading chambers 906 and any of the plurality of processing chambers 908 while maintaining the substrate under vacuum conditions. The process transfer device may further be configured to deliver substrates vertically to the treatment chambers 917. In one configuration, for example, a hood or covering 925 may maintain the transfer station under vacuum conditions while providing access to the upper chamber s 917. As illustrated, the loading chambers 906 and process chambers 908 may all be on a first elevational plane of the processing system 900, and the treatment chambers 917 may be on a second elevational plane of the substrate processing system that is above the first elevational plane of the substrate processing system. In this way, a wafer or substrate may be transported between the loading stations 906, processing stations 908, and vertically to the treatment stations 917, while being maintained under vacuum or purge conditions at all times according to disclosed embodiments.

Processing chambers 917 may include features useful to performing energy-based or other treatment operations on substrates such as those processed as previously described. The chamber may be configured to perform plasma treatments, such as from a remote plasma source, or may have internal or direct plasma capabilities such as from capacitively-coupled plasma, inductively-coupled plasma, microwave plasma, toroidal plasma, etc., and in such case the treatment chamber may include components configured to generate a direct plasma within the treatment chamber 917. The chamber 917 may also be configured to perform and include components configured to generate an ultraviolet light treatment with lights and or window configurations, as well as components configured for performing electron beam operations. For example, ultraviolet radiation or light at wavelengths between about 120 and about 430 nm at a power density between about 5 and about 25 mWatts/cm$^2$ may be delivered to a surface of the substrate from a radiation source contained within the processing chamber 917. The radiation from the radiation source may be supplied by a lamp containing elements such as xenon, argon, krypton, nitrogen and derivatives thereof, such as xenon chloride or argon fluoride, for example. The chambers may similarly be configured to perform ozone or other curing operations and may be configured to provide a plurality of precursors and operate at a series of conditions as described below.

Figure 10:
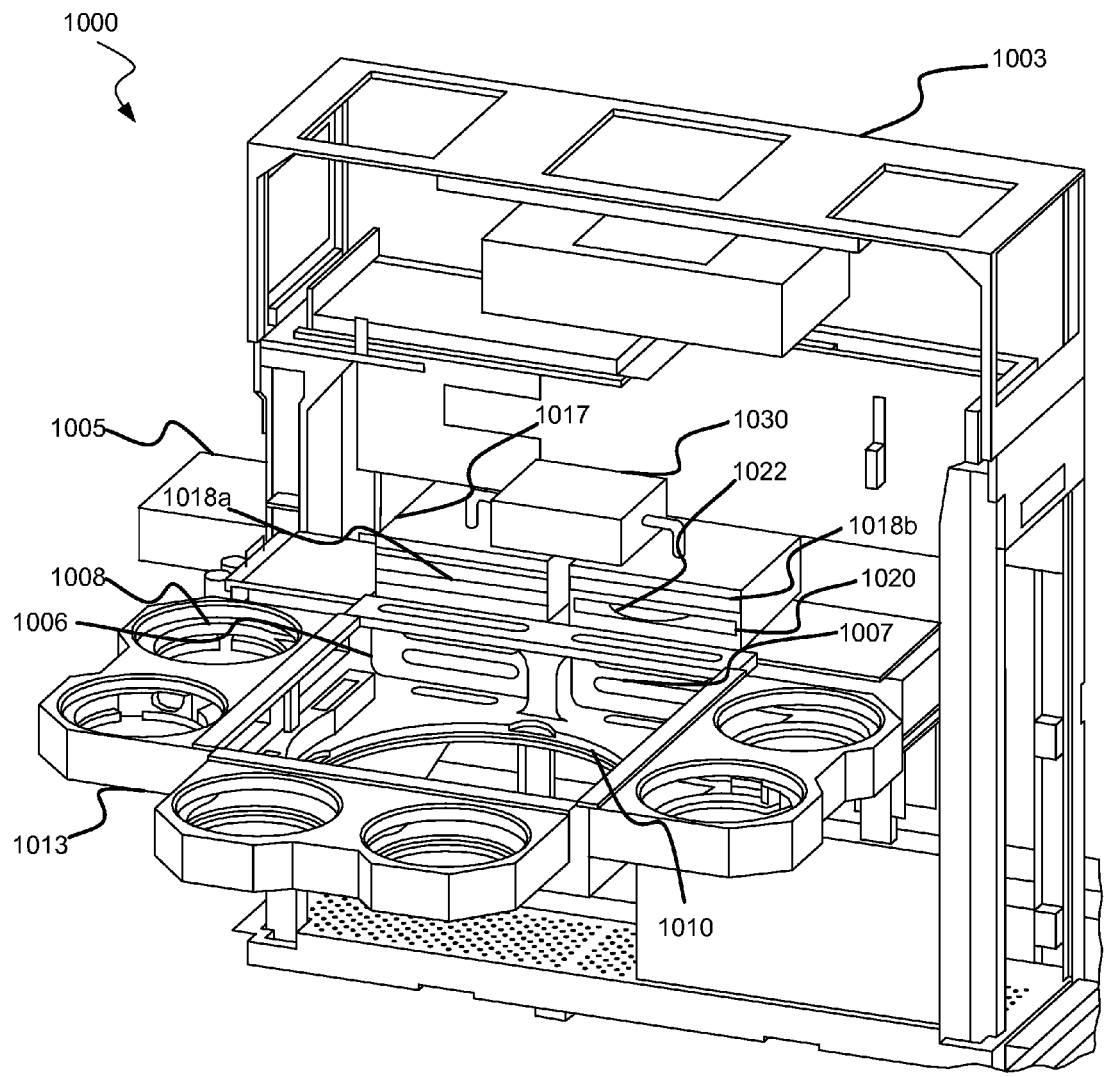
FIG. 10 shows a rear perspective view of an exemplary processing system according to the disclosed technology.

FIG. 10 shows a rear perspective view of another exemplary processing system 1000 according to the disclosed technology. System 1000 may include aspects of the system 900 of FIG. 9, in disclosed embodiments. As shown in the illustration, interface 1003 may be accessed by loading chambers 1006 that may be configured to provide access to an evacuated environment for processing through sealable opening 1007, which may be a slit valve. Additionally, a side chamber 1005 may be located on the side of interface 1003, and although not shown, an additional side chamber may be positioned on the side of the interface opposite chamber 1005. System body 1013 may define the positions at which the processing chambers 1008, loading chambers 1006, and transfer station 1010 are located. A variety of processing chambers 1008 may be incorporated into system 1000, and may include a combination of the processing stations as previously described with respect to FIGS. 3-6. FIG. 10 additionally shows treatment processing stations 1017 coupled with and disposed vertically in respect to loading chambers 1006. Processing chambers 1017 may include sealable openings that may be accessible from the transfer station 1010. The openings may be sealed by slit valves 1018 or other covering mechanisms, for example, that when opened as shown by cover 1018b provide access to a treatment volume 1020 of the chamber and a pedestal 1022 or platform on which a wafer may be disposed.

As illustrated in FIG. 10, a distribution unit 1030, such as a treatment plasma generating device, may be disposed above and coupled with both treatment processing chambers 1017. In disclosed embodiments, the plasma device may be separate from and coupled with both of the treatment chambers as shown. In one embodiment, the distribution unit 1030 comprises a remote plasma unit ("RPS") that is coupled from side outlets to both treatment processing chambers 1017. Accordingly, plasma generated effluents may be dispersed to both treatment processing chambers 1017 simultaneously. The distribution unit may be configured to include internal diffusers to ensure symmetrical distribution of precursors or plasma species is being delivered to each treatment processing chamber 1017, in order to maintain uniform processing between the chambers.

Figure 11:
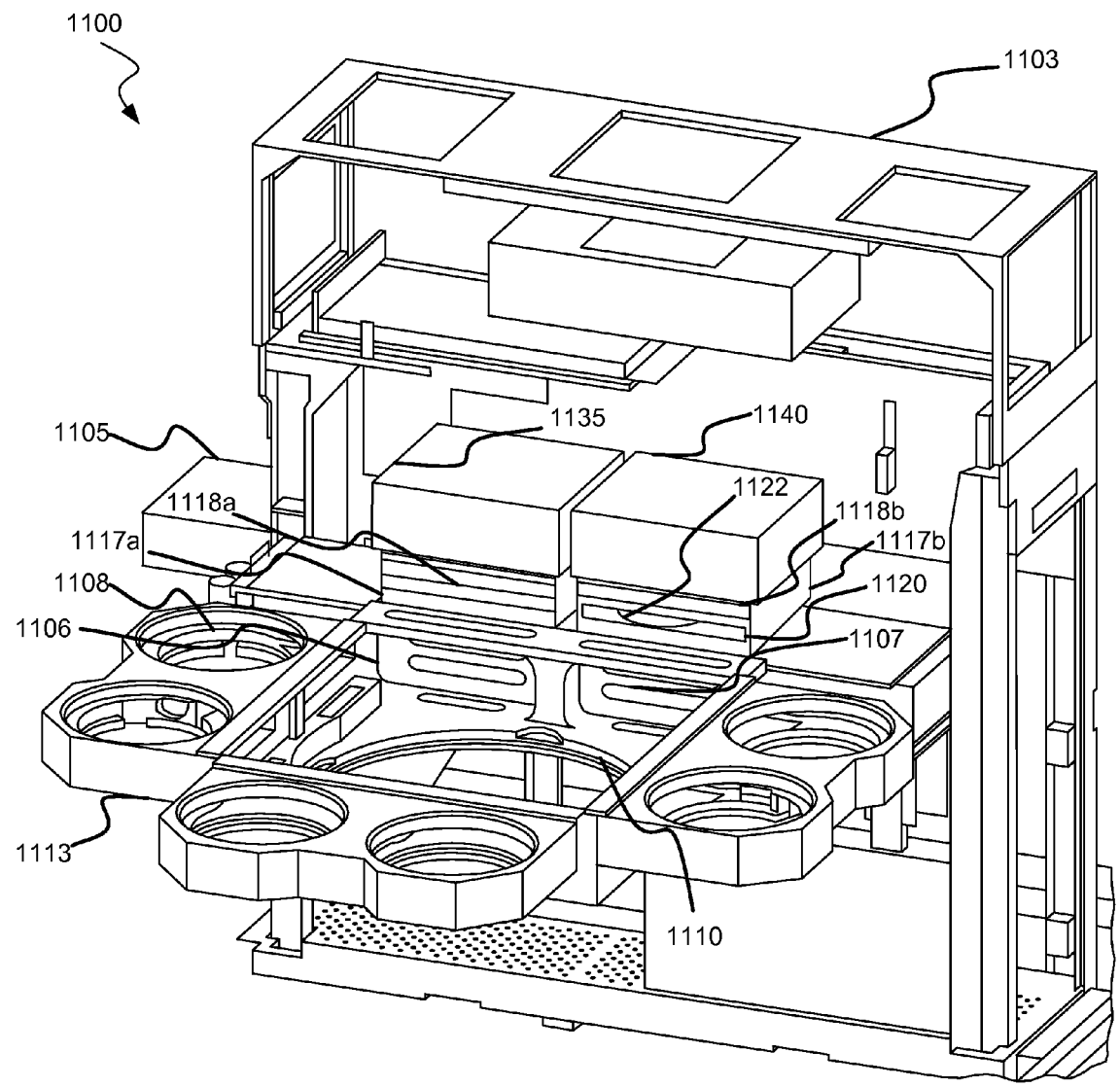
FIG. 11 shows a rear perspective view of an exemplary processing system according to the disclosed technology.

FIG. 11 shows a rear perspective view of another exemplary processing system 1100 according to the disclosed technology. System 1100 may include aspects of the system 900 of FIG. 9, in disclosed embodiments. As shown in the illustration, interface 1103 may be accessed by loading chambers 1106 that may be configured to provide access to an evacuated environment for processing through sealable opening 1107, which may be a slit valve. Additionally, a side chamber 1105 may be located on the side of interface 1103, and although not shown, an additional side chamber may be positioned on the side of the interface opposite chamber 1105. System body 1113 may define the positions at which the processing chambers 1108, loading chambers 1106, and transfer station 1110 are located. A variety of processing chambers 1108 may be incorporated into system 1100, and may include a combination of the processing stations as previously described with respect to FIGS. 3-6. FIG. 11 additionally shows treatment processing stations 1117 coupled with and disposed vertically in respect to loading chambers 1106. Processing chambers 1117 may include sealable openings that may be accessible from the transfer station 1110. The openings may be sealed by slit valves 1118 or other covering mechanisms, for example, that when opened as shown by cover 1118b provide access to a treatment volume 1120 of the chamber and a pedestal 1122 or platform on which a wafer may be disposed.

As illustrated in FIG. 11, processing units 1135, 1140 may be coupled individually with each treatment processing chamber 1117a, 1117b respectively. Processing units 1135, 1140 may be configured to initiate or provide material for multiple operations to be performed in the treatment processing chambers 1117, and may be similar to distribution unit 1030 as described with respect to FIG. 10. For example, processing units 1135, 1140 may both be treatment plasma generating devices, where one of the processing units may be coupled with one of the treatment chambers, and a second of the processing units may be coupled with a second of the treatment chambers. The processing units may include remote plasma capabilities, and as such may be configured to perform separate plasma-based operations in each of the respective treatment processing chambers 1117. Alternatively, the processing units 1135, 1140 may be operated in a similar fashion.

Figure 12A:
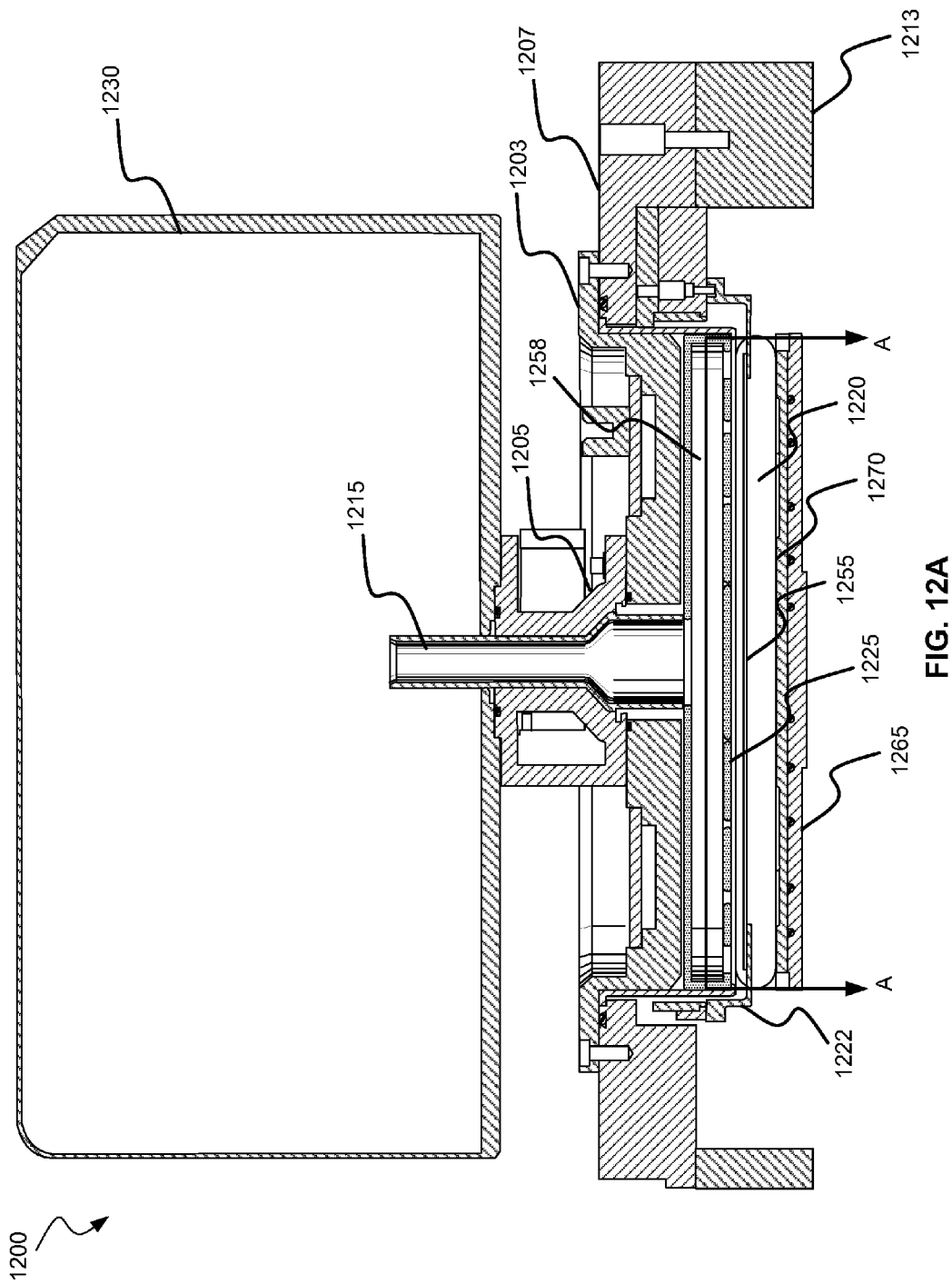
FIG. 12A shows an exemplary processing chamber coupleable with a loading chamber according to the disclosed technology.

FIG. 12A shows an exemplary processing or treatment chamber 1200 coupleable with a loading chamber according to the disclosed technology. The chamber 1200 may be coupled in any of the previously shown embodiments with a loading chamber. The chamber 1200 may be configured to perform a treatment, scavenging, or etching operation as described in detail below, and may be configured to provide energized species to interact with a processed wafer, that may be contaminated with residual halides, for example. A top cover 1203 may be coupled with additional materials or directly to the system frame 1213, which may be similar to previously described system bodies such as system body 913, for example. Additional support members 1207 may be utilized to stabilize or share load from the chamber 1200. The top cover 1203 may additionally hold an inlet fluid assembly 1205 configured to deliver precursors, plasma effluents, energy treatments, etc. from energy production unit or distribution unit 1230. The distribution unit 1230 may be coupled with the inlet gas assembly, which may further include bypass access for additional fluids to be delivered into a distribution region 1258 of the treatment chamber 1200. The distribution unit 1230 may provide a radical species in disclosed embodiments, and may be configured as an RPS unit such as previously described to provide plasma effluents or radical species into the treatment chamber 1200.

The inlet assembly 1205 may include a direct coupling 1215 between the distribution unit 1230 and the treatment chamber 1200. For example, the direct coupling 1215 may be configured to provide initial flow of any provided precursors such that the precursors may distribute more uniformly through the chamber 1200. For example, the direct coupling 1215 may include an upper portion and a lower portion of the coupling, and the lower coupling may have a diameter greater than the diameter of the upper portion of the coupling 1215. As illustrated, a relatively short transition may be provided between the upper portion and the lower portion, or alternatively a continuous transition may be utilized producing a conical shape for the coupling 1215. The direct coupling 1215 may include characteristics configured to provide turbulence for provided fluids, and the characteristics may include fluting such as spiral fluting defined along the length of the coupling 1215. Alternatively, rifling or other curvature may be applied along the length of the coupling 1215 in disclosed embodiments. The coupling 1215 or aspects of inlet fluid assembly 1205 may be lined, treated, or formed of materials designed to prevent corrosion or interaction with species delivered through the inlet assembly. For example, the direct coupling 1215 may be made of or be lined with quartz, for example.

The gas inlet assembly 1205, with or without direct coupling 1215, may direct a precursor into distribution region 1258 for distribution into treatment region or processing region 1220. The distribution region 1258 may be at least partially defined from above by one or more of direct coupling 1215, fluid inlet assembly 1205, and top cover 1203. The distribution region may be at least partially defined from below by showerhead 1225, which may be configured to distribute a precursor into processing region 1220. The showerhead 1225 may have several configurations such as exemplary showerhead configurations illustrated in FIGS. 7-8, and may additionally have configurations such as those as will be described below with FIGS. 12B-12C. Showerhead 1225 may be made of a variety of materials including quartz, ceramic, or other dielectric materials. The showerhead may be configured to uniformly distribute a precursor, such as a radical precursor to processing region 1220 where it may interact with a substrate 1255 disposed therein. The substrate 1255 may be supported, held, or suspended as illustrated in processing region 1220. For example, support member 1222 or a support device may be configured to support substrate 1255 along an edge region and suspend the substrate within the processing region 1220. Support member 1222 may include a plurality of ledges disposed along a portion of the support member 1207 or top cover 1203, and may include 2, 3, 4, 5, 6, etc. or more ledges disposed around the chamber 1200. The support members may not be disposed fully throughout the chamber 1200, as the wafer may be delivered to the chamber through a slit valve as previously described on a transfer device such as a robot arm. The transfer device may position a substrate on the support member or members 1222 to be suspended during processing. Processing region 1220 may be at least partially defined from below by a lower portion of the chamber housing 1265, which may be coupled with a loading chamber or system frame in disclosed embodiments. The lower portion 1265 of the chamber housing may include a temperature control device 1270 such as a heating plate disposed within the processing region 1220 to regulate the processing region temperature.

Figure 12B:
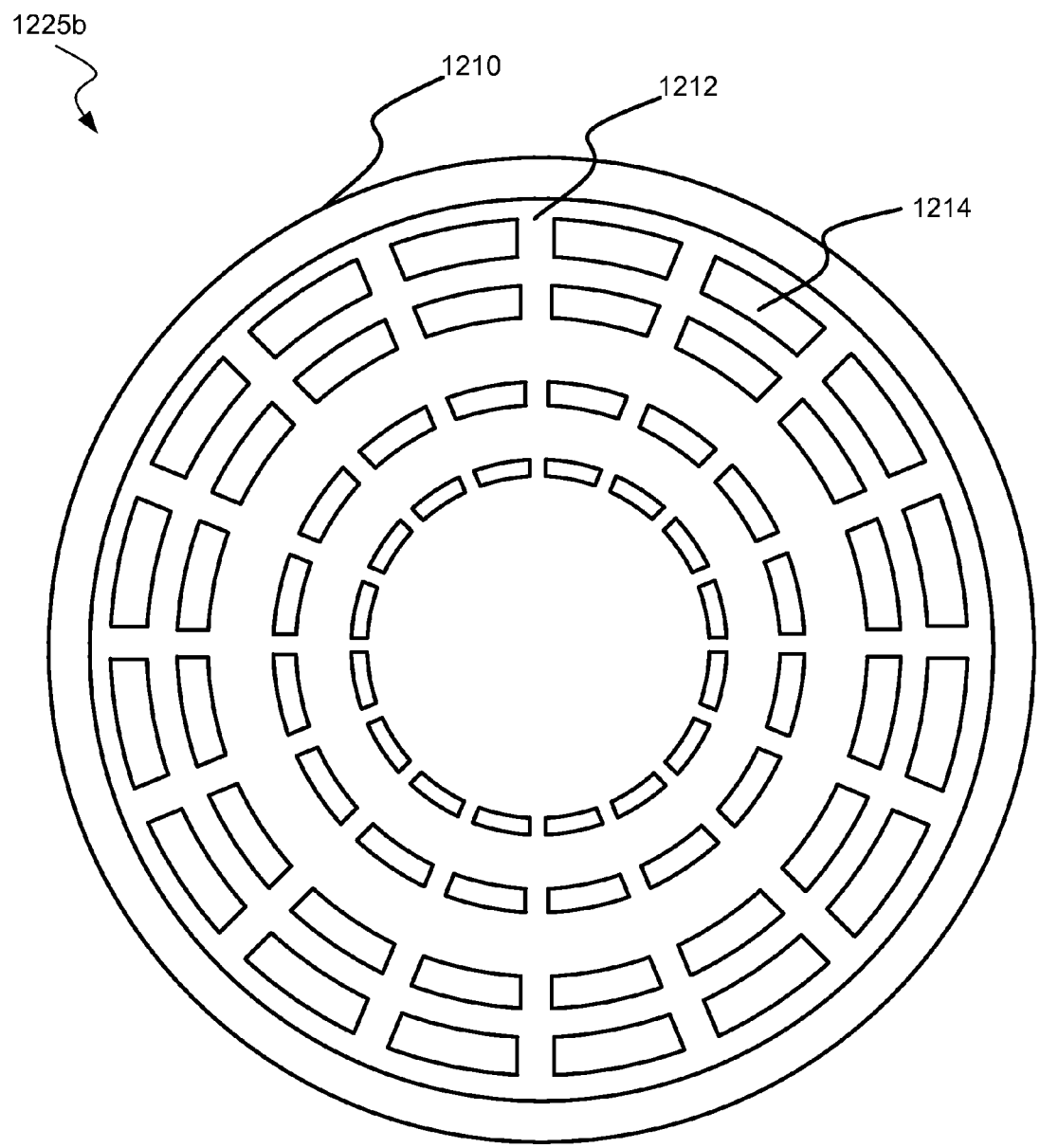
FIG. 12B shows a plan view of a cross-sectional portion of the processing chamber illustrated in FIG. 12A along line A-A.
Figure 13:
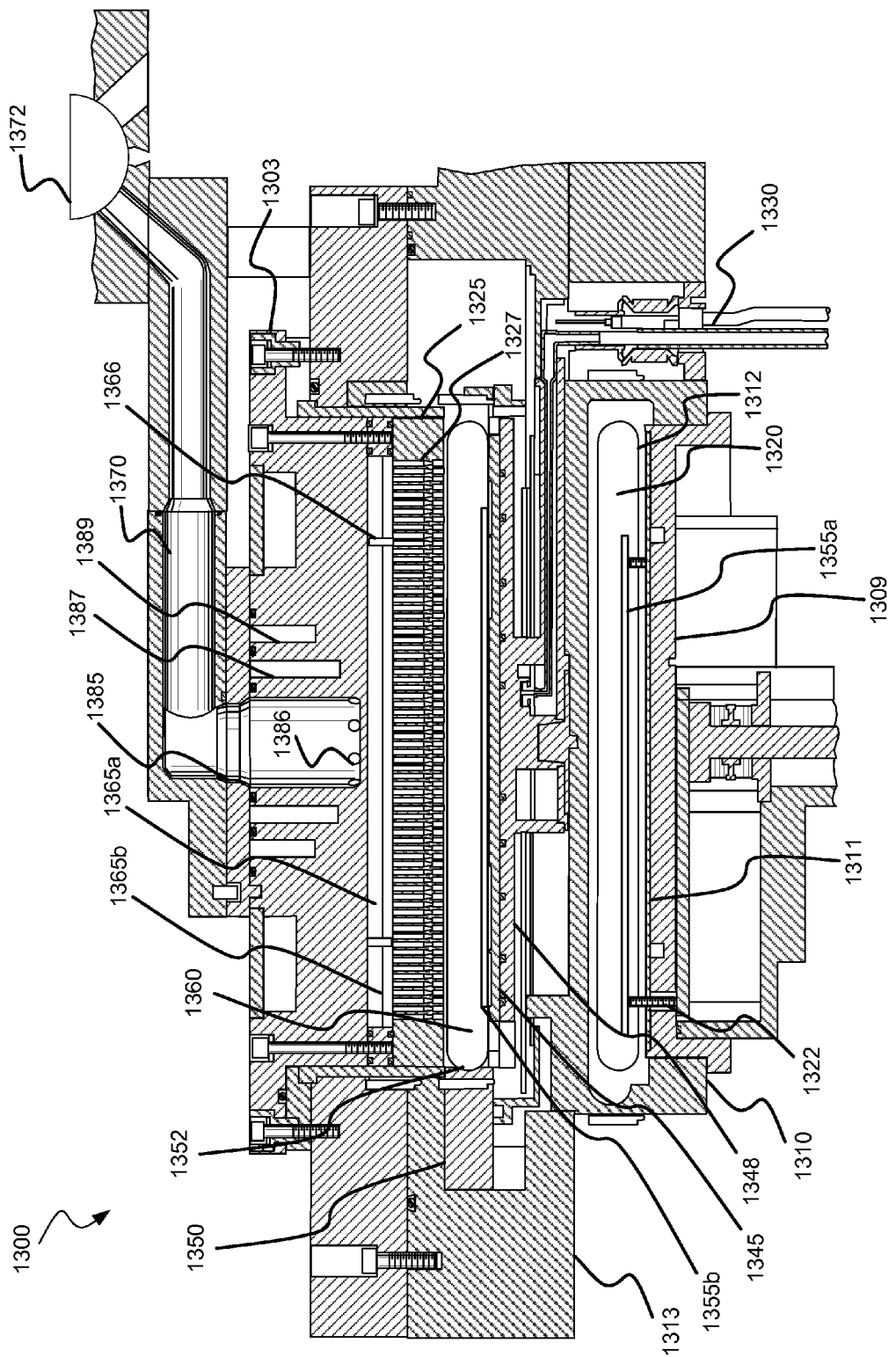
FIG. 13 shows an exemplary combination processing and loading chamber according to the disclosed technology.

FIG. 12B illustrates a top plan view of a portion of chamber 1200 along line A-A as illustrated in FIG. 12A. As shown, the showerhead 1225*b* may be a perforated plate or manifold. The assembly of the showerhead may be similar to the showerhead as shown in FIG. 8, or may include a design configured specifically for distribution patterns within a confined processing space. For example, treatment chambers such as illustrated in FIGS. 12A and 13 may have vertical dimensions less than other processing chambers as previously described because of the positioning above the loading chambers. As such, particular distribution patterns may be used to enhance distribution such that uniform processing operations may be performed. Showerhead 1225*b* may include an annular frame 1210 positioned in various arrangements in chamber 1200. On or within the frame 1210 may be coupled plate 1212, which may have a disc shape and be seated on or within the frame 1210. In disclosed embodiments the showerhead 1225*b* may be a single-piece design, and may be made of a dielectric material such as quartz, for example. The plate may be of a variety of thicknesses, and may have an exterior portion 1210 thicker than an interior portion 1212, or vice versa.

The plate may include a plurality of apertures 1214 defined through the plate 1212 that may be configured to distribute a precursor, such as a radical species through the showerhead 1225*b*. An exemplary arrangement as shown in FIG. 12B may include a series of rings of apertures 1214 as shown. As would be understood, the pattern illustrated is exemplary and it is to be understood that a variety of patterns, hole arrangements, and hole spacing are encompassed in the design. For example, an interior portion of the plate may be devoid of apertures 1214, and apertures may not be formed in a region extending from a center point of the showerhead 1225*b*. Based on the radial length of the showerhead, the showerhead may include no apertures 1214 about the interior portion of the showerhead extending at least from the center point of the showerhead to an area defined within at least 10% of the radial length of the showerhead. No apertures may additionally be included within an interior portion 1014 of the showerhead extending from the center point of the showerhead to an area defined within at least about 15%, 20%, 25%, 30%, 35%, 40%, 45%, 50%, 60%, etc. or more. The apertures 1214 may be sized in order to preferentially distribute a precursor, or restrict access through a portion of the showerhead 1225b. For example, from a center point of the showerhead 1225, the first apertures may be of an area smaller than apertures disposed radially outward from the center. As shown, the apertures 1214 may be of increasing dimensions extending outward from the center. Such a configuration may provide beneficial distribution, because precursors delivered from a central region of the chamber will be less restricted at the edge regions of the plate, which may enhance flow outward toward the edge region.

Figure 12C:
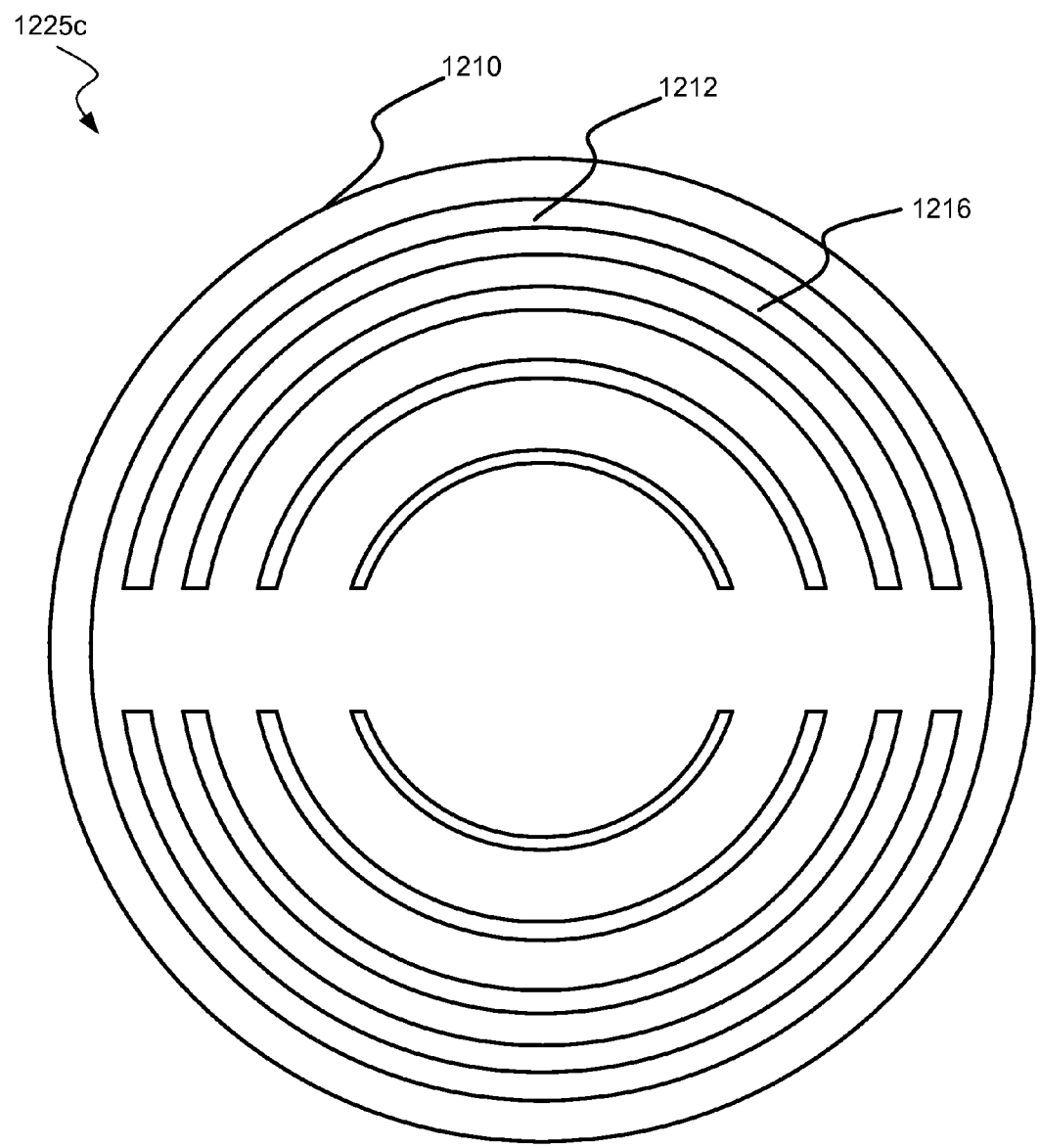
FIG. 12C shows another plan view of a cross-sectional portion of the processing chamber illustrated in FIG. 12A along line A-A.

FIG. 12C illustrates an additional top plan view of a portion of chamber 1200 along line A-A as illustrated in FIG. 12A. As shown, the showerhead 1225c may be a perforated plate or manifold. The assembly of the showerhead may be similar to the showerhead as shown in FIG. 8 or 12B, or may include a design configured specifically for distribution patterns within a confined processing space. Showerhead 1225c may include an annular frame 1210 positioned in various arrangements in chamber 1200. On or within the frame 1210 may be coupled plate 1212, which may have a disc shape and be seated on or within the frame 1210. In disclosed embodiments the showerhead 1225b may be a single-piece design, and may be made of a dielectric material such as quartz, for example. The plate may be of a variety of thicknesses, and may have an exterior portion 1210 thicker than an interior portion 1212, or vice versa. Showerhead 1225c may have a plurality of channels defined through the plate that may have a similar arrangement or dimensioning characteristic as the apertures of plate 1225b. For example, the channels 1216 may be of increasing dimensions extending outward from the center, which may enhance precursor flow outward towards the edge regions, which may provide more uniform flow. Various other arrangements and configurations as would be understood from these examples are similarly encompassed in the disclosed technology.

FIG. 13 shows another exemplary processing chamber coupleable with a loading chamber according to the disclosed technology. As shown, combination processing chamber 1300 is shown having a substrate loading section and a substrate processing section disposed above and vertically aligned with the loading section. Combination chamber 1300 may include a lower chamber housing 1310, having one or more plates or components, that includes a first access 1312 configured to provide access to a vacuum, inert, or clean atmosphere such as on the processing side or clean room side of a system. The lower chamber housing 1310 may also include a second access (not shown) on a second side of the lower chamber housing opposite the first side of the lower chamber housing. An example structure illustrating both access ports may be seen in FIG. 1A, where loading chambers 106 include access slots on both the interface side 103 and transfer chamber side. The combination chamber 1300 may additionally include an upper chamber housing 1350, having one or more plates or components, coupled with the lower chamber housing. The upper chamber housing and lower chamber housing may be coupled directly, or may also be disposed in vertical alignment within a system frame 1313, such as a system body as previously discussed. The upper chamber housing 1350 may include a third access 1352 on a first side of the upper chamber housing 1350, and the first side of the upper chamber housing may coincide with the first side of the lower chamber housing. The upper chamber housing may also include an upper processing region 1360 at least partially defined from above by a faceplate 1325 disposed within the upper chamber housing 1350.

Lower chamber housing 1310 may be configured for loading operations and certain treatment operations in disclosed embodiments. Lower chamber housing 1310 may define a lower substrate region 1320 in which a substrate 1355a may be disposed. The substrate may be positioned on a bottom portion 1309 of the lower chamber housing 1310. Lift pins 1322 may be used to raise a substrate 1355a such that a transfer device such as a robot blade may be used to retrieve the substrate. The lower substrate region may be at least partially defined from below by the bottom portion 1309 of the lower chamber housing 1310, and a temperature control device such as a heating mechanism 1311 may be disposed on or as part of the bottom portion 1309 of the lower chamber housing 1310. Such a heater may be operable to or configured to raise the temperature of the lower substrate region 1320 and/or a substrate 1355a disposed therein. For example, the heater may be configured to raise the temperature of a substrate, either directly or indirectly, up to about 150° C. or more. The heater may additionally be configured to raise the temperature above about 150° C., 200° C., 250° C., 300° C., 350° C., 400° C., 450° C., 500° C., etc. or more in disclosed embodiments.

Because the lower substrate region may routinely receive substrates from atmospheric conditions and transfer them to vacuum conditions, the lower substrate region 1320 may include components for and be configured to be evacuated from atmospheric pressure to a second pressure below atmospheric pressure. Depending on the operations being performed in the process chambers, the evacuated pressure may be below a designated atmospheric pressure or location-based atmospheric pressure. The lower substrate region 1320 may be configured to be evacuated below about 760 Torr or less in embodiments, and may be configured to be evacuated below or about 700 Torr, 600 Torr, 500 Torr, 400 Torr, 300 Torr, 200 Torr, 100 Torr, 50 Torr, 40 Torr, 30 Torr, 20 Torr, 10 Torr, 9 Torr, 8 Torr, 7 Torr, 6 Torr, 5 Torr, 4 Torr, 3 Torr, 2 Torr, 1 Torr, 100 mTorr, 50 mTorr, 30 mTorr, 20 mTorr, 10 mTorr, 5 mTorr, etc., or less in disclosed embodiments.

Evacuating and re-pressurizing the lower substrate region 1320 may enact a stress upon the lower chamber housing 1310. The process may be performed several times up to hundreds of times per day or more. Accordingly, the lower chamber housing 1310 may be configured to structurally support pressure cycling within the chamber. The housing 1310 may be reinforced, made of pressure-resistant materials or slightly flexible materials, or otherwise capable of withstanding the enacted stress better than a single metal housing, for example. In disclosed embodiments, the lower chamber housing may be configured to structurally support pressure cycling from atmospheric pressure to less than or about 5 mTorr and back to atmospheric pressure every hour. The chamber housing 1310 may also be configured to support such pressure cycling every half-our, 20 minutes, 15 minutes, 10 minutes, 5 minutes, 2 minutes, 1 minute, etc. or less. The lower substrate region 1320 may also include access ports (not shown) through which an inert fluid may be flowed. For example, prior to receiving a substrate from the factory interface side or the second access in the lower chamber housing, the loading chamber may be pressurized with nitrogen or another fluid to maintain an inert environment or a moisture-free environment. Alternatively, after a substrate has been processed and returned to the loading chamber for re-pressurization prior to transfer, the loading chamber 1320 may be purged and/or pressurized with nitrogen or an inert fluid to prepare a moisture-free environment.

The upper chamber housing 1350 may be coupled directly with the lower chamber housing 1310, or indirectly coupled, with a bottom region or lower portion 1348 of the upper chamber housing 1350. The bottom region 1348 of the upper chamber housing 1350 may additionally include a temperature control device such as a heating plate 1345 in disclosed embodiments that may at least partially define the upper processing region 1360 from below. The temperature control device 1345 may be configured to maintain the temperature of a substrate 1355*b* disposed thereon between about 0° C. and about 800° C. in disclosed embodiments. The temperature control device 1345 may additionally be configured to maintain the temperature up to, above, or about 0° C., 10° C., 20° C., 30° C., 40° C., 50° C., 75° C., 100° C., 125° C., 150° C., 200° C., 250° C., 300° C., 350° C., 400° C., 450° C., 500° C., 550° C., 600° C., etc. or more in disclosed embodiments The substrate may be supported directly on the temperature control device 1345 as shown, or may be disposed on a substrate support device such as previously described with chamber 1200 of FIG. 12, where the substrate support device is configured to support a substrate along an edge region and suspend the substrate within the upper processing region 1360.

The temperature control device 1345 may be coupled with an exterior source 1330 disposed along a side of the lower chamber housing 1310, for example, based on the coupling of the upper chamber housing 1350 and lower chamber housing 1310. A resistive heating element may be disposed in the bottom region 1348 of the upper chamber portion 1350, and may receive power from exterior source 1330. In disclosed embodiments fluid channels may be defined in the bottom region 1348 of the upper chamber housing 1350, or between the upper chamber housing 1350 and the lower chamber housing 1348, and a temperature controlled fluid may be flowed through the channels to control the temperature within the upper processing region 1360. The fluid channels may further be defined radially outward toward the exterior source 1330 that may be configured to provide the temperature control fluid to be directed through the fluid channels.

A chamber top cover or an upper portion of the upper chamber housing 1303 may at least partially define an upper distribution region 1365 from above along with the faceplate 1325 that may at least partially define the upper distribution region 1365 from below. Further, a remote plasma unit (not shown) may be coupled with the upper portion of the upper chamber housing. The RPS unit may be coupled with the upper portion 1303 of the upper chamber housing 1350 via remote transport piping or coupling 1370. An additional coupling device 1372 may provide the distribution connection from the RPS device, and as shown may distribute radical species between transport piping or coupling 1370 for two treatment chambers. Such an arrangement may be similar to, but with a different coupling from system 1000 as shown in FIG. 10, with distribution unit 1030.

The upper distribution region 1365 may include a central distribution region 1365*a* and an edge distribution region 1365*b* that are separated or partitioned with partition section 1366. The edge distribution region 1365*b* may be annular in shape and be radially distal to the central distribution region 1365*a*. A fluid and/or gas inlet assembly 1385 may be positioned within the upper portion 1348 of the upper chamber housing 1350, and may be configured to deliver precursors into the upper distribution region 1365. The gas inlet assembly 1385 may be similar to the gas inlet assembly or direct coupling illustrated in FIG. 12, for example, and in disclosed embodiments may have characteristics as shown in FIG. 13. Gas inlet assembly 1385 may be at least partially characterized by a cylindrical shape, and a lower portion of the gas inlet assembly may define a plurality of gas delivery apertures 1386 radially distributed about the lower portion of the gas inlet assembly. The delivery apertures 1386 may be ports that open to a distribution region within the top cover 1303 or gas inlet assembly 1385, and may additionally provide fluid access to fluid inlet channels defined within the gas inlet assembly 1385 and/or top cover 1303. In either scenario, the arrangement may be configured to deliver a precursor, such as a radical precursor to the gas distribution region 1365. Apertures (not shown) in the gas inlet assembly may provide the fluid access to the gas distribution region 1365 and may be defined so as to provide a more uniform delivery of precursors between the central distribution region 1365*a* and the edge distribution region 1365*b*.

The gas inlet assembly 1385 may additionally include one or more bypass fluid channels configured to allow additional precursors to be delivered separate from a coupled RPS unit, for example. The assembly may include a bypass fluid channel that is configured to deliver at least one precursor around the cylindrically shaped portion of the gas inlet assembly 1385. The bypass fluid channel may include a first bypass section 1387 configured to direct the at least one precursor to the central distribution region 1365*a*. The bypass fluid channel may further include a second bypass section 1389 configured to direct the at least one precursor to the edge distribution region 1365*b*. The bypass sections 1387, 1389 may be coupled with a single precursor inlet that delivers one or more precursors to both bypass sections, or may be separately coupled with individual precursor inlets such that different flow rates, precursors, etc., may be provided to affect processing conditions, deliver uniformity, etc. For example, if a similar precursor is delivered between both bypass sections, a higher flow rate may be delivered to the second bypass section 1389 in order to provide enhanced flow along the edge region of the gas distribution region 1365*b*.

The faceplate 1325 or showerhead may comprise any of the previously described showerheads or faceplates. Additionally, the faceplate 1325, top cover 1303, temperature control device 1345, and/or bottom region 1348 of the upper chamber may be electrically or mechanically coupled with a single or multi-position switch (not shown) that is operable to connect the faceplate 1325 to an electrical power source and/or a ground source in alternate switch positions. The bottom region 1348 of the upper chamber housing 1350 may be grounded such that when the faceplate is connected to the electrical power source a plasma is produced or ignited in the upper processing region 1360. The plasma may excite one or more precursors delivered through the bypass fluid channels 1387, 1389, and through channels 1327 defined in showerhead 1325, or may maintain radical species produced in an RPS unit and delivered through gas inlet assembly 1385 and then through channels 1327. Channels 1327 may be of a variety of configurations and arrangements, and may be configured to prevent or limit plasma species from flowing back up into distribution region 1365 and/or inlet assembly 1385. The plasma may be any of the previously described plasma sources, and may include capacitively-coupled plasma, inductively-coupled plasma, microwave, toroidal, etc. in disclosed embodiments. The bottom region 1348 of the upper chamber housing 1350 may be electrically coupled with chamber components or the system frame in disclosed embodiments, and may also be electrically isolated from the rest of the upper chamber housing 1350 in disclosed embodiments. Chamber 1300 may also be configured to operate at any of the temperatures or pressures as previously described for other chamber configurations.

The chamber 1300 may also be configured as a treatment chamber including a chamber housing 1350 having a bottom portion 1348 coupled with a substrate load lock chamber 1310. The chamber 1300 may include an inlet assembly 1385 configured to receive fluids into an internal region defined within the chamber. A faceplate 1325 may be disposed within the internal region and at least partially define a distribution region from below and a processing region from above within the chamber 1300. The faceplate may comprise quartz in disclosed embodiments, or may alternatively be a conductive substance so as to be operable as an electrode in disclosed embodiments where the chamber is configured to produce a plasma in the processing region. The inlet assembly 1385 may also be lined or be made of a material such as quartz or also be coated or lined with a material configured to be inert to radical species delivered through the inlet assembly 1385.

The treatment chamber 1300 may include a separate source coupled with the inlet assembly 1385 as opposed to the RPS coupling as illustrated. The arrangement may look like previously discussed configurations including energy distribution units 1135, and 1140 from FIG. 11. For example an energy production unit may be coupled with the inlet assembly and/or the top cover 1303 of the treatment chamber. For example, radio frequency, direct current, or microwave, a subset of radio frequencies, based power discharge techniques may be used within the energy production unit to provide radical effluents to the treatment chamber. The activation may also be generated by a thermally based technique, a gas breakdown technique, a high intensity light source, or exposure to an x-ray source. Alternatively, a remote activation source may be used, such as a remote plasma generator as illustrated, to generate a plasma of reactive species which are then delivered into the chamber as previously discussed. As another example, the inlet assembly 1385 may include a window and the energy production unit may include a light source configured to provide ultraviolet light or radiation into the chamber with or without additional precursors.

The systems and chambers as described may provide numerous benefits. For example, additional operations may be performed in a single system environment that may reduce overall queue times for processing. Also, many of the operations may be performed in a moisture-free environment, which may limit or minimize halide contamination of silicon oxide surfaces or nitride surfaces leading to aging defects. The systems additionally provide several advantageous options for passivation, material removal, and contaminant scavenging operations as will be discussed along with the following processes and methods capable of being performed in one or more of the components described above.

II. Process Movement

Figure 14:
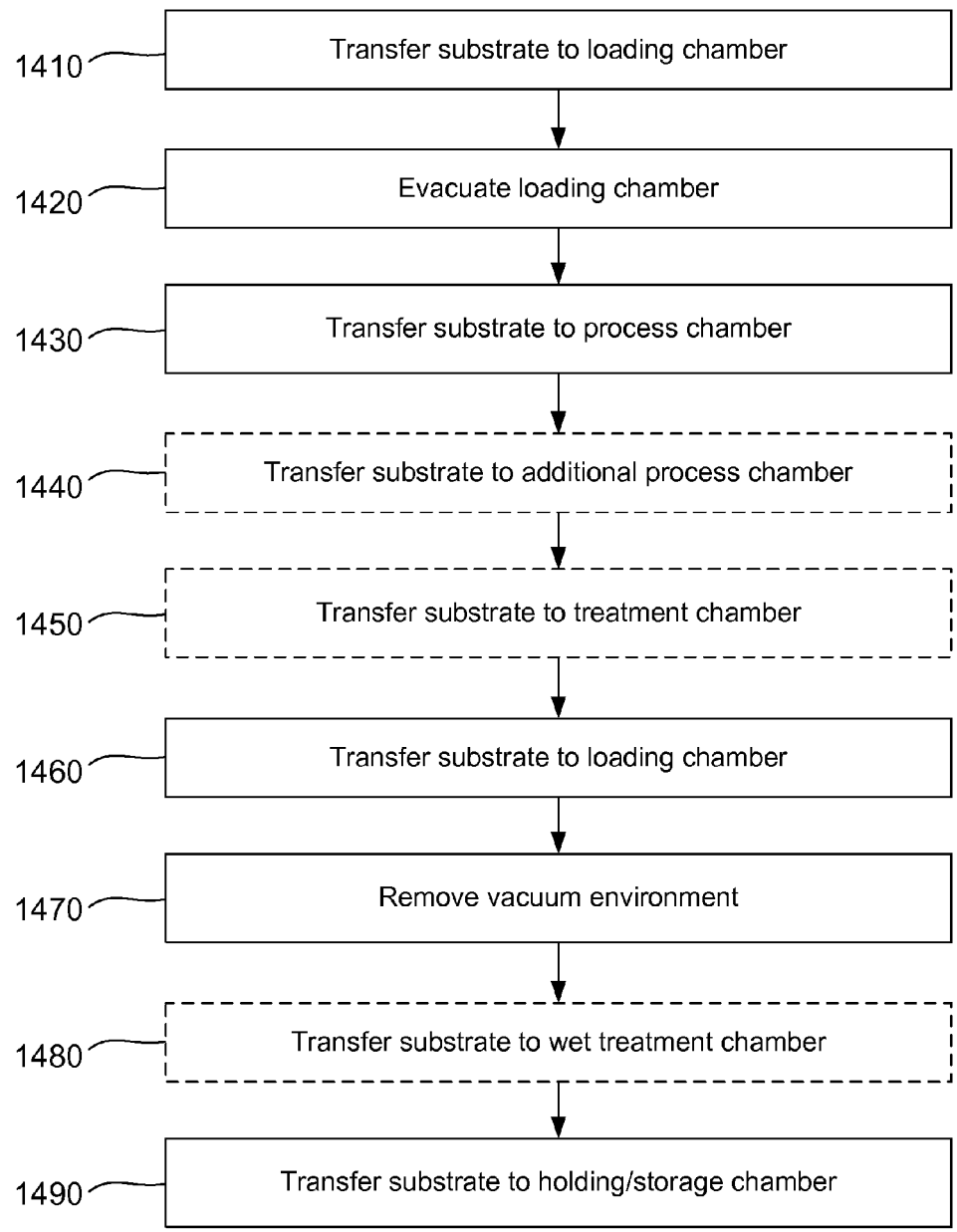
FIG. 14 shows an exemplary process of wafer transport according to the disclosed technology.

Utilizing the systems and/or tools described previously, process sequences may be developed that are designed to limit, remove, or correct aging defects or other contaminants located within a substrate being processed. For example, by coupling chamber tools with the system such that various operations may be performed without breaking vacuum or a clean environment, exposure to atmospheric conditions and/or contained moisture may be limited. Turning to FIG. 14 is shown an exemplary processing sequence of processing operations that may include etching and/or treatment processes that may be performed in one or more chambers coupled within a system. At operation 1410 a substrate may be passed under atmospheric conditions to a loading chamber at an initial stage of processing. The substrate may be originated in a holding chamber such as FOUPs 102 as previously described, and may be held at atmospheric or at general factory conditions. By atmospheric is generally meant the natural or induced conditions of the location in which the systems are contained. For example, locational considerations such as elevation, temperature, humidity, etc. may affect the atmospheric conditions. Additionally, a factory environment may be positively or negatively pressured to a certain degree, however these are still considered atmospheric as would be understood. Once received by the loading chamber, the loading chamber may be evacuated at operation 1420 to a system pressure or station pressure that is similar to one or more chamber tools or the transfer station environment, which may be maintained under vacuum conditions at all times.

The substrate may then be passed to a process chamber at operation 1430 within which one or more system operations may be performed. For example, the substrate may have been previously patterned, etched, or processed to a certain degree prior to being delivered to the current system tool. In certain scenarios one or more deposition processes may have already occurred that may have included deposition of one or more dielectric layers such as native oxide or nitride layers formed on a substrate, such as a silicon substrate. In such a case, the system may be configured to perform one or more etching or treatment operations. Alternatively a patterned or clean substrate may be delivered to the system for an initial deposition of a thermal, flowable, or other oxide film followed by etching and/or treatment operations. If an initial deposition is to be performed, the substrate may be delivered to one of a pair of tandem deposition chambers for deposition of a silicon oxide material at operation 1430. If the substrate includes already a deposited layer such as a native oxide layer, for example, the process performed at operation 1430 may include an oxide etch. Additionally, a silicon oxide etch may have been performed, and a silicon or nitride etch may be performed at operation 1430 in a chamber configured to perform such an etching operation. The operation may be a selective etching operation configured to etch silicon or silicon nitride at a higher rate than exposed silicon oxide. The etching operation may include the use of plasma species that may include halide species in disclosed embodiments.

The substrate may optionally be transferred to one or more additional process chambers in operation 1440. For example, if an oxide etch was performed at operation 1430, the substrate may be transferred to an additional chamber configured to perform a silicon or nitride etching process at operation 1440. Additionally, if a deposition such as an oxide deposition was performed at operation 1430, the substrate may be transferred to a chamber configured to perform an oxide etch at operation 1440. The substrate may then further be transferred to an additional chamber, or the additional process chamber may be configured or reconfigured to perform a silicon or nitride etching process as well. Various alternatives of such processing operations are similarly encompassed as would be understood.

The process may optionally continue at operation 1450 where the substrate may be transferred to a treatment chamber such as treatment chamber 1200 or combination chamber 1300 as previously described. In the treatment chamber a post-etching process may be performed that is configured to remove material or scavenge contaminants, for example, from surfaces of the substrate. The treatment may involve a variety of processes as previously described, or may include one of the treatments as will be described in further detail below. Subsequent to the optional treatment operations, the substrate may be transferred to a loading chamber at operation 1460, which may be the same or a different loading chamber as from which the substrate was previously received. The loading chamber may be re-pressurized at operation 1470, or the vacuum environment may be alternatively removed such as by flowing an inert gas into the chamber until the chamber is returned to the atmospheric conditions.

The substrate may optionally be transferred from the loading chamber to additional chambers, such as a wet treatment chamber, at operation 1480. The treatment chamber may be maintained at atmospheric conditions in disclosed embodiments, and may also be maintained in an inert environment such as under a nitrogen-purged environment, for example. The substrate may be returned to the holding chamber or a different holding chamber at operation 1490. Alternatively, the substrate may be transferred to a storage chamber for processed wafers in order to maintain processed wafers separate from originally provided wafers, for example.

Figure 15:
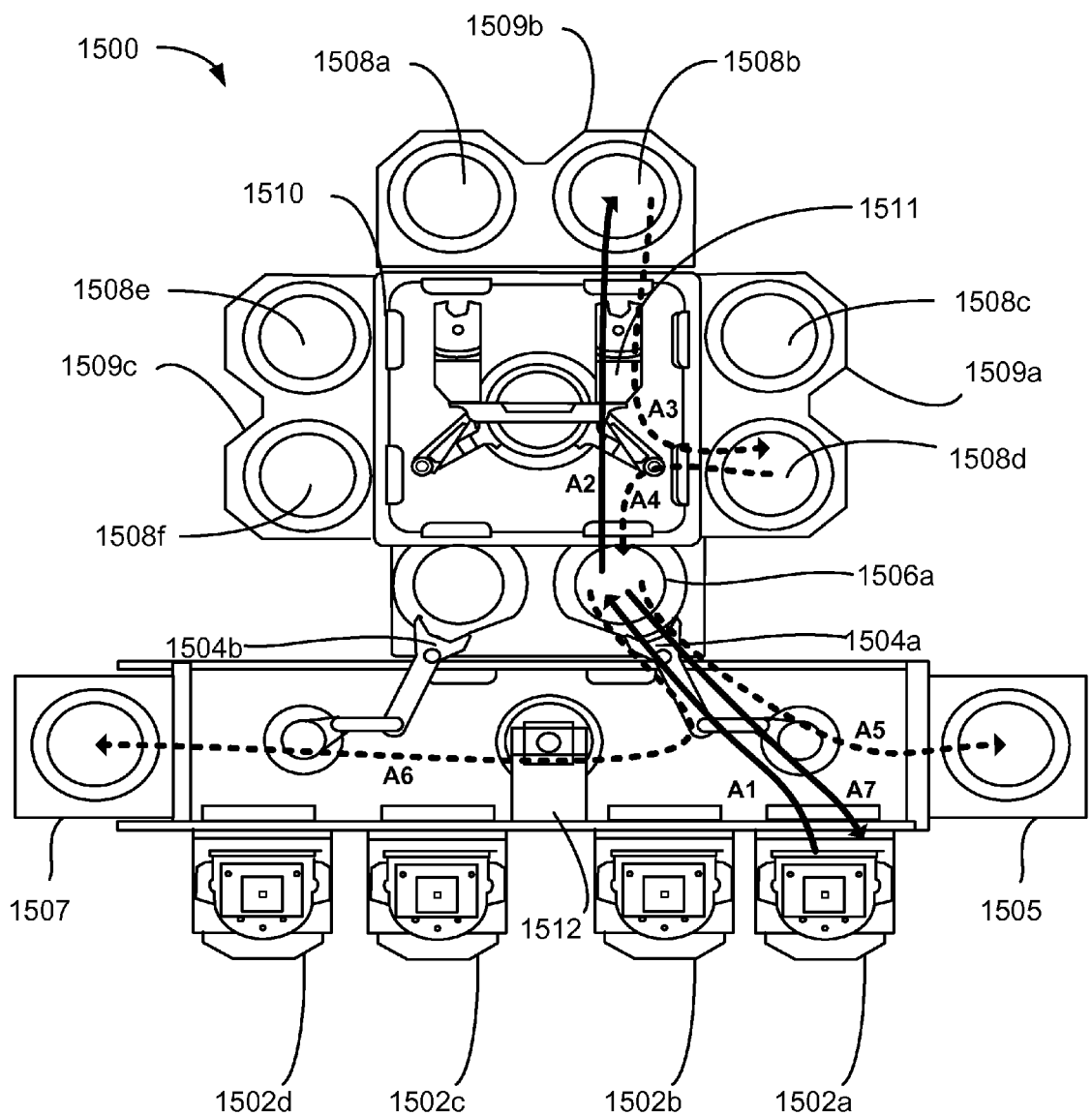
FIG. 15 shows a top plan view of an exemplary system illustrating wafer transport according to the disclosed technology.

Turning to FIG. 15, aspects of the process described with respect to FIG. 14 for wafer transport may be illustrated graphically over a top plan view of an exemplary processing system 1500. The processes and transfers described may additionally be caused to be performed by a computer system such as a system controller. In the illustrated configuration, a first transfer device 1504A may be used to remove a substrate from a holding chamber 1502a and transfer it along relative path A1 to substrate loading chamber 1506A. The system controller may then provide instructions to the load lock chamber 1506A to close and pump down to a desirable working pressure, for example, so that the substrate can be transferred into a transfer chamber 1510 which may already be in an evacuated state. The substrate may then be maintained in a vacuum environment for the duration of processing in disclosed embodiments.

A second transfer device 1511 may be used to transfer the substrate from the evacuated loading chamber to a process chamber, such as process chamber 1508b, along path A2. A process, such as an etching process or deposition process, may be performed in the process chamber after which the substrate may be returned back along path A2 to the loading chamber 1506a. In one example, a silicon oxide etch is performed in the first process chamber, or a silicon etch may be performed on a previously etched oxide substrate. Additionally, the substrate may be transferred along path A3, for example, to an additional process chamber 1508d, for example prior to transferring the substrate to the loading chamber, in which an additional operation such as an etching process, deposition process, or treatment process may be performed. For example, if a silicon oxide etch was performed in the first process chamber, the second process chamber may be configured to perform a silicon or silicon nitride etching process. The system controller may also be configured to provide instructions to a gas delivery system, and may provide instructions for flowing precursors into the processing chambers. The processes may be performed similarly to those described with respect to the methods discussed below. The substrate may subsequently be processed in additional chambers, transferred back to substrate loading chamber 1506a, or additionally transferred to a chamber such as combination chamber 1300, and disposed in the upper chamber of such an apparatus for additional treatment and/or processing. As described previously, the treatment chamber may be in vertical alignment to and coupled with the loading chamber 1506, and the substrate may be transferred to the chamber with the second transfer device prior to transferring the substrate back to the loading chamber 1506. The treatment chamber may be configured to perform an etching and/or scavenging operation to remove halide species from a surface of the silicon oxide in disclosed embodiments. The scavenging process may remove some, most, or all of a halide species from a silicon oxide film without removing any of the silicon oxide material, or by removing a portion of the oxide with the halide. The scavenging operation may include a plasma process as described below, and may additionally comprise an ultraviolet light process, and electron beam process, and/or an ozone curing process. All of the transfer operations from processing chambers and along such relative paths including A2, A3, and A4 may be performed with the second transfer device.

After processing or treatments have been performed, the second transfer device may transfer the substrate back to loading chamber 1506a, or to an alternative loading chamber such as 1506b, for example, and vacuum conditions may be removed from the loading chamber. The substrate may be heated within the loading chamber 1506 for a period of time after the substrate is returned to the loading chamber, or after a processed substrate is directed into a loading chamber. The control system, for example, may additionally provide instructions causing a heater to be engaged that heats the loading chamber from a first temperature up to a second temperature of greater than or about 200° C. in embodiments. The substrate may be transferred back to holding chamber 1502 from the loading chamber 1506a using transfer device 1504, for example, and may additionally be transferred to a different holding chamber or storage chamber along path A7. In disclosed embodiments the holding chamber is the storage chamber. Additionally, from loading chamber 1506a, the substrate may be transferred along path A5 with the first transfer device to a wet etching station 1505 prior to being transferred to the holding chamber 1502. Instead of returning to the holding chamber 1502, the substrate may be transferred to storage chamber 1507 that is a separate chamber from the holding chamber and may be used to house processed substrates. The storage chamber or holding chamber may be continuously purged with an inert fluid in disclosed embodiments. In this way, the housed substrates may be maintained in an inert and/or moisture-free environment. Some or all of these processes may be performed in conjunction to provide system processes that reduce halide contamination and/or aging defects in a substrate system or during substrate processing. By providing several of these operations as described within the vacuum environment, halide contamination may be controlled, limited, or removed from processed substrates. The following will describe in further detail certain of the specific processes that may be performed in certain or a combination of the chambers and systems described, and performed along the process paths disclosed.

III. Etching Process and Methods for Passivation

Figure 16:
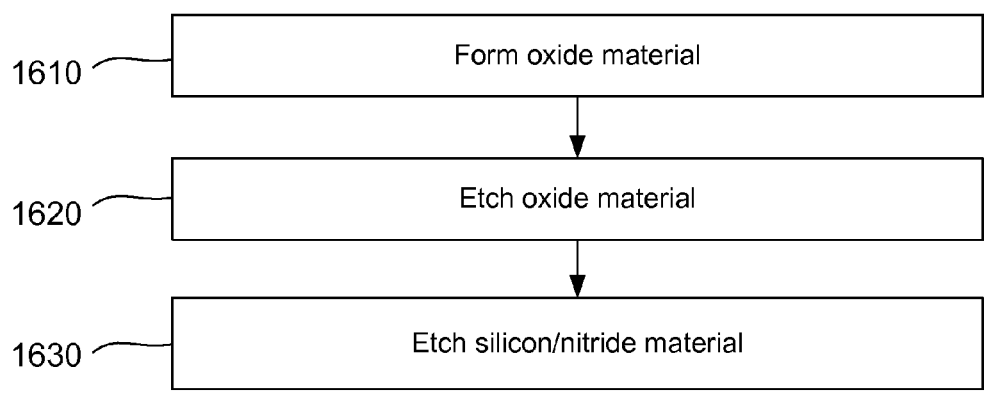
FIG. 16 shows an exemplary method of deposition and etch processes according to the disclosed technology.

Reference is now made to FIG. 16, which describes an exemplary substrate processing deposition and etch method. Such a method may be performed in two or more chambers coupled with an exemplary system of the disclosed technology. In substrate processing, semiconductor wafers may first require a protective layer to be formed over the substrate for protection from subsequent operations. Such a film may be a thin insulator, such as less than about 5 nm down to about 10 Å or less, formed over the surface of the substrate and may be termed a native layer. The film may be an oxide film formed over the silicon and in cases may be silicon oxide. The silicon may be amorphous, crystalline, or polycrystalline, in which case it is usually referred to as polysilicon. Although high quality processes may produce specifically or predominantly silicon dioxide films, because of the nature of the processes used that may be used for the native oxide formation, the films may include other silicon and oxygen bonding structures, and may additionally include additional constituents including nitrogen, hydrogen, carbon, etc. Such an oxide may be formed at operation 1610. The oxide formation may occur in one of the chambers of the described systems, or may be formed in a different processing system and delivered to the presently described systems with a previously formed oxide material previously formed. The oxide material may be formed over a silicon substrate, and may additionally be formed over silicon nitride films or under silicon nitride films, for example. If formed in the present processing systems, the substrate may then be transferred to an etching chamber as previously described, or if delivered to the system in such a form, the substrate may then be received through the system into a processing chamber as previously described.

In disclosed embodiments, an underlying silicon or silicon nitride material may be exposed for processing. During various wet or dry etching processes, however, a chemistry profile used to selectively etch silicon or silicon nitride may not etch silicon oxide, or may minimally etch silicon oxide. Conversely, a process used to selectively etch silicon oxide may not etch silicon or silicon nitride, which in either case may be beneficial, however if both types of materials are included on the substrate two types of etching processes may be needed. An initial etch of the native oxide may be performed in an etching process selective to silicon oxide that will expose an underlying silicon or silicon nitride material. A subsequent etch process selective to silicon or silicon nitride may then be performed that does not etch or minimally etches silicon oxide.

A silicon oxide etch may be performed at operation 1620 to expose a region of silicon or silicon nitride. The etch process may be performed in a chamber coupled with one of the previously described systems, such as a chamber similar to chambers illustrated in FIG. 3, 4, 5, or 6, for example. A flow of nitrogen trifluoride, or another fluorine- or halide-containing precursor, may be initiated into a plasma region separate from a processing region in which a substrate resides. In general, a fluorine-containing precursor may be flowed into the plasma region, such as either an RPS or plasma processing region as previously described, and the plasma effluents formed in the remote plasma region may then be flowed into the substrate processing region. Ammonia may be simultaneously flowed into the substrate processing region to react with the plasma effluents, and the ammonia may or may not be passed through the remote plasma region, and may be only excited by interaction with the plasma effluents.

The patterned substrate may be selectively etched such that the silicon oxide is removed at a significantly higher rate than the silicon nitride or silicon. The reactive chemical species may be removed from the substrate processing region, and the silicon oxide etching operation may be complete. Such a process may achieve etch selectivities of over 100:1 and up to 150:1 for the silicon oxide etch rate compared to the silicon nitride etch rate. The silicon oxide etch rate may exceed the silicon nitride etch rate by a multiplicative factor of about 100 or more. The gas phase dry etches may also achieve etch selectivities of silicon oxide relative to silicon including polysilicon of over 100:1 and up to 500:1 for the silicon oxide etch rate compared to the silicon etch rate. The silicon oxide etch rate may exceed the silicon etch rate by a multiplicative factor of about 300 or more. The presence of hydrogen and fluorine may allow the formation of solid byproducts of $(NH_4)_2SiF_6$ among other compositions at relatively low substrate temperatures. Additionally, by controlling the temperature sufficiently, formation of solid residue may be substantially avoided or eliminated to further protect underlying features of the structures. Additional examples of etching and deposition processes and chambers that may be used in conjunction with such an etch process are described in co-assigned application No. 61/702,493 titled "Radical-Component Oxide Etch," and filed Sep. 18, 2012, the entire contents of which are hereby incorporated by reference for all purposes not inconsistent with the present disclosure.

After regions of silicon or silicon nitride have been exposed for etching, the substrate may be transferred to another chamber for the silicon or silicon nitride etching performed in operation 1630. The etch process may be performed in a chamber coupled with one of the previously described systems, such as a chamber similar to chambers illustrated in FIG. 3, 4, 5, or 6, for example. An oxygen-containing precursor may be flowed into a first remote plasma region fluidly coupled with a substrate processing region in which a substrate resides, while a plasma is formed in the first remote plasma region to produce oxygen-containing plasma effluents. Such a remote plasma region may be an RPS unit coupled with the chamber in disclosed embodiments. The oxygen-containing precursor may include nitrogen dioxide among other oxygen and/or nitrogen-containing precursors. The precursor may be dissociated in the plasma to produce a variety of plasma effluents that may include $O^*$, $NO^*$, and other species useful in etching operations.

A fluorine-containing precursor may be flowed into a second remote plasma region that is separate from, but fluidly coupled with, the processing region. The second remote plasma region may be an additional RPS unit, or may be a partitioned plasma region separate from the processing region but within the chamber, for example. A plasma may be formed in the second remote plasma region during the precursor delivery, and the plasma may be used to produce fluorine-containing plasma effluents. Several sources of fluorine may be used in the etching process including nitrogen trifluoride, for example. The fluorine-containing precursor may include nitrogen trifluoride, and the fluorine-containing plasma effluents that are produced may include $NF^*$ and $NF_2^*$ species. The plasma created in the second remote plasma region may be specifically configured to excite the fluorine-containing precursor in such a way as to limit radical fluorine species or $F^*$ species such that the fluorine-containing plasma effluents consist essentially of $NF^*$ and $NF_2^*$ species.

The oxygen-containing plasma effluents and the fluorine-containing plasma effluents may be flowed into the processing region of the chamber. The exposed silicon and/or silicon nitride regions of the substrate may be selectively etched with the combination of oxygen-containing and fluorine-containing plasma effluents. After the etching has been performed, the reactive chemical species may be removed from the substrate processing region, and then the substrate may be removed from the processing region. When performed substantially as discussed, the methods may allow a region of silicon nitride to be etched at a faster rate than a region of silicon or silicon oxide. Using the gas phase dry etch processes described herein, etch selectivities of over 10:1 with regard to the silicon and/or silicon nitride etch rate as compared to the etch rate of silicon oxide may be achieved. The silicon nitride and/or silicon etch rate may exceed the silicon oxide etch rate by a multiplicative factor of up to or about 50 or more in disclosed embodiments. Additional examples of etching and deposition processes and chambers that may be used in conjunction with such an etch process are described in co-assigned application No. 61/771,264 titled "Enhanced Etching Processes Using Remote Plasma Sources," and filed Mar. 1, 2013, the entire contents of which are hereby incorporated by reference for all purposes not inconsistent with the present disclosure.

The first and second etching operations may be performed at a variety of operating conditions as previously described, and may be performed at similar or different conditions. The pressure in the substrate processing region may be above or about 0.1 Torr and less than or about 100 Torr, in disclosed embodiments, during the etching operations. The pressure within the substrate processing region may also be below or about 40 Torr and above or about 5 Torr or 10 Torr in disclosed embodiments, or may be between about 0.1 mTorr and about 10 Torr. During the etching processes, the substrate may be maintained at or below about 400° C., and may be maintained at or below about 300° C., 200° C., 100° C., 80° C., 75° C., 50° C., 25° C., 10° C., 0° C., or less. The temperature of the substrate may be about 100° C. or more and about 140° C. or less during the etching operations and may also be at or below about 50° C., 25° C., or 10° C. or less.

Figure 17:
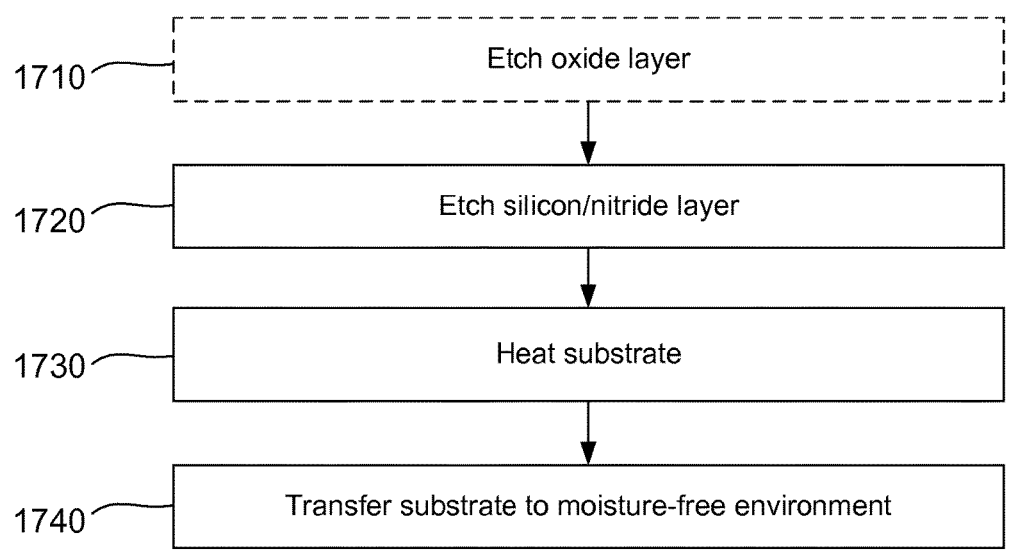
FIG. 17 shows an exemplary method of etch and treatment processes according to the disclosed technology.

At least in part because of the high selectivities available in the described processes, the silicon oxide layer may not require further protection during the second etching operation, and is therefore exposed to the plasma species of the second operation despite that the silicon oxide is not etched, substantially maintained during the process, or minimally removed during the process. However, the radical fluorine species delivered into the processing region may still contact and become incorporated within the silicon oxide. As described above, this incorporation may cause aging defects when moisture is introduced into the system. Accordingly, several processes may be performed in order to prevent or mitigate aging defects. Because the etching processes described may occur relatively early in the fabrication process, one solution may involve limiting the amount of time the substrate is maintained in an atmospheric environment. Accordingly, methods may be utilized to help mitigate or prevent surface reactions on the treated substrate by limiting moisture interactions, as discussed with respect to FIG. 17 below.

As previously described, an optional etch of the oxide may have been performed at operation 1710, such as the first etching process described above. The first etching process may be selective to silicon oxide over silicon, and may utilize a fluorine-containing precursor and a hydrogen and/or nitrogen-containing precursor in embodiments. An etching process that is selective to silicon over silicon oxide may be performed at operation 1720. The etching process may utilize a fluorine-containing precursor and an oxygen-containing precursor as previously described, and may expose the silicon oxide surface to halide species, including fluorine species such as radical fluorine. The residual fluorine species may become incorporated into the substrate silicon oxide material. The substrate may be subsequently heated at operation 1730 to a first temperature such as with a baking operation to remove any residual moisture produced in the processes or within the system environment. The substrate may subsequently be transferred or maintained in an inert or moisture-free environment at operation 1740 that may remove some, all, or substantially all moisture from the environment housing the substrate.

The substrate may be heated in a chamber in which the etching operation was performed, or may be transferred to an additional chamber, such as a loading chamber to be heated. By removing the substrate from the etching chamber a subsequent etch may be performed while the substrate is heated in the loading chamber, which may reduce or substantially reduce queue times. The heating operation may heat the substrate to above or about 100° C., for example, and may heat the substrate to above or about 150° C., 200° C., 250° C., 300° C., 350° C., 400° C., etc. or higher in disclosed embodiments. Such a process may passivate the surface by removing incorporated moisture, which may reduce the formation of aging defects. The substrate may be maintained at the first temperature or heating temperature for a first period of time, which may be greater than or about 1 minute, 2 minutes, 3 minutes, 4 minutes, 5 minutes, 10 minutes, 15 minutes, 20 minutes, etc. or more.

The inventors have surprisingly determined that heating the substrate may not remove aging defects until a certain threshold time has been maintained. Similarly, the inventors have determined that heating the substrate beyond a threshold temperature during that time may additionally affect the formation of aging defects. After the heating or passivation operation, the substrate may be transferred to a storage chamber or holding chamber, or simply back to a FOUP from which the substrate may have originated. The storage chamber may be purged in order to prevent moisture accumulation within the chamber until a stack of substrates has been processed and may be delivered to subsequent operations or systems. For example, a purging fluid such as an inert fluid like nitrogen, etc. may be continuously flowed through the storage chamber to maintain the moisture-free environment. In disclosed embodiments, the chamber may be held at a slightly positive pressure with the purging fluid to ensure that leakage into the storage chamber does not occur.

Testing has shown that such a passivation process may prove successful for a variety of wafer types and lengths of storage prior to subsequent processing such that aging defects do not form, or are limited on the substrate surface. However, the materials on a wafer may additionally affect the success of such a passivation process. For example, wafers having silicon and silicon oxide materials have been shown to have no or limited aging defects, such as within an acceptable margin, directly after the passivation operation as well as two hours, four hours, six hours, etc., to twenty-four hours or more after the passivation process. When the substrate materials include nitride, however, aging defects may be prevalent within one to two hours after passivation. Without being bound to a particular theory, the inventors have determined that nitride materials may include higher levels of residual fluorine species after certain operations. For example, when a selective silicon etch is performed, remaining layers of silicon oxide and silicon nitride may still be exposed to the etchant species, and radical species such as halide species may be incorporated within the silicon oxide and/or silicon nitride materials. Accordingly, when a plurality of wafers is stored in a chamber and the wafers include nitride films, the higher levels of fluorine may be more susceptible to both aging defects and cross-contamination of materials. Accordingly, although the present passivation has been shown to be successful, additional operations may be performed to both remove the contaminated oxide material, as well as to reduce or scavenge the incorporated fluorine species form the material films. These methods of material removal and halide scavenging will be discussed in detail below.

IV. Methods for Removal

X-ray photoelectron spectroscopy ("XPS") analysis has been performed by the inventors to determine the extent and possible mechanisms previously discussed relating to the aging defects. By varying the glancing angle, or depth within the film at which the analysis is performed, the inventors have determined that halide contamination may reduce with increasing depth within the film. Accordingly, an upper surface of the exposed films, such as an exposed oxide film or nitride film, may contain up to or over about 15 atomic % of fluorine or other residual halide species. By removing an upper surface of the material, the residual species may additionally be removed to reveal a surface of the material having lower amounts of residual halide or other contaminant species.

Figure 18:
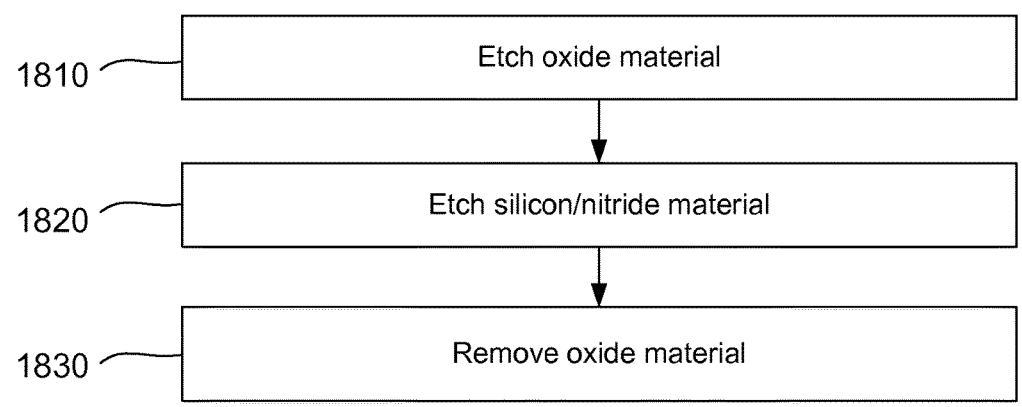
FIG. 18 shows an exemplary method of etch and removal processes according to the disclosed technology.

Exemplary methods of material removal and/or substrate etching are shown at FIG. 18. The methods may include similar etching operations as described above with respect to FIG. 16. Each of the methods may be applicable to silicon as well as silicon nitride materials. For example, a substrate may be provided in a system environment having a silicon material and a silicon oxide material or layer overlying the silicon material. The silicon oxide material may have been deposited in a different chamber system, or the system in which the material removal will occur. At operation 1810, a first etching process may be performed that etches the substrate and is selective to silicon oxide over silicon. The methods may be similar to operation 1620 described earlier, and may include using nitrogen trifluoride and ammonia, for example to perform the etching operation. A second etching process may be performed at operation 1820 that etches the substrate and is selective to silicon over silicon oxide. The methods may be similar to operation 1630 described previously.

The methods may also include a third etching process at operation 1830 that etches the substrate and is selective to silicon oxide over silicon. The operation may perform an etching process similar to that described above with respect to operation 1620. In this way, the first and third etching processes may be similar etching processes, and may be substantially similar or essentially similar in many respects. Accordingly, the first and third etching processes may include exposing the substrate to a nitrogen-containing precursor and a fluorine-containing precursor. The fluorine-containing precursor may have been flowed through a plasma to produce plasma effluents in disclosed embodiments. The second etching process may include exposing the substrate to a fluorine-containing precursor and an oxygen-containing precursor, and the fluorine-containing precursor may have been flowed through a plasma to produce plasma effluents. The silicon oxide layer etched in the first etching operation may be exposed to the plasma effluents of the second etching process, which may include fluorine species, and residual fluorine species may be incorporated with the silicon oxide layer. The species may be contained within the silicon-oxide lattice, or specifically bonded at various sites within the material.

The first and third etching processes may be performed in a first process chamber of the system, and the second etching process may be performed in a second process chamber of the system. In this way, all processes may be performed within a single system environment, and under a maintained vacuum or inert environment. Accordingly, the residual fluorine that may be incorporated with the silicon oxide material in the second etching process may not be exposed to atmospheric conditions prior to performing the material removal in the third etching process. In this way, aging defects may be prevented or substantially prevented on the silicon oxide surface. The third etching process may remove a predetermined amount of material. For example, a test wafer of the stack may be analyzed to determine a depth to which etching may be performed in order to reduce the residual fluorine incorporation below a threshold level. For example, the third etching process may etch the silicon oxide layer to remove a depth of at least about 5 Å of material. The third etching process may also etch the silicon oxide layer to remove a depth of at least 10 Å, 15 Å, 20 Å, 30 Å, 40 Å, 50 Å, 10 nm, etc., or more, or may also be performed to remove less than or about 20 Å, 15 Å, 10 Å, etc. or less.

The methods may remove the oxide material by other methods or by a combination of methods. For example, operation 1830 may include treating the substrate with a third process. As discussed previously, the silicon oxide layer may be exposed to the second etching process, and the second etching process may produce radical fluorine species, for example, and residual fluorine species may become incorporated with the silicon oxide layer. In an exemplary process, the third process may include directing plasma effluents at the surface of the substrate. The plasma effluents may be produced from an inert precursor, for example, and may be produced from argon, helium, or other inert precursors. The plasma effluents may be produced in a remote region of a chamber, which may be the chamber in which either the first or second etching process was performed, or may be produced in a third etching chamber similar to any of the chambers described in FIGS. 3, 4, 5, and 6. For example, an inert precursor, such as an argon precursor may be flowed through an RPS or internal plasma region of a process chamber to produce radical argon species. The species may be directed at the surface of the substrate to perform a sputtering of the surface. The plasma species may etch a top layer of the substrate, and may remove the top surface from the silicon oxide layer from the bombardment of the surface with plasma species. The removed material may be extracted from the chamber, revealing a silicon oxide layer with a lower level of contamination. The sputtering operation may remove similar levels of material as the third etching process described above.

As another example, operation 1830 may include treating the substrate with a third process, and the third process may include a wet etching process. In such a system, the first, second, and third etching operations may all be performed in different process chambers. The wet etching process may comprise hydrofluoric acid, such as DHF, and may be performed to remove up to about 20 Å of the silicon oxide layer or less. The wet etching process may also remove up to about 15 Å or less, 12 Å or less, 10 Å or less, etc. in disclosed embodiments. If a system such as the systems previously described is utilized, the wet etching chamber may be incorporated outside of the vacuum environment. In alternative configurations, the combination process chamber may be configured to perform a wet etch process, which would then be performed in the vacuum processing environment, for example. However, if the substrate is being removed from the vacuum environment to perform the wet etch, the substrate may be exposed to moisture. This may be acceptable because even if initial aging defects were to begin to form, they may be removed from the surface of the substrate when the wet etch is performed, thereby overcoming the defect formation. Additionally, a passivation process may be performed such as previously described that provides a degree of protection prior to performing the wet etch process, if it is to be performed at a later time and not directly after processing. A passivation process may similarly be performed with the other removal processes described as well. The third process may also be performed with deionized water such that the process includes exposing the silicon oxide layer to deionized water in a wet processing station. The deionized water may not perform an etching operation, but may instead at least partially scavenge the halide species from the silicon oxide layer without etching the silicon oxide layer. Accordingly, if the wet process station is contained outside of the vacuum environment, a passivation process such as described previously may be performed prior to transferring the substrate from the vacuum environment in order to provide further protection against the formation of aging defects.

Any of the described material removal methods may remove material from the silicon oxide layer in order to reduce the atomic fluorine or halide concentration below or to about 20 atomic % fluorine. An amount of material may also be removed to reduce the halide contamination below or about 18 atomic %, 15 atomic %, 12 atomic %, 10 atomic %, 9 atomic %, 8 atomic %, 7 atomic %, 6 atomic %, 5 atomic %, 4 atomic %, 3 atomic %, 2 atomic %, 1 atomic %, or 0 atomic %, in which case all or essentially all residual halide species is removed. Such an operation may be successful for a variety of situations. However, as native oxide layers continue to shrink with substrate scaling, the silicon oxide layer may be reduced below about 5 nm, 3 nm, 2 nm, 1 nm, 5 Å, etc. or less. In such situations, additional treatment methods may also be useful that do not further reduce the thickness of the silicon oxide layer or silicon nitride layers in alternative examples. Accordingly, scavenging operations such as with the use of deionized water or other processes may be useful as well, and will be described further below.

V.: Methods for Scavenging

Scavenging operations may be performed to reduce or remove halide concentrations in silicon oxide materials as well as other materials. The scavenging operations may remove the residual species from the material layers without removing material from the oxide layers. Accordingly, the oxide layers may be maintained or substantially maintained in the scavenging operations. Certain scavenging operations may additionally remove an amount of the oxide materials, but the removal may be limited or minimized in disclosed embodiments. The scavenging operations may be performed by interaction with the incorporated halide species, or may provide energy treatments that may physically or chemically separate the halide species from the oxide or nitride materials.

Figure 19:
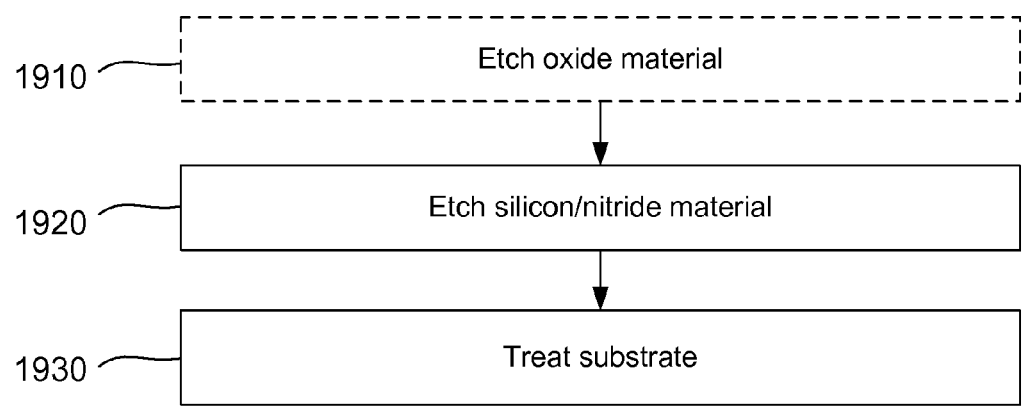
FIG. 19 shows an exemplary method of etch and treatment processes according to the disclosed technology.

Turning to FIG. 19 is shown a halide scavenging operation that may include removing contaminants from a processed substrate having exposed silicon and silicon oxide surfaces. The substrates may additionally or alternatively include nitride regions or other metal regions or material regions as previously described. At operation 1910 an optional etching process may be performed to etch a silicon oxide material to expose an underlying silicon or silicon nitride material. Previous operations may have been performed prior to the optional etching operation including a deposition or other processes as previously described in relation to FIG. 16, for example. The optional etching process may be performed that etches the substrate and is selective to silicon oxide over silicon. The optional etching may be similar to operation 1620 described earlier, and may include using nitrogen trifluoride and ammonia, for example to perform the etching operation.

A subsequent etching process may be performed at operation 1920 that etches a silicon and/or silicon nitride material. The etching process may be selective to silicon or silicon nitride over silicon oxide, for example, and may be similar to operation 1630 previously described. The etching process may produce radical species and residual species from the radical species may be incorporated with the exposed silicon oxide layer. The etching process may include exposing the substrate to a fluorine-containing precursor and an oxygen-containing precursor. Either or both of the fluorine-containing precursor and oxygen-containing precursor may have been flowed through a plasma to produce at least a portion of the radical species, which may include radical fluorine species, for example. The etching process may not etch any of the silicon oxide layer or may substantially not etch the silicon oxide layer. The fluorine or other radical halide species may be incorporated with the silicon oxide material in a profile such that the extent of incorporation diminishes at increasing depths of the silicon oxide film.

The substrate may be treated after the etching process at operation 1930 to remove at least a portion of the residual species from the silicon oxide surface. The treatment may include a variety of operations that may be performed within the chamber that performed the etching process at operation 1920, or may be performed in an additional chamber to which the substrate is transferred. For example, the treatment may include one or more of a thermal treatment, a UV radiation or light treatment, an electron beam treatment, a microwave treatment, a curing treatment, or a plasma treatment in disclosed embodiments. The operations may be performed at a variety of temperatures and pressures depending on the operations, and may be performed at any temperature included in the range from between about 0° C. and about 800° C. For example, a thermal treatment operation may be performed at a temperature between about 400° and about 600° C., among other temperatures and ranges within the broader range, while a plasma operation utilizing a remote plasma nitrogen-containing precursor may be performed at temperatures between about 0° C. and 100° C., among other temperatures and ranges within the broader range. The treatments may similarly be performed at any pressure included in the range from between about 0.5 mTorr up to about 700 Torr. For example, an inductively coupled internal plasma operation may be performed at a pressure below about 1 Torr, among other pressures and ranges within the broader range, while a curing operation may be performed above about 500 Torr, among other pressures and ranges within the broader range.

The treatment operations may reduce the amount of residual halide within the silicon oxide film and may reduce the atomic percentage of halides, such as fluorine, from within the silicon oxide or nitride material to below or about 20%. The treatments may additionally reduce the atomic percentage of halides, such as fluorine, to below or about 18%, 15%, 12%, 10%, 9%, 8%, 7%, 6%, 5%, 4%, 3%, 2%, 1%, or 0% in which case the halide may be completely or essentially removed from the silicon oxide material. Additional materials may be scavenged or treated in similar ways.

The substrate may be transferred to a treatment chamber for the treatment, and the treatment chamber may include a combination chamber such as those discussed previously with FIGS. 12 and 13, for example. The substrate may be maintained under vacuum during the transfer to the treatment chamber, and may be maintained in a moisture-free or substantially moisture-free environment until the treatment has been completed. Treating the substrate may include exposing a treatment species to an energy source to produce energized treatment species configured to interact with or upon the residual radical species. The treatment species may include hydrogen-containing precursors, oxygen-containing precursors, nitrogen-containing precursors, and inert precursors. The precursors may include a combination of precursors including nitrogen, helium, argon, hydrogen, nitrous oxide, ammonia, nitrogen trifluoride, water, and ozone among other precursors. In disclosed embodiments the energy source used to energize the treatment species may include a plasma. The plasma may be an internally generated or externally generated plasma with respect to the treatment chamber, and may be a capacitively-coupled plasma, an inductively-coupled plasma, a microwave plasma, and a toroidal plasma. The plasma may be formed at any of the plasma conditions previously described. The energized treatment species may bond with the residual radical species in disclosed embodiments. For example, the energized treatment species may include a hydrogen-containing precursor that includes radical hydrogen-containing species after being energized. The radical hydrogen-containing species may bond with the residual halide species, such as residual fluorine species for example, and withdraw it from the silicon oxide surface. The formed composition of the residual fluorine species and radical hydrogen-containing species may be subsequently evacuated from the treatment chamber. The treatment may be performed for a period of time that may range from about 1 second up to about 30 minutes or more. For example, operations performed at higher plasma powers may be performed for 120 seconds or less, for example, while operations performed without plasma power may be performed for 5 minutes or more, for example.

After the treatment has been performed, the substrate may be further transferred to a passivation chamber for a passivation process. The passivation may also be performed in the treatment chamber in disclosed embodiments. For example, the substrate may be subsequently transferred to a loading chamber that is still within the vacuum environment and the passivation may be performed there, which may reduce process queue times in other chambers. By performing the passivation in the loading chamber, for example, the substrate may be maintained under vacuum during the transfer to the passivation chamber, and during the entire process. The passivation may include heating the substrate to a temperature greater than or about 150° C. for a period of time greater than or about two minutes. The passivation may also include any of the parameters previously discussed for passivation and processing.

Figure 20:
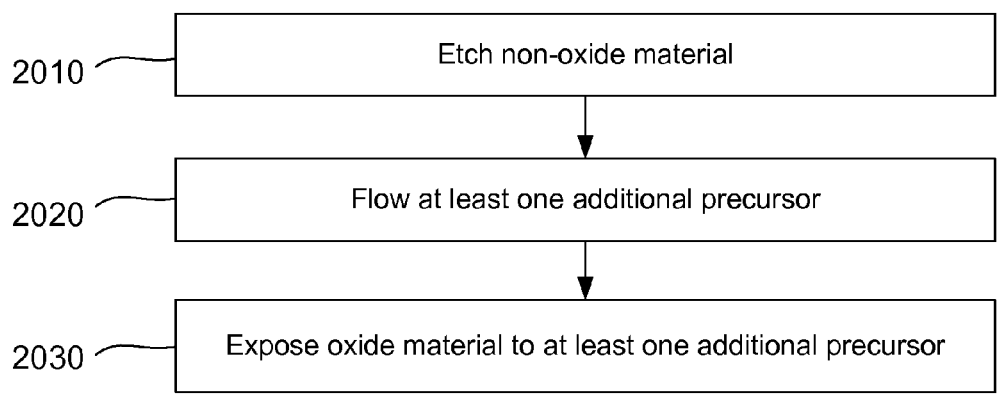
FIG. 20 shows an exemplary method of etch and exposure processes according to the disclosed technology.

FIG. 20 illustrates an alternative scavenging operation that may be performed within a chamber performing the silicon or nitride material. The method may include removing contaminants on a substrate that has an exposed silicon oxide region and an exposed non-oxide region. The non-oxide region may include a silicon, silicon nitride, or a metal-containing material region. The metals may include one or more transition metals, and may include copper, tungsten, titanium, etc., among oxides and other materials incorporating metal species. A substrate may be delivered into a chamber for an etching process on the substrate that may include the exposed materials. The chamber may be a substrate processing chamber such as any of those previously described including from FIG. 3, 4, 5, or 6. Previous deposition and etching processes such as those explained with respect to FIG. 16 may be performed in additional chambers and/or systems as previously described in order to form and/or expose the materials. A fluorine-containing precursor may be flowed into a remote plasma region of the substrate processing region of the substrate processing chamber while forming a plasma in the remote plasma region to produce plasma effluents. At operation 2010 the exposed non-oxide material may be etched utilizing the plasma effluents. The silicon oxide region may not be etched during the process, but may be exposed to the plasma effluents. As such, a portion of the fluorine species or fluorine-containing plasma effluents may be incorporated with the silicon oxide region.

At operation 2020, after the etching is completed, at least one additional precursor may be flowed into the processing region. For example, a first treatment precursor may be flowed into the remote plasma region or an alternate remote plasma region of the substrate processing chamber to produce treatment plasma effluents. At least one additional treatment precursor may be flowed into the substrate processing region where it may react with the treatment plasma effluents. At operation 2030, the silicon oxide region may be exposed to the treatment precursors including the treatment plasma effluents in order to remove residual plasma effluents from the silicon oxide region. The treatment plasma may at least partially dissociate the at least one additional treatment precursor in the substrate processing region. The at least partially dissociated at least one additional treatment precursor may interact and/or bond with the fluorine species incorporated with the silicon oxide region.

The treatment precursor may include an inert precursor, and may also include a nitrogen-containing precursor and a hydrogen-containing precursor, among other precursors. The treatment precursor may include one or more of nitrogen, helium, argon, and xenon, as well as precursors containing one or more of those species. The at least one additional treatment precursor may include a hydrogen-containing precursor and/or a nitrogen-containing precursor. The exposure to the treatment precursors may or may not partially remove the silicon oxide region or a portion of the silicon oxide region. The exposure may also remove at least a portion of the fluorine species while maintaining or essentially maintaining the silicon oxide material. The method may be performed entirely in a single chamber, and the a vacuum environment within the chamber may be maintained throughout the entire process. The chamber may additionally be moisture-free such that the entire method is also performed in a moisture-free environment. The exposure may be performed at one or more temperatures between about 0° C. and about 800° C., and the exposure may be performed at one or more pressures between about 1 mTorr and about 700 Torr.

An alternate variation may also be performed to remove contaminants on a substrate having an exposed silicon oxide region and an exposed non-oxide region. The method may also include flowing a fluorine-containing precursor into a remote plasma region of a substrate processing chamber fluidly coupled with a substrate processing region of the substrate processing chamber. A plasma may be formed in the remote plasma region while the precursor is flowed through in order to produce fluorine-containing plasma effluents. The silicon oxide region may be exposed to the plasma effluents although it may not be etched, and as such plasma species including fluorine-containing plasma effluents may be incorporated into the silicon oxide region. At operation 2010 the exposed non-oxide region may be etched utilizing the plasma effluents. At least one treatment precursor may be flowed into the substrate processing region at operation 2020, and at operation 2030 the silicon oxide region may be exposed to the at least one treatment precursor to remove at least a portion of the fluorine-containing plasma effluents.

The at least one treatment precursor may not be passed through a plasma prior to being flowed into the substrate processing region, and the processing region may be maintained plasma-free during the exposure operation. Flowing at least one treatment precursor may include first flowing water vapor into the process chamber. The water vapor may be injected into the process chamber and the temperature of the chamber may be adjusted at one or more times before injecting the water and/or after injecting the water vapor to condense the water vapor on the surface of the silicon oxide region. A nitrogen-containing precursor may then be flowed into the substrate processing region, and the nitrogen-containing precursor may include ammonia, for example. In such a process, the water may first interact with the fluorine species incorporated with the silicon oxide material, which may form hydrogen fluoride and remove it from the silicon oxide material. The ammonia may then interact with the formed hydrogen fluoride to produce solid byproducts of nitrogen-and-fluorine-containing species that may include $NH_3F$ and/or $NH_3HF$ among other materials as previously described. Although the process described utilizes water in the chamber, by manipulating the temperature and utilizing ammonia as described, as opposed to producing aging defects, the process may instead remove the halide species with the described reactions.

The temperature may be maintained at a first temperature during the interaction, and then raised to a second temperature or above a threshold temperature in order to decompose and evaporate the byproducts such as by sublimation. The first and second temperatures may be any of the previously disclosed temperatures, and the first temperature may be at or below about 100° C., for example, while the second temperature may be at or above 100° C., for example. The process may proceed without removing the silicon oxide material, and may substantially maintain the silicon oxide material in disclosed embodiments. In disclosed embodiments the process may reduce the atomic % concentration of fluorine within the surface layer of the silicon oxide below about 15%, and may also reduce the atomic % of fluorine species within the surface layer below about 12%, 10%, 9%, 8%, 7%, 6%, 5%, 4%, 3%, 2%, 1%, or 0%, in which case the fluorine species is completely or essentially removed from the silicon oxide material.

VI.: Computer System

Figure 21:
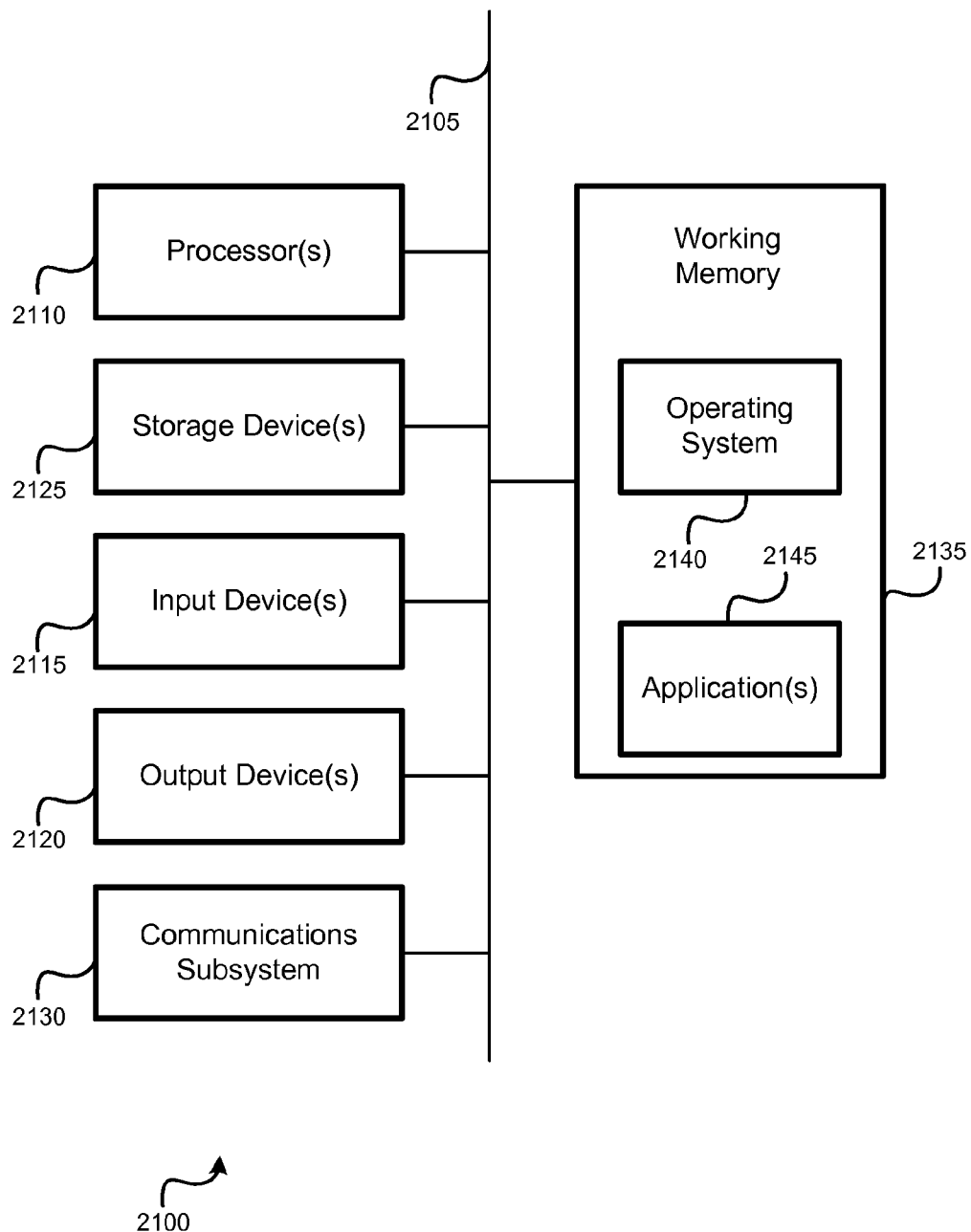
FIG. 21 shows a simplified computer system that may be utilized to perform one or more of the operations discussed.

FIG. 21 illustrates an embodiment of a computer system 2100. A computer system 2100 as illustrated in FIG. 21 may be incorporated into devices such as a process chamber controller, a process system controller, a gas delivery system controller, and the like. Moreover, some or all of the components of the computer system 2100 may also be incorporated at the specific devices, or may be incorporated within a remotely located controller or a portable controller. FIG. 21 provides a schematic illustration of one embodiment of a computer system 600 that can perform some or all of the steps of the methods provided by various embodiments. It should be noted that FIG. 21 is meant only to provide a generalized illustration of various components, any or all of which may be utilized as appropriate. FIG. 21, therefore, broadly illustrates how individual system elements may be implemented in a relatively separated or relatively more integrated manner.

The computer system 2100 is shown comprising hardware elements that can be electrically coupled via a bus 2105 or may otherwise be in communication, as appropriate. The hardware elements may include one or more processors 2110, including without limitation one or more general-purpose processors and/or one or more special-purpose processors, such as digital signal processing chips, graphics acceleration processors, and/or the like; one or more input devices 2115, which can include without limitation a mouse, a keyboard, a camera, and/or the like; and one or more output devices 2120, which can include without limitation a display device, a printer, and/or the like.

The computer system 2100 may further include and/or be in communication with one or more non-transitory storage devices 2125, which can comprise, without limitation, local and/or network accessible storage, and/or can include, without limitation, a disk drive, a drive array, an optical storage device, a solid-state storage device, such as a random access memory ("RAM"), and/or a read-only memory ("ROM"), which can be programmable, flash-updateable, and/or the like. Such storage devices may be configured to implement any appropriate data stores, including without limitation, various file systems, database structures, and/or the like.

The computer system 2100 might also include a communications subsystem 2130, which can include without limitation a modem, a network card, either wireless or wired, an infrared communication device, a wireless communication device, and/or a chipset such as a Bluetooth™ device, an 802.11 device, a WiFi device, a WiMax device, cellular communication facilities, etc., and/or the like. The communications subsystem 2130 may include one or more input and/or output communication interfaces to permit data to be exchanged with a network, other computer systems, and/or any other devices described herein. Depending on the desired functionality and/or other implementation concerns, a portable electronic device or similar device may communicate system, chamber, and/or other information via the communications subsystem 2130. In other embodiments, a portable electronic device, may be incorporated into the computer system 2100, as an input device 2115. In many embodiments, the computer system 2100 will further comprise a working memory 2135, which can include a RAM or ROM device, as described above.

The computer system 2100 also can comprise software elements, shown as being currently located within the working memory 2135, including an operating system 2140, device drivers, executable libraries, and/or other code, such as one or more application programs 2145, which may comprise computer programs provided by various embodiments, and/or may be designed to implement methods, and/or configure systems, provided by other embodiments, as described herein. Merely by way of example, one or more procedures described with respect to the methods discussed above, such as those described in relation to FIGS. 14 to 20, might be implemented as code and/or instructions executable by a computer and/or a processor within a computer; in an aspect, then, such code and/or instructions can be used to configure and/or adapt a general purpose computer or other device to perform one or more operations in accordance with the described methods.

A set of these instructions and/or code might be stored on a non-transitory computer-readable storage medium, such as the storage device 2125 described above. In some cases, the storage medium might be incorporated within a computer system, such as computer system 2100. In other embodiments, the storage medium might be separate from a computer system, e.g., a removable medium, such as a compact disc or removable drive, and/or provided in an installation package, such that the storage medium can be used to program, configure, and/or adapt a general purpose computer with the instructions/code stored thereon. These instructions might take the form of executable code, which is executable by the computer system 2100 and/or might take the form of source and/or installable code, which, upon compilation and/or installation on the computer system 2100, e.g., using any of a variety of generally available compilers, installation programs, compression/decompression utilities, etc., then takes the form of executable code.

It will be apparent to those skilled in the art that substantial variations may be made in accordance with specific requirements. For example, customized hardware might also be used, and/or particular elements might be implemented in hardware, software including portable software, such as applets, etc., or both. Further, connection to other computing devices such as network input/output devices may be employed.

As mentioned above, in one aspect, some embodiments may employ a computer system such as the computer system 2100 to perform methods in accordance with various embodiments of the technology. According to a set of embodiments, some or all of the procedures of such methods are performed by the computer system 2100 in response to processor 2110 executing one or more sequences of one or more instructions, which might be incorporated into the operating system 2140 and/or other code, such as an application program 2145, contained in the working memory 2135. Such instructions may be read into the working memory 2135 from another computer-readable medium, such as one or more of the storage devices 2125. Merely by way of example, execution of the sequences of instructions contained in the working memory 2135 might cause the processors 2110 to perform one or more procedures of the methods described herein. Additionally or alternatively, portions of the methods described herein may be executed through specialized hardware.

The terms "machine-readable medium" and "computer-readable medium," as used herein, refer to any medium that participates in providing data that causes a machine to operate in a specific fashion. In an embodiment implemented using the computer system 2100, various computer-readable media might be involved in providing instructions/code to processors 2110 for execution and/or might be used to store and/or carry such instructions/code. In many implementations, a computer-readable medium is a physical and/or tangible storage medium. Such a medium may take the form of a non-volatile media or volatile media. Non-volatile media include, for example, optical and/or magnetic disks, such as the storage device 2125. Volatile media include, without limitation, dynamic memory, such as the working memory 2135.

Common forms of physical and/or tangible computer-readable media include, for example, a floppy disk, a flexible disk, hard disk, magnetic tape, or any other magnetic medium, a CD-ROM, any other optical medium, punch-cards, papertape, any other physical medium with patterns of holes, a RAM, a PROM, EPROM, a FLASH-EPROM, any other memory chip or cartridge, or any other medium from which a computer can read instructions and/or code.

Various forms of computer-readable media may be involved in carrying one or more sequences of one or more instructions to the processors 2110 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer system 2100.

The communications subsystem 2130, and/or components thereof, generally will receive signals, and the bus 2105 then might carry the signals, and/or the data, instructions, etc. carried by the signals to the working memory 2135, from which the processors 2110 retrieves and executes the instructions. The instructions received by the working memory 2135 may optionally be stored on a non-transitory storage device 2125 either before or after execution by the processors 2110.

Specific details are given in the description to provide a thorough understanding of exemplary configurations including implementations. However, configurations may be practiced without these specific details. For example, well-known processes, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

In the preceding description, for the purposes of explanation, numerous details have been set forth in order to provide an understanding of various embodiments of the present technology. It will be apparent to one skilled in the art, however, that certain embodiments may be practiced without some of these details, or with additional details. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Where a range of values is provided, it is understood that each intervening value, to the smallest fraction of the unit of the lower limit, unless the context clearly dictates otherwise, between the upper and lower limits of that range is also specifically disclosed. Each smaller range between any stated value or intervening value in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "an operation" includes a plurality of such operations, and reference to "the plate" includes reference to one or more plates and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or steps, but they do not preclude the presence or addition of one or more other features, integers, components, steps, acts, or groups.

What is claimed is:

1. A method of removing contaminants from a processed substrate having exposed silicon and silicon oxide surfaces, the method comprising:
   etching the substrate in an etching process, wherein the etching process is selective to silicon over silicon oxide, wherein the etching process produces radical species, and wherein residual species from the radical species are incorporated within the silicon oxide layer during the etching and remain in the silicon oxide layer subsequent the etching process; and
   treating the substrate to remove at least a portion of the residual species from the silicon oxide layer wherein treating the substrate comprises:
      delivering ammonia to a remote plasma region to produce plasma effluents;
      contacting the silicon oxide region with the plasma effluents, wherein the plasma effluents are configured to interact with the residual species from the radical species, and wherein the plasma effluents are further configured to withdraw the residual species from the radical species from the silicon oxide layer.

2. The method of claim 1, wherein the etching process comprises exposing the substrate to a fluorine-containing precursor and an oxygen-containing precursor, wherein the fluorine-containing precursor has been flowed through a plasma to produce at least a portion of the radical species, which comprise radical fluorine species.

3. The method of claim 2, wherein the etching process does not etch or substantially does not etch the silicon oxide layer.

4. The method of claim 2, wherein the radical fluorine species are incorporated with the silicon oxide layer in a profile such that the extent of incorporation diminishes at increasing depths of the silicon oxide film.

5. The method of claim 1, wherein the treatment is performed at a temperature between about 0° C. and about 800° C.

6. The method of claim 1, wherein the treatment is performed at a pressure between about 1 mTorr and about 700 Torr.

7. The method of claim 1, wherein treating the substrate comprises reducing the amount of residual species in the silicon oxide layer to below or about 20%.

8. The method of claim 7, wherein treating the substrate comprises reducing the amount of residual species in the silicon oxide layer to below or about 10%.

9. The method of claim 8, wherein treating the substrate comprises reducing the amount of residual species in the silicon oxide layer to below or about 5%.

10. The method of claim 1, further comprising transferring the substrate to a treatment chamber for the treatment process.

11. The method of claim 10, wherein the substrate is maintained under vacuum during the transfer to the treatment chamber.

12. The method of claim 1, further comprising transferring the substrate to a passivation chamber for a passivation process.

13. The method of claim 12, wherein the substrate is maintained under vacuum during the transfer to the passivation chamber.

14. The method of claim 12, wherein the passivation comprises heating the substrate to a temperature greater than or about 150° C. for a period of time greater than or about two minutes.

15. The method of claim 1, wherein the remote plasma region is an RPS unit coupled with a process chamber in which the method is performed.

16. The method of claim 1, wherein the remote plasma region is a region of a chamber physically isolated from a substrate processing region in which the method is performed.

17. The method of claim 1, wherein the method of claim 1 does not etch or remove the silicon oxide layer.

* * * * *